(12) United States Patent
Pillarisetty et al.

(10) Patent No.: US 11,895,824 B2
(45) Date of Patent: *Feb. 6, 2024

(54) VERTICAL 1T-1C DRAM ARRAY

(71) Applicant: Intel Corporation, Santa Clara, CA (US)

(72) Inventors: Ravi Pillarisetty, Portland, OR (US); Van H. Le, Portland, OR (US); Gilbert Dewey, Hillsboro, OR (US); Abhishek A Sharma, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 28 days.

This patent is subject to a terminal disclaimer.

(21) Appl. No.: 17/667,498

(22) Filed: Feb. 8, 2022

(65) Prior Publication Data

US 2022/0165737 A1 May 26, 2022

Related U.S. Application Data

(62) Division of application No. 16/480,627, filed as application No. PCT/US2017/025551 on Mar. 31, 2017, now Pat. No. 11,289,490.

(51) Int. Cl.
    *H10B 12/00* (2023.01)
(52) U.S. Cl.
    CPC .......... *H10B 12/36* (2023.02); *H10B 12/056* (2023.02)
(58) Field of Classification Search
    None
    See application file for complete search history.

(56) References Cited

U.S. PATENT DOCUMENTS 9,196,655 B2 11/2015 Park
10,297,290 B1 5/2019 Seigel
(Continued)

FOREIGN PATENT DOCUMENTS

CN 101174648 A 5/2008
CN 101641772 A 2/2010
(Continued)

OTHER PUBLICATIONS

International Preliminary Report on Patentability for International Patent Application No. PCT/US2017/025551, dated Oct. 10, 2019, 11 pgs.
(Continued)

*Primary Examiner* — Suberr L Chi
(74) *Attorney, Agent, or Firm* — Schwabe, Williamson & Wyatt, P.C.

(57) ABSTRACT

A programmable array including a plurality cells aligned in a row on a substrate, wherein each of the plurality of cells includes a programmable element and a transistor, wherein the transistor includes a body including a first diffusion region and a second diffusion region on the first diffusion region and separated by a channel and the programmable element is disposed on the second diffusion region. A method of forming an integrated circuit including forming transistor bodies in a plurality rows on a substrate; forming a masking material as a plurality of rows across the bodies; etching the bodies through the masking material to define a width dimension of the transistor bodies; after etching the bodies, patterning each of the plurality of rows of the masking material into a plurality of individual masking units; and replacing each of the plurality of individual masking units with a programmable element.

20 Claims, 48 Drawing Sheets

(56) References Cited

U.S. PATENT DOCUMENTS

| | | |
|---|---|---|
| 11,289,490 B2* | 3/2022 | Pillarisetty ........... H10N 70/826 |
| 2002/0197874 A1 | 12/2002 | Divakaruni et al. |
| 2006/0046391 A1 | 3/2006 | Tang et al. |
| 2007/0080385 A1 | 4/2007 | Kim et al. |
| 2010/0289064 A1 | 11/2010 | Or-Bach et al. |
| 2012/0153371 A1 | 6/2012 | Chen |
| 2015/0311255 A1 | 10/2015 | Park |
| 2017/0033113 A1 | 2/2017 | Zang et al. |

FOREIGN PATENT DOCUMENTS

| | | |
|---|---|---|
| CN | 102468181 A | 5/2012 |
| KR | 10-2014-0106903 | 9/2014 |
| WO | WO-2011-031749 | 3/2011 |

OTHER PUBLICATIONS

International Search Report and Written Opinion for International Patent Application No. PCT/US2017/025551 dated Dec. 27, 2017, 14 pgs.

Office Action from Chinese Patent Application No. 201780087747.7, dated Oct. 26, 2023, 8 pgs.

* cited by examiner

VERTICAL 1T-1C DRAM ARRAY

CROSS-REFERENCE TO RELATED APPLICATION

This patent application is divisional of U.S. patent application Ser. No. 16/480,627, filed Jul. 24, 2019, which is a U.S. National Phase application under 35 U.S.C. § 371 of International Application No. PCT/US2017/025551, filed Mar. 31, 2017, entitled "A VERTICAL 1T-1C DRAM ARRAY," which designates the United States of America, the entire disclosure of which are hereby incorporated by reference in their entirety and for all purposes.

BACKGROUND

Field

Integrated circuit devices.

Description of Related Art

Solid state memory device typically employ micro-electronic circuit elements for each memory bit (e.g., one to four transistors per bit) in memory application. Examples include one transistor-one resistor (1T-1R) configuration such as resistive random access memory (RRAM) and magnetoresistive random access memory (MRAM) and one transistor-one capacitor (1T-1C) such as dynamic random access memory (DRAM). Since one or more electronic circuit elements are required for each memory bit, these devices may consume considerable chip "real state" to store a bit of information. Such consumption limits the density of a chip (e.g., microprocessor, memory chip, etc.).

DETAILED DESCRIPTION

A programmable array is described. In one embodiment, the programmable array includes a plurality cells aligned in a row on a substrate, wherein each of the plurality of cells includes a programmable element and a transistor. The transistor includes a body, the body including a first diffusion region (source/drain) and a second diffusion region (other of source/drain) on the first diffusion region and separated by a channel and the programmable element is disposed on the second diffusion region. Where a base of the substrate lies in or defines a generally horizontal plane, the transistor apparatus, in one embodiment, adopts a vertical architecture with the body of each transistor in the array is stacked in a vertical orientation relative to the base of the substrate. In one embodiment, the transistor bodies in the array are each perpendicular to the base of the substrate. The programmable element of each cell of the array in one embodiment is a capacitor (a 1T-1C cell). The capacitor disposed on and, in one embodiment, is self-aligned to the body of the transistor. The programmable element includes a width dimension equivalent to a width dimension of the body of the transistor on which it is disposed. In another embodiment, in addition to the described plurality of cells aligned in a row, the programmable array includes a second plurality of cells aligned in a column on the substrate with a projection of the column intersecting a projection of the row. Each of the second plurality of cells includes a programmable element and a transistor includes a body including a first diffusion region and a second diffusion region on the first diffusion region and separated by a channel and a gate electrode offset from the body and connected as an indivisible body to a channel of each of transistors of the second plurality of cells as a second address line. In this manner, the gate electrode may act as an address line (e.g., a word line) for the array. In another embodiment, the programmable array may include M rows of transistors and N columns of transistors, with M and N both greater than one. A method of forming an integrated circuit including a programmable array is also disclosed.

Figure 1:
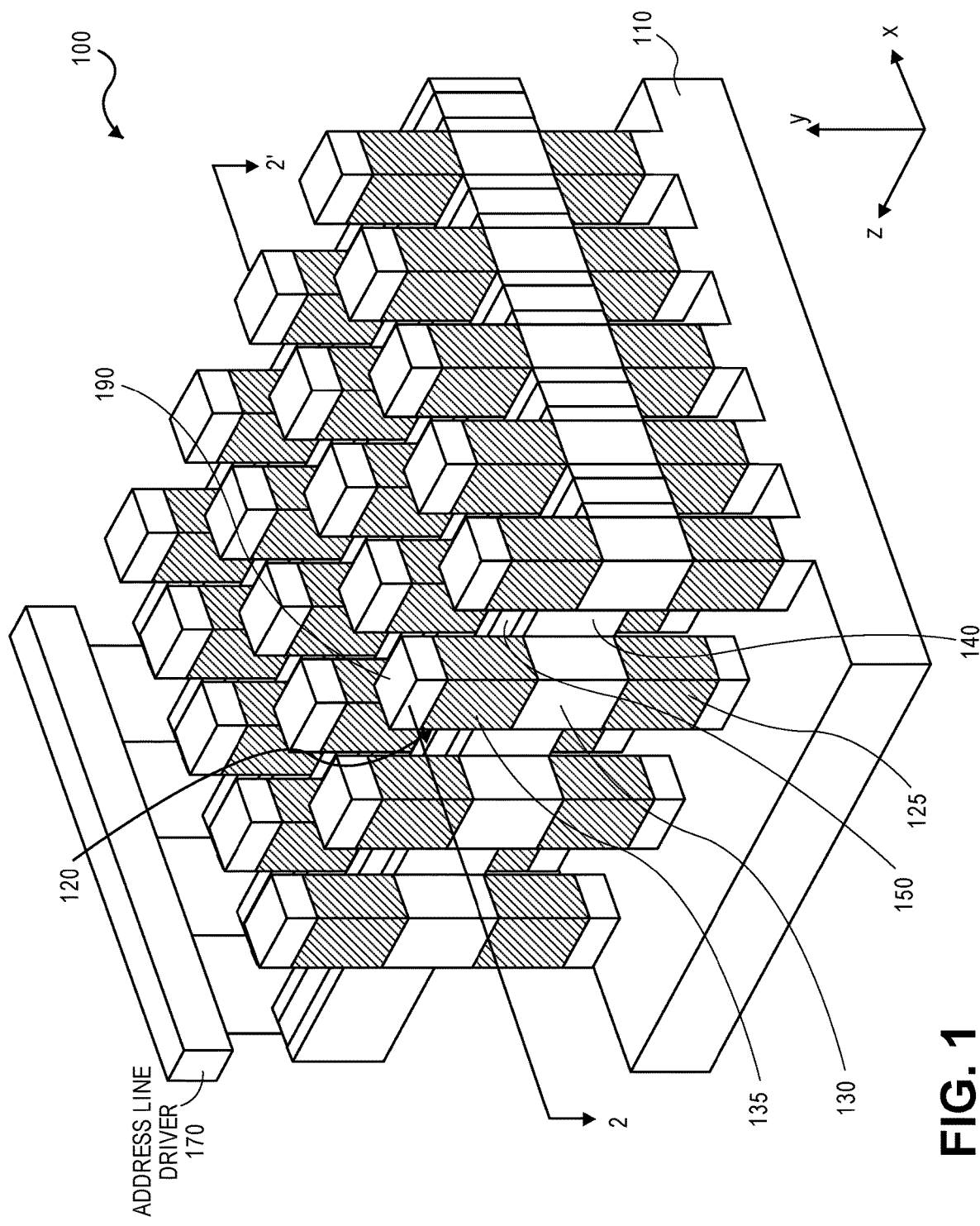
FIG. 1 shows a top perspective view of an embodiment of an array of vertical field effect transistor (FET) devices each including a self-aligned gate.
Figure 2:
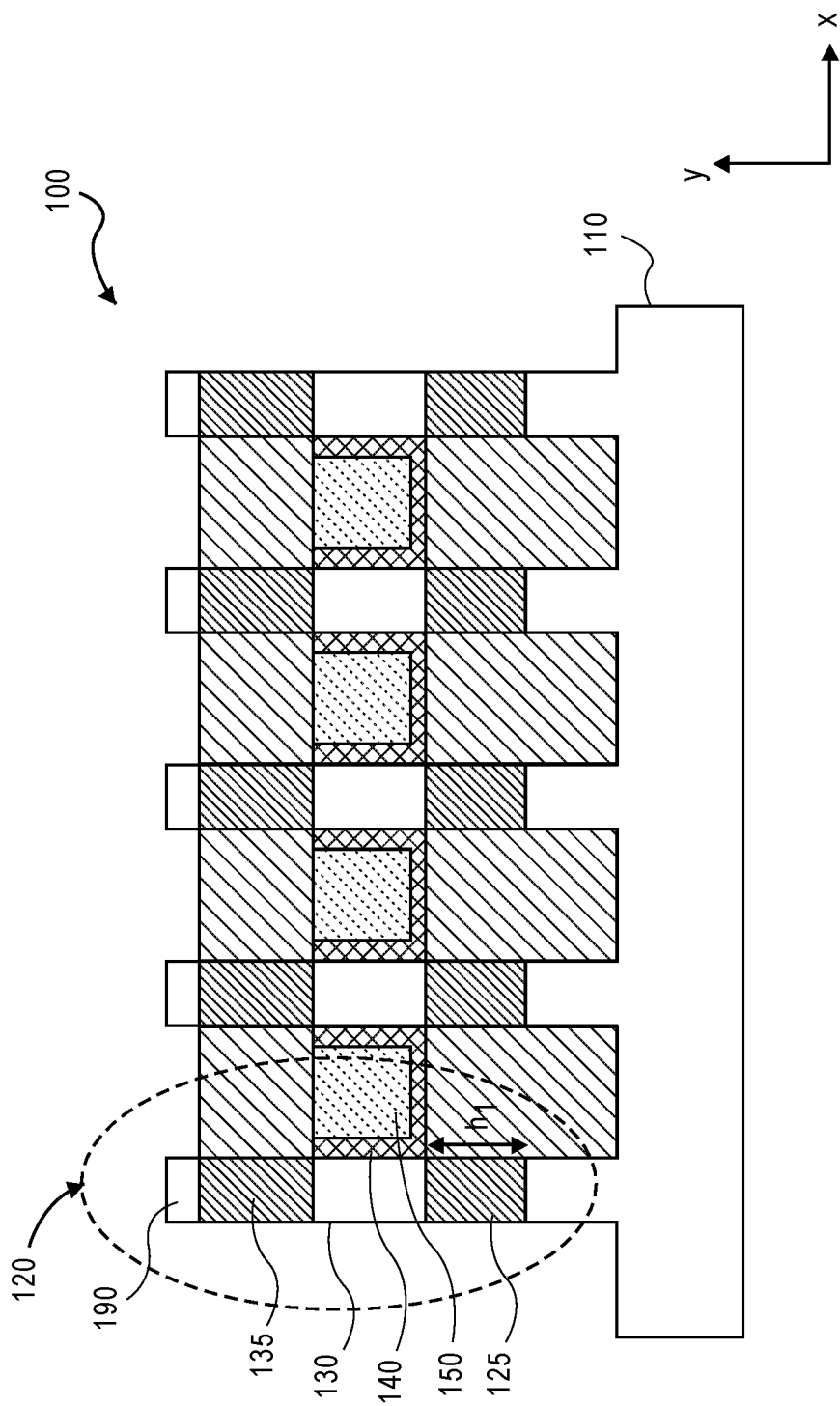
FIG. 2 shows the structure of FIG. 1 through line 2-2'.

FIG. 1 shows a top perspective view of an embodiment of an array of field effect transistor (FET) devices such as metal oxide semiconductor field effect transistor (MOSFET) devices, tunneling field effect transistor (TFET) device, or other FET devices. Dielectric material that otherwise would surround each transistor device is not illustrated so that the array is visible. FIG. 2 shows the structure of FIG. 1 through line 2-2'. In this embodiment, non-planar vertical transistors (as viewed) are described that include diffusion regions (source/drain) and a conducting channel in a stacked arrangement (one on the other) above a base surface of a substrate as transistor bodies or fins. In the views shown, the transistor bodies or fins are projected vertically from a base surface of the substrate. A gate electrode is disposed on the channel on less than an entire perimeter area portion of the channel of the transistor body or fin (e.g., on one side of a multi-sided body or fin).

Referring to FIG. 1 and FIG. 2, device 100 includes substrate 110 that is, for example, a single crystal silicon substrate such as a bulk substrate or a silicon on insulator (SOI) substrate. Substrate 110 may be less than an entire portion of a chip substrate. Disposed on substrate 110 are a number of transistor bodies or fins arranged in an array (five fins in an exemplary row in an x-dimension (M=5) and four fins in an exemplary column in a z-dimension (N=4)). Such bodies or fins may be formed directly on substrate 110 or on a buffer or sub-fin layer that forms a base surface of the substrate of, for example, a material that has a different lattice on a material of the substrate (e.g., silicon substrate 110). A suitable material for a buffer layer includes, but is not limited to, indium phosphate (ImP), germanium (Ge), gallium arsenide (GaAs), gallium phosphide (GaP), gallium arsenide antimony (GaAsSp), indium aluminum arsenide (InAlAs), indium aluminum antimony (InAlSp), gallium antimony (GaSp) or other group III-V compound semiconductor material. To reduce a threading relocation density, a material in and each buffer layer may be graded with, for example, a material of the underlying substrate to gradually increase a material composition of the buffer layer and epitaxially grown film such that closer to substrate 110, a material concentration of the buffer layers less and increase away from the substrate. In another embodiment, two or more different materials may be present in a buffer layer such as a first material on the base of the buffer layer and a second material on the first material.

FIG. 1 and FIG. 2 show transistor 120 that is representative of the other transistors in the array. In an example where there is no buffer layer and a top or superior surface (as viewed) of substrate 110 of silicon forms a base surface of the substrate, transistor 120 is disposed on substrate 110. Transistor 120 includes a vertically projecting body or fin including first diffusion region 125 (a source or a drain), channel 130 and second diffusion region 135 (other of source/drain) with channel 130 on first diffusion region 125 and second diffusion region 135 on channel 130. Where substrate 110 is a silicon substrate, in one embodiment, first diffusion region 125 is a doped silicon material (e.g., n-doped or p-doped) representatively different than the substrate. Alternative materials for first diffusion region 125 include, but are not limited to, germanium or a group III-V compound semiconductor material. Specific examples include germanium (Ge), silicon germanium (SiGe), gallium arsenide (GaAs), indium antimony (InSb), indium gallium arsenide (InGaAs), gallium antimony (GaSb), indium gallium oxide (IGO), indium gallium zinc oxide (IGZO) and tin oxide (SnO). The material of first diffusion region 125 may be crystalline (e.g., polycrystalline) or amorphous. In one example, first diffusion region 125 has a height, h1, on the order of 10 nanometers (nm) to 50 nm (e.g., 25-30 nm). Channel 130 is disposed on first diffusion region 125. Where a material for first diffusion region 125 is a doped silicon material, a material of channel 130 is, for example, a silicon material that may or may not be lightly doped (e.g., an intrinsic material). Disposed on channel 130 is second diffusion region 135 that is, for example, a material similar to a material of first diffusion region 125 and doped similar to first diffusion region 125.

In the example shown in FIG. 1 and FIG. 2, the transistor bodies or fins have a generally rectangular cross-section with two pairs of opposing sidewalls. It is appreciated that a cross-sectional shape of a transistor body or fin will depend on how the body or fin is formed and therefore may adopt other shapes such as circular or other quadrilateral shape (e.g., trapezoidal). Also, in the illustration, first diffusion region 125 and second diffusion region 135 appear to have similar dimensions. As will be explained later, the regions are formed separately and therefore may have dissimilar shapes (e.g., different cross-sections).

Disposed on channel 130 and offset from the body or fin is a gate stack including gate dielectric 140 and gate electrode 150. In this embodiment, the gate stack is disposed on one sidewall of the channel. In one embodiment, gate dielectric 140 is a silicon dioxide ($SiO_2$) or a dielectric material having a dielectric constant greater than silicon dioxide (a high-k material) or a combination of silicon dioxide and a high-k material(s) or a combination of high-k materials. Representatively, gate dielectric 140 has a thickness on the order of a few nanometers. As illustrated in FIG. 2, gate dielectric 140 is disposed on less than an entire perimeter area portion of channel 130 (e.g., gate dielectric 140 is disposed on one side of a multi-sided channel). Disposed on gate dielectric 140 is gate electrode 150 of, for example, an electrically conductive material such as a metal material (e.g., tantalum), a metal nitride or a silicide. As shown more clearly in FIG. 1, in one embodiment, gate electrode 150 extends as an indivisible body through the array in a z-dimension and, in such manner, is connected to multiple channels of transistor bodies or fins in the column of the array. In this embodiment, gate electrode 150 may serve as an address line for each of the transistors aligned in a z-dimension column. In such an embodiment including multiple columns, each gate electrode may be connected to address line driver 170.

In the embodiment shown in FIG. 1, each of the vertical transistors in the array has a first diffusion region (first diffusion region 125) such as a source connected to the substrate. In one embodiment, the source connection is to the substrate at zero volts. Second diffusion region 135, such as a drain, is connected to active medium 190 such as an electrical contact to connect the metallization (e.g., a metal line or trace subsequently formed above the array of transistors) or a programmable element.

Figure 3:
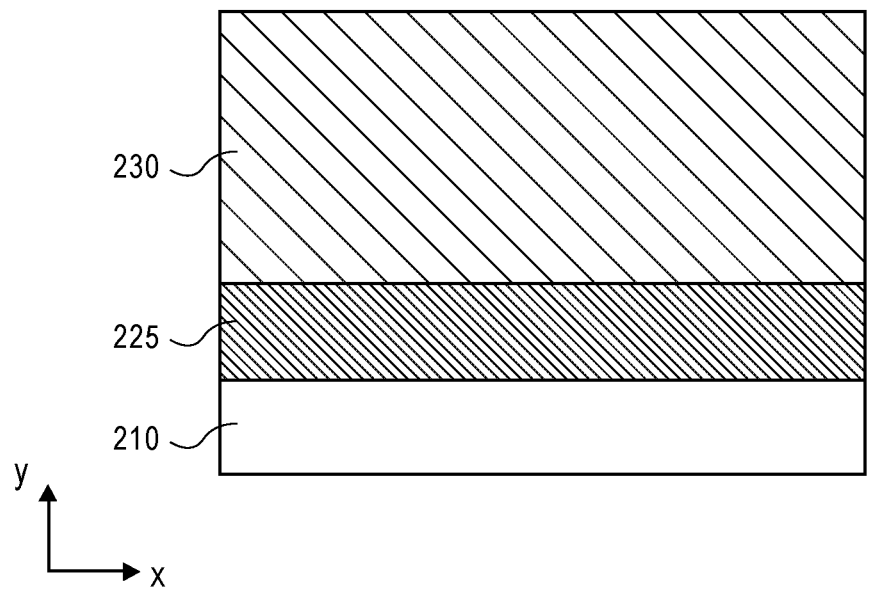
FIG. 3 shows a cross-sectional side view of the substrate having a first diffusion region material film on a surface and a channel material film on the first diffusion region material film.
Figure 19:
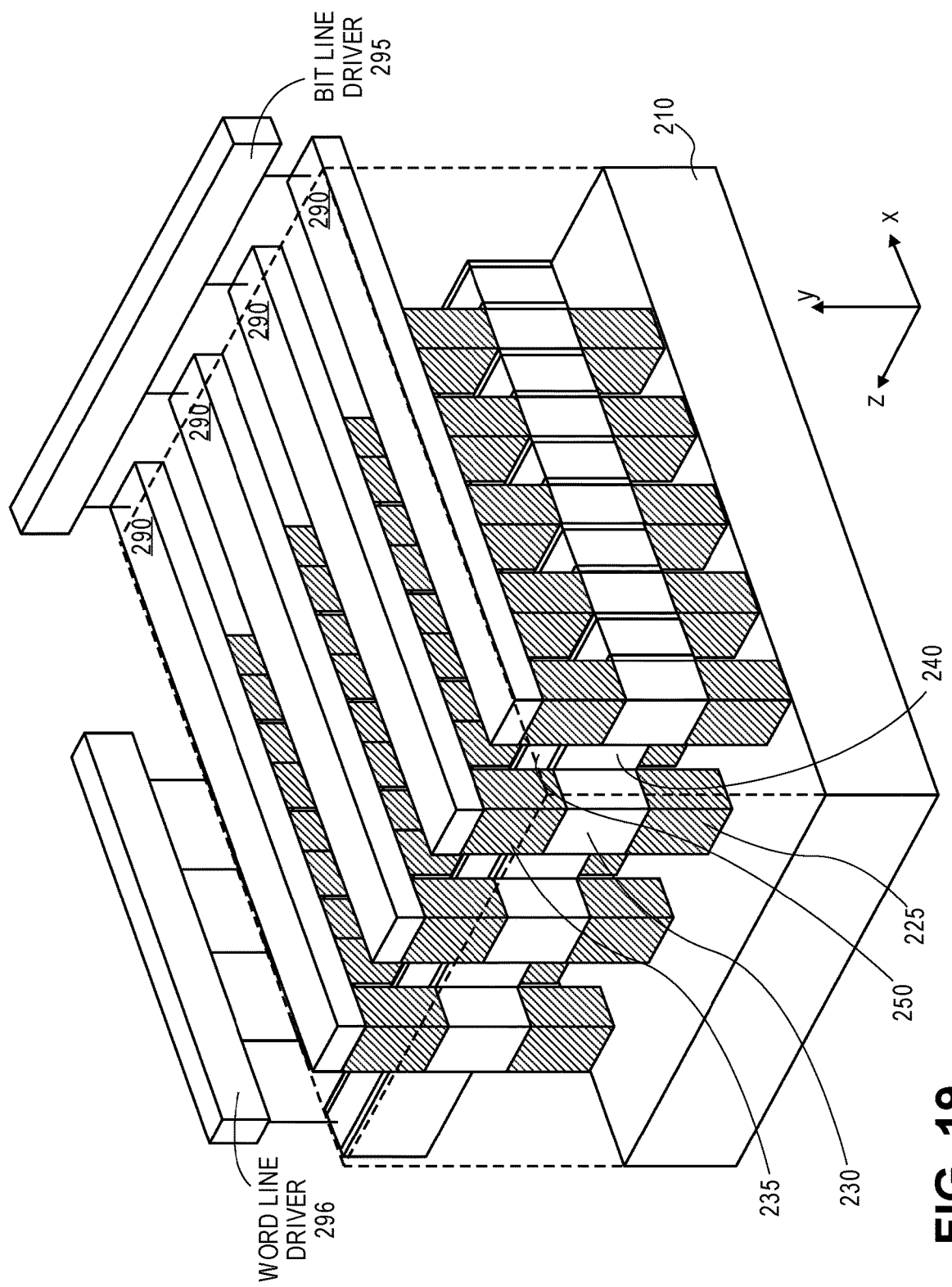
FIG. 19 shows a top perspective view of the structure of FIG. 18 with the dielectric material removed and the gate electrode of the transistors connected to a word line driver and the conductive material connected to the second diffusion regions connected to a bit line driver.
Figure 20:
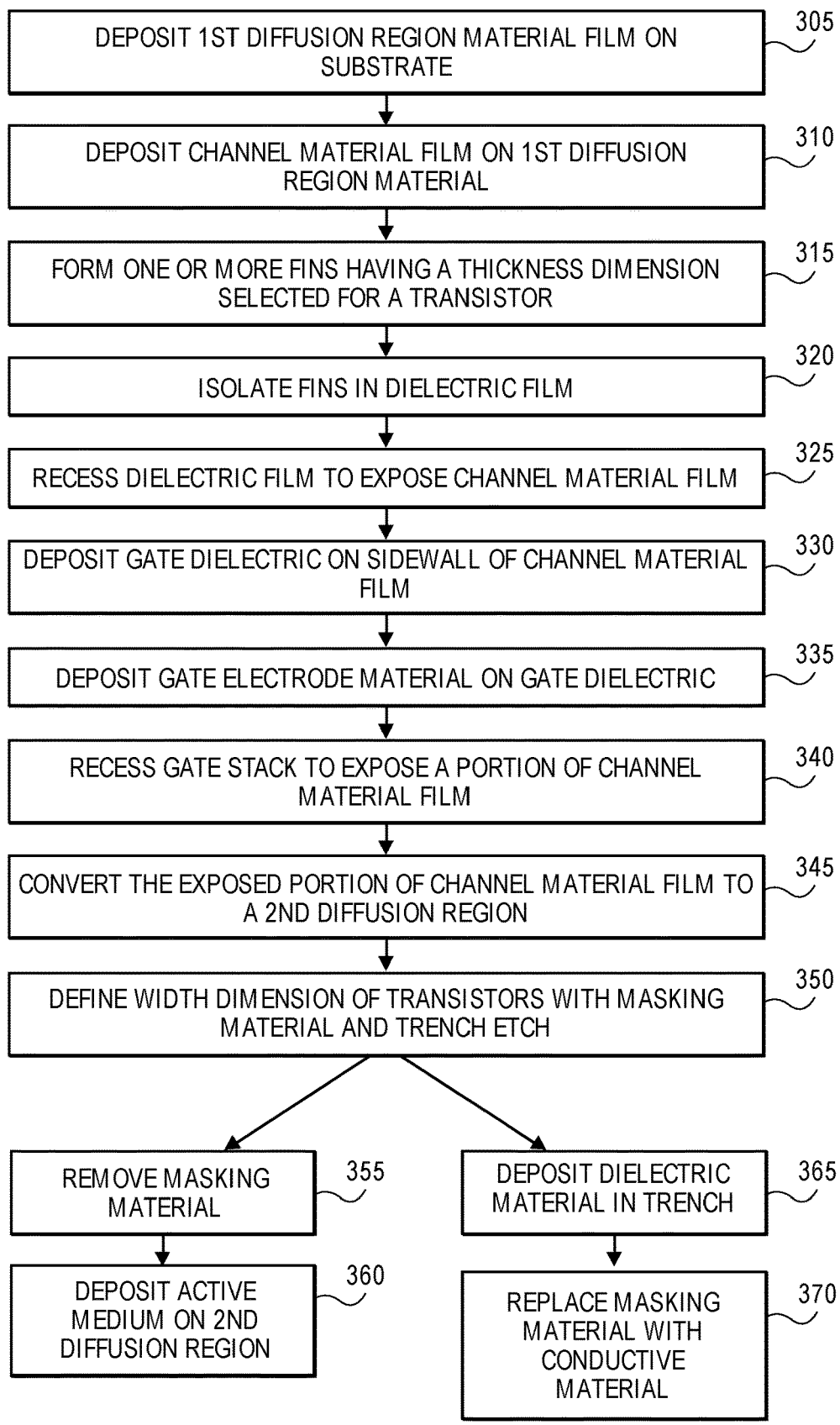
FIG. 20 presents a flow chart of the embodiments of methods illustrated in FIGS. 3-19.

FIGS. 3-19 describe methods for creating vertical transistors such as shown in FIG. 1. FIG. 20 presents a flow chart of the process. A formation process for an array of n-type FETs is described. It should be appreciated that the techniques of forming a transistor presented here are not limited to any particular device conductivity or transistor type. Referring to FIG. 3 and with reference to flow chart of FIG. 20, the process begins by the introduction of a first diffusion region material film on a surface of a substrate (block 305, FIG. 20). FIG. 3 shows a cross-sectional side view of substrate 210 that may be any material that may serve as a foundation on which multiple vertical FETs may be constructed. Representatively, substrate 210 is a portion of a larger substrate such as a wafer. In one embodiment, substrate 210 is a semiconductor material such as a single crystal silicon. Substrate 210 may be a bulk substrate or, in another embodiment, a silicon on insulator (SOI) structure. In an embodiment where substrate 210 is silicon, an n-doped (n+) silicon film is formed on the surface of substrate 210 as a first diffusion region material film by, for example, an epitaxial growth process to a thickness on the order of 25 nm as a first diffusion region film. Film 225 of n-type silicon is formed across a surface of substrate 210 in an area designated for a transistor array. Formed on film 225 is a film for a channel of a transistor (block 310, FIG. 20). In one embodiment, film 230 is an undoped (intrinsic) or lightly n-type doped silicon material that has a representative thickness on the order of 75 nm and is formed by an epitaxial growth process.

Figure 4:
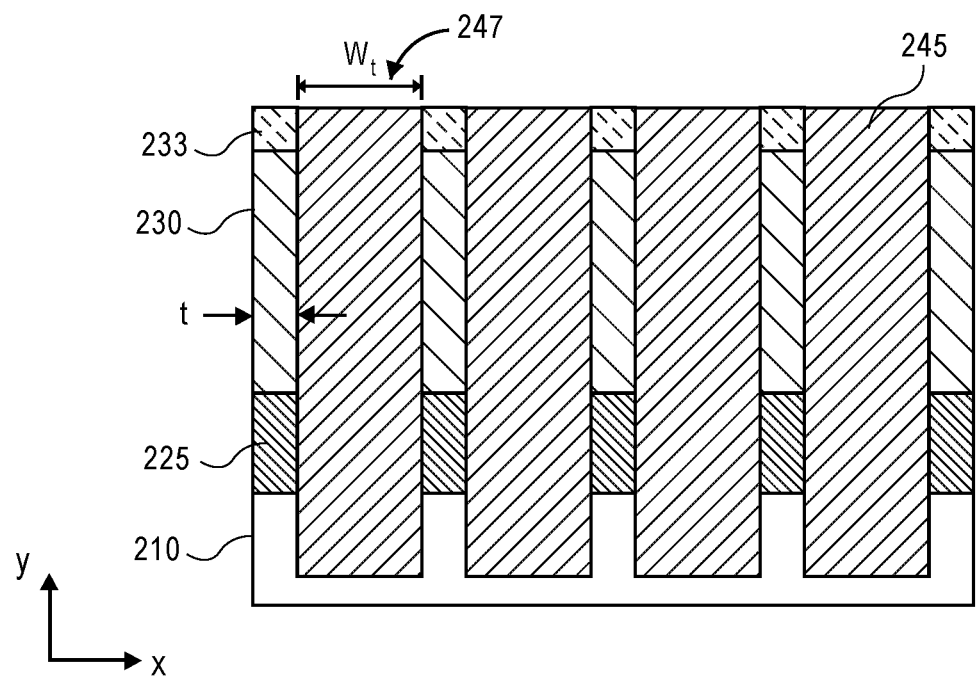
FIG. 4 shows the structure of FIG. 3 following the definition of fin structures in the first diffusion region material film and the channel material film on a substrate and the deposition of dielectric material around the fin structures.

FIG. 4 shows the structure of FIG. 3 following the definition of fin structures in film 225 and film 230 on substrate 210 (block 315, FIG. 20). FIG. 4 representatively shows five fins. The fins may be formed by a mask and etch process wherein mask 233 (e.g., a hard mask of, for example, silicon nitride) is introduced on a surface (superior surface) of film 230 to protect areas of the film and underlying film 225 on substrate 210 where the fins will be defined and to provide openings in non-fin areas. Once mask 233 is patterned, the structure may be anisotropically etched to remove material in unprotected areas. FIG. 4 shows the fins defined in substrate 210, film 225 and film 230. For a substrate of silicon and silicon films, the etch may be a wet or dry etch. Representatively, a suitable etch is a hydrofluoric (HF)-based chemistry. FIG. 4 shows the structure after the definition of five fins, each having a representative thickness dimension, t, on the order of 10 nm. FIG. 4 shows trenches 247 formed in the structure between fins, each trench has a width, wt, in one embodiment, on the order of 40 nm. Following the definition of the fins, trenches 247 between fins may be filled with dielectric material 245 such as silicon dioxide or a low-k dielectric material (block 320, FIG. 20).

Figure 5:
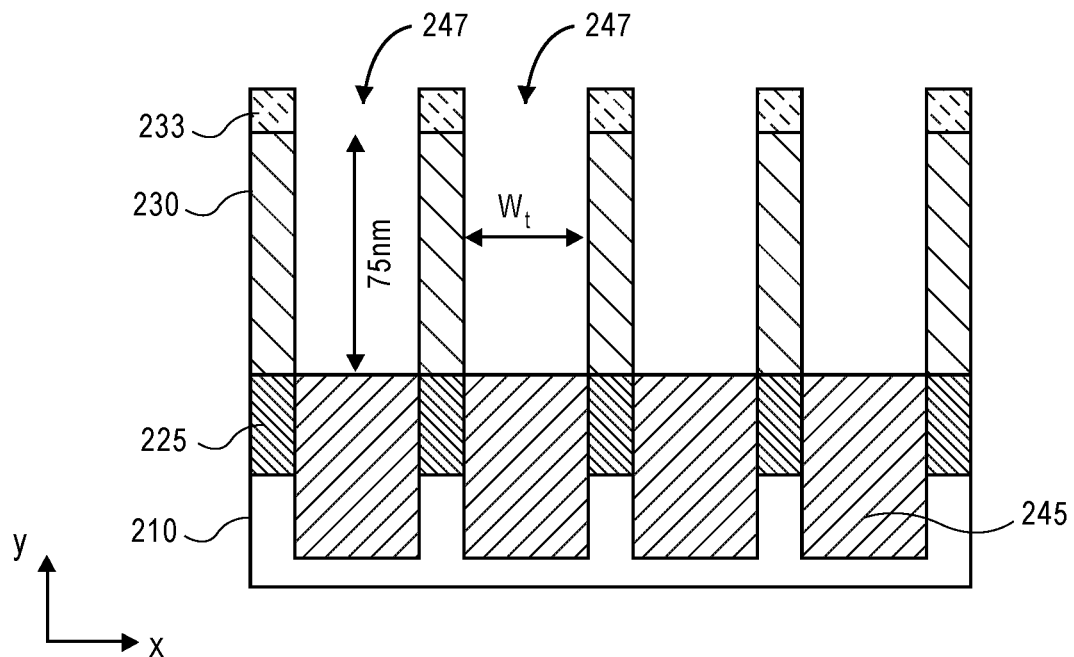
FIG. 5 shows the structure of FIG. 4 following a recessing of the dielectric material to a height of the first diffusion region material film.

FIG. 5 shows the structure of FIG. 4 following a recessing of dielectric material 245 to a height of film 225 to expose an entire length of film 230 in trench 247 (block 325, FIG. 20). In one embodiment, such recessing may be done by retaining mask 233 and etching the dielectric material using a timed etch. As illustrated in FIG. 5, the etch forms trenches having a depth of film 230 (e.g., 75 nm).

Figure 6:
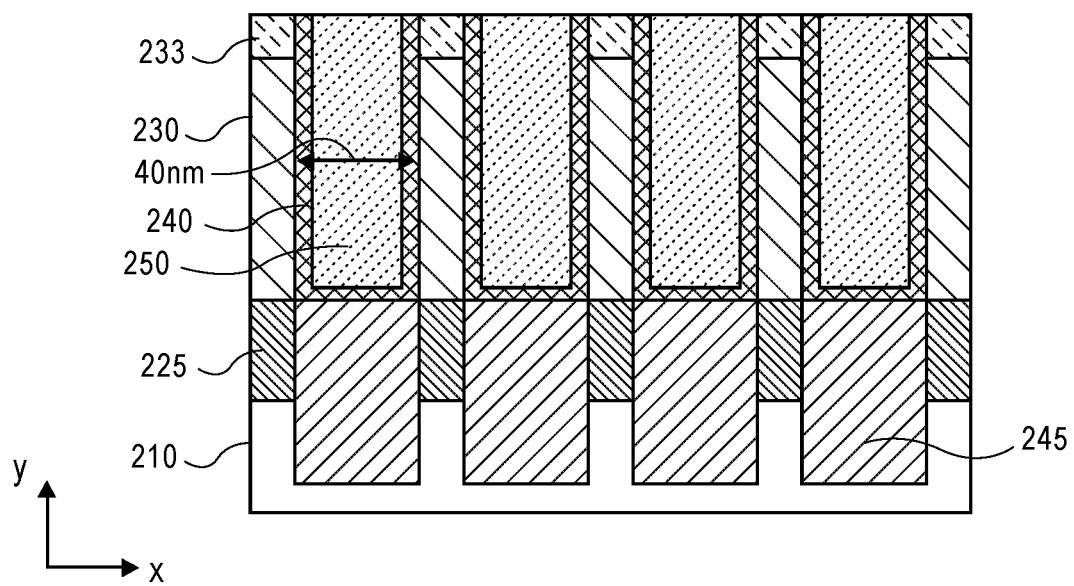
FIG. 6 shows the structure of FIG. 5 following the introduction of a gate dielectric and gate electrode material in trenches formed by recessing the dielectric material.

FIG. 6 shows the structure of FIG. 5 following the introduction of a gate dielectric and gate electrode material in the trenches of the structure. Initially, a gate dielectric material is introduced followed by the introduction of a gate electrode material. As shown in FIG. 6, gate dielectric 240 is, for example, silicon dioxide or a high-k dielectric material or a mixture of silicon dioxide and a high-k material or materials. As shown in FIG. 6, gate dielectric material 240 is introduced by, for example, CVD deposition to a thickness on the order of a few nanometers in a manner that it conforms to the sidewalls of each trench 247 (e.g., gate dielectric 240 is disposed on a sidewall of film 230) and a superior surface of dielectric layer 245 (block 330, FIG. 20). After forming gate dielectric 240, gate electrode 250 is formed in trench 247 (block 335, FIG. 20). Representative materials for gate electrode 250 include, but are not limited to, tungsten, tantalum, titanium or a nitride, a metal alloy, silicide or another material. In one embodiment, gate electrode material 250 may be introduced by a CVD or other deposition process. In one embodiment, a material for gate electrode 250 is introduced in an amount to fill each trench 247. Once gate dielectric 242 and gate electrode 250 are introduced in trenches 247, a surface of the structure (a top surface as viewed) may be polished by, for example, a chemical mechanical polish.

Figure 7:
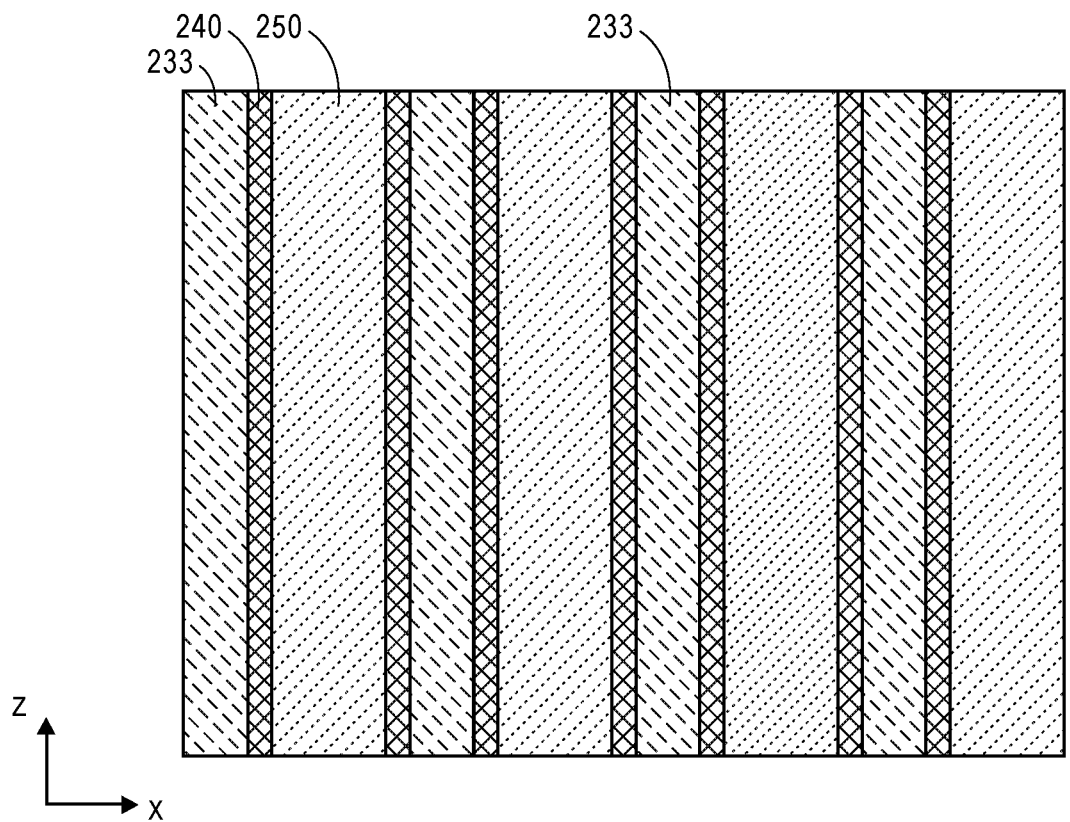
FIG. 7 shows a top view of the structure of FIG. 6 and shows gate stacks each including gate dielectric and gate electrode in each trench offset in an x-dimension from respective ones of the transistor bodies or fins and extending a z-dimension length of each trench.

FIG. 7 shows a top view of the structure of FIG. 6 and shows a gate stack including gate dielectric 240 and gate electrode 250 in each trench 247 offset in an x-dimension from respective ones of the transistor bodies or fins and extending a z-dimension length of each trench. The transistor bodies are under mask 233 in FIG. 7. By offset from a transistor body is meant that a gate stack does not share x-dimension coordinates with the transistor body or fin to which it is connected. The formation of a gate stack including gate dielectric 240 and gate electrode 250 in trenches 247 adjacent or offset from a fin allows the gate stack to be self-aligned to the fins. The fins define the dimensions of trenches 247 and the gate stacks are formed to fill the trenches. Further, each gate electrode in an array such as shown in FIG. 6 and FIG. 7 is independently isolated without the need for any additional patterning or alignment.

Figure 8:
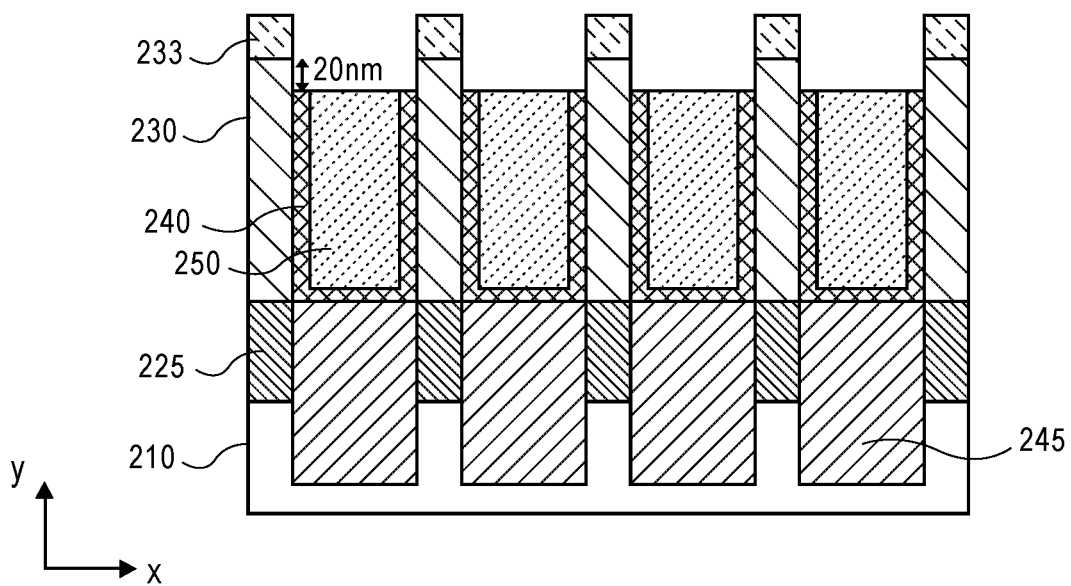
FIG. 8 shows the structure of FIG. 7 following a recessing of the gate stack material in each trench.

FIG. 8 shows the structure of FIG. 6 following a recessing of the gate stack material (gate dielectric 240 and gate electrode 250) in each trench 247 (block 340, FIG. 20). In one embodiment, a combination of dry and wet etches may be used to recess a metal gate electrode material and a high-k gate dielectric material. A recess is performed to expose a portion of film 230 such that the exposed portion can be modified or converted to form a second diffusion region. In one embodiment, the recess of gate dielectric 240 and gate electrode 250 exposes approximately 20 nm of film 230.

Figure 9:
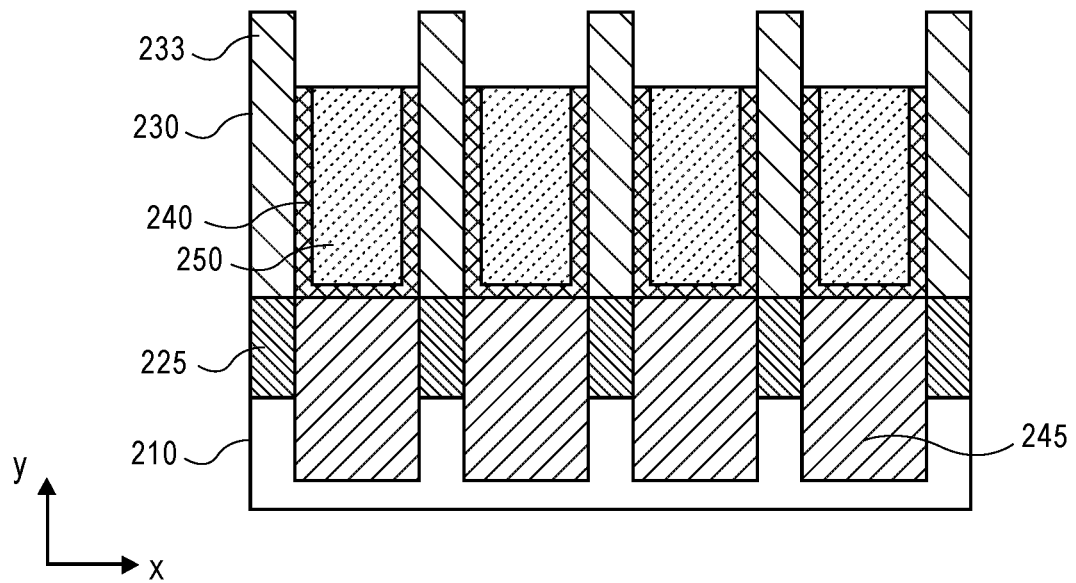
FIG. 9 shows the structure of FIG. 8 following a removal of a hard mask on a superior surface of each fin or body.

FIG. 9 shows the structure of FIG. 8 following a removal of mask 233. A hard mask of silicon nitride may be removed by a phosphoric acid or plasma ash etch. The removal of mask 233 exposes a top portion of film 230 (as viewed).

Figure 10:
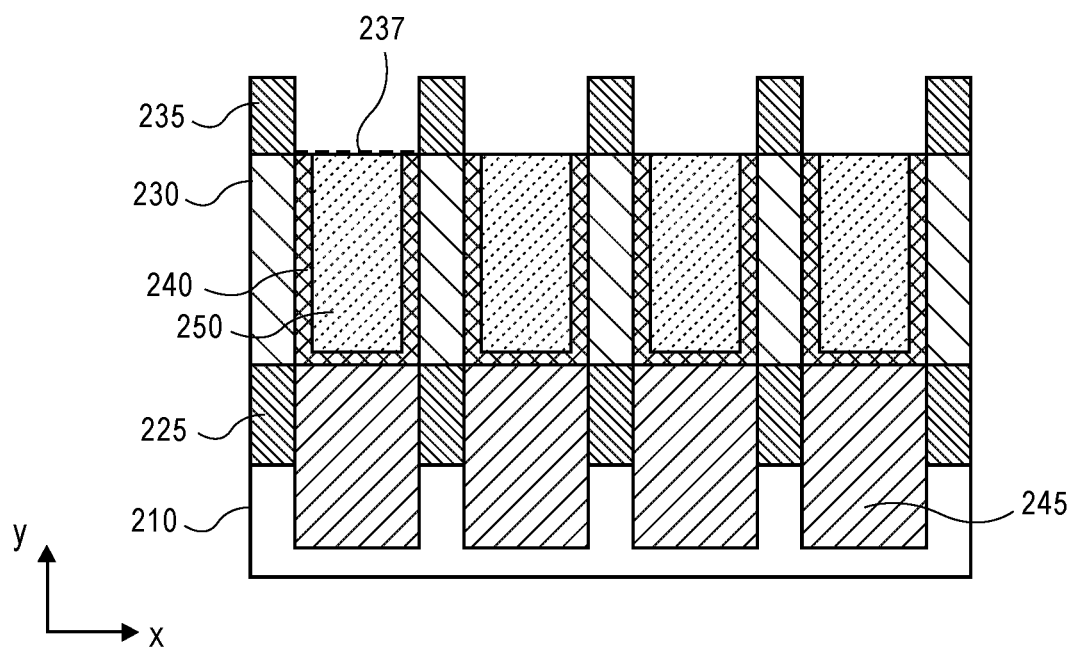
FIG. 10 shows the structure of FIG. 9 following the formation of a second diffusion region in the channel material film exposed by the recessing of the gate stack.

FIG. 10 shows the structure of FIG. 9 following the formation of a second diffusion region (block 345, FIG. 20). In one embodiment, second diffusion region 235 is formed by implanting an n-type implant such as arsenic or phosphorous into film 230 to form an n+ second diffusion region. In another embodiment, a portion of film 230 can be removed and replaced with another material to form second diffusion region 235. FIG. 10 shows second diffusion region 235 having a x-dimension (thickness dimension) similar to that of film 230. In another embodiment, the x-dimension may be greater than an x-dimension of film 230 to form, for example, a raised diffusion region. In still another embodiment, an optional dielectric layer 237 of silicon dioxide or a low-k dielectric material or a combination of materials may be formed on an exposed portion of the gate stack prior to the formation of second diffusion region 235. In this manner, dielectric layer 237 may be characterized as a sidewall spacer on the gate electrode. Such may be desirable, for example, where second diffusion region 235 is a raised diffusion region.

Figure 11:
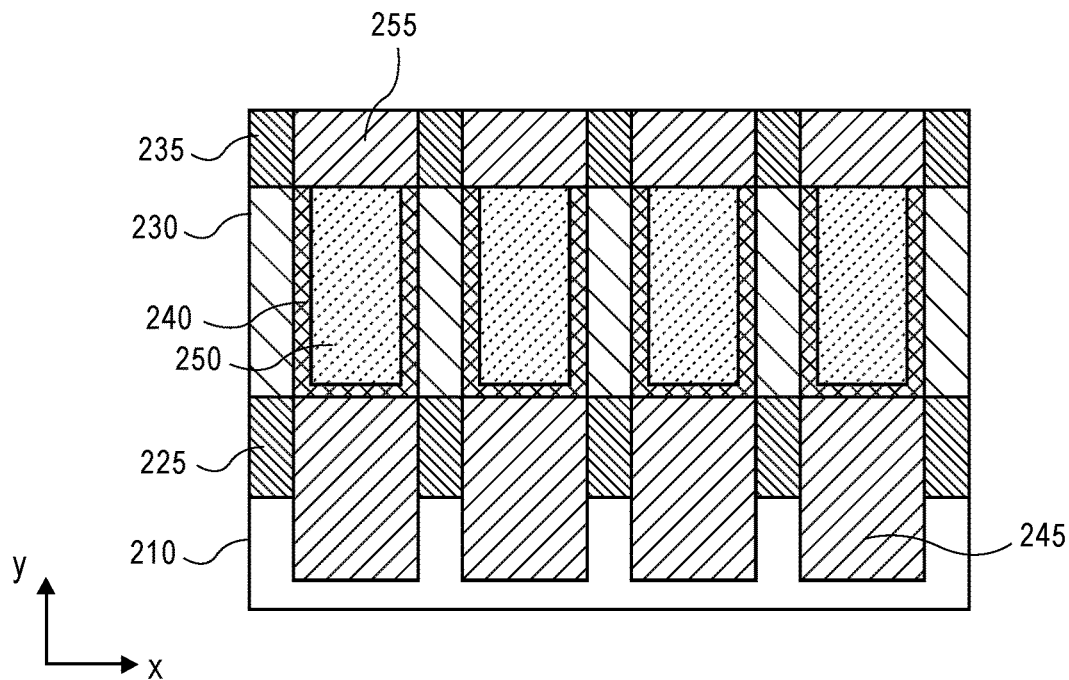
FIG. 11 shows the structure of FIG. 10 following the introduction of a dielectric material between the fins.

FIG. 11 shows the structure of FIG. 10 following the introduction of a dielectric material between the fins. In one embodiment, dielectric material 255 is silicon dioxide or a low-k dielectric material or a combination of materials that may be introduced by a deposition process. Following the deposition, a top surface of the structure (as viewed) may be planarized.

Figure 12:
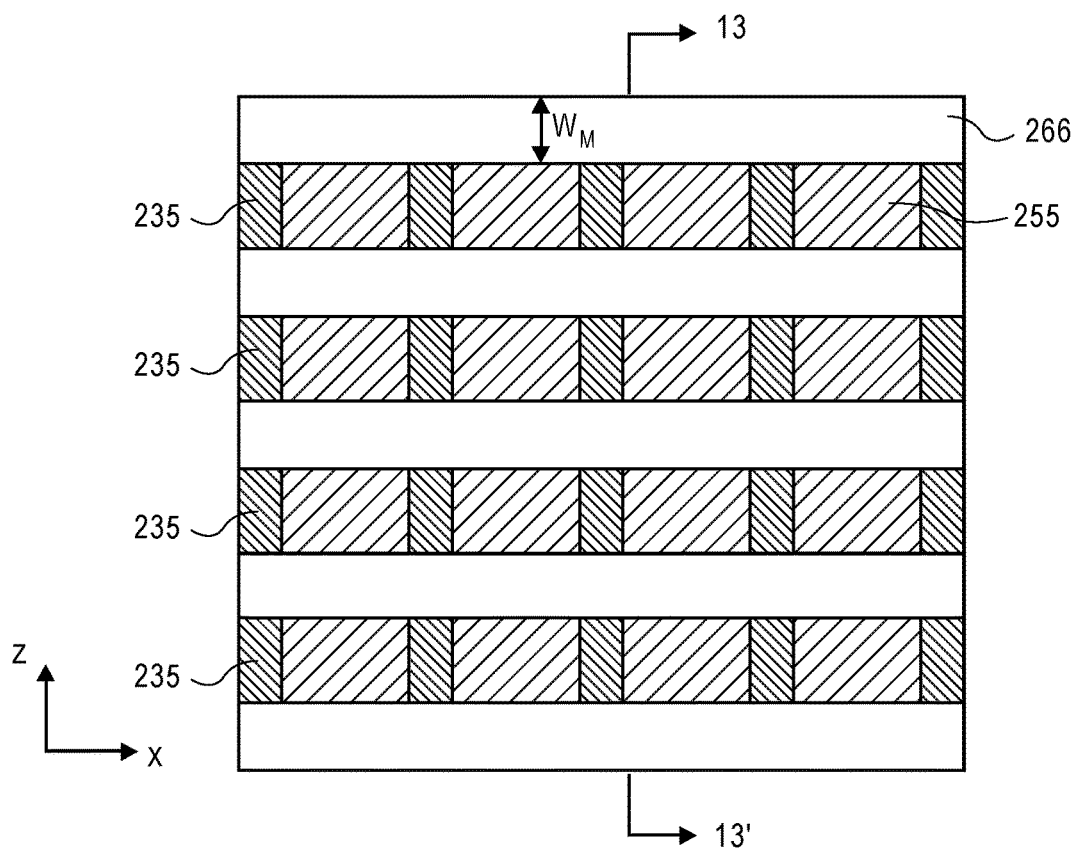
FIG. 12 shows a top view of the structure of FIG. 11 following the patterning of a masking material generally perpendicular to a direction of the gate stacks.

FIG. 12 shows a top view of the structure of FIG. 11 following patterning of a masking material as lateral projections projecting generally perpendicular to a direction of the gate stacks (block 350, FIG. 20). A width, wm, of the projections of mask 266 is selected to define a z-dimension thickness of individual transistor bodies or fins in a column. A representative width, wm, is on the order of 20 nm to 500 nm, such as 50 nm to 100 nm. One suitable material for mask 266 is a silicon nitride material.

Figure 13:
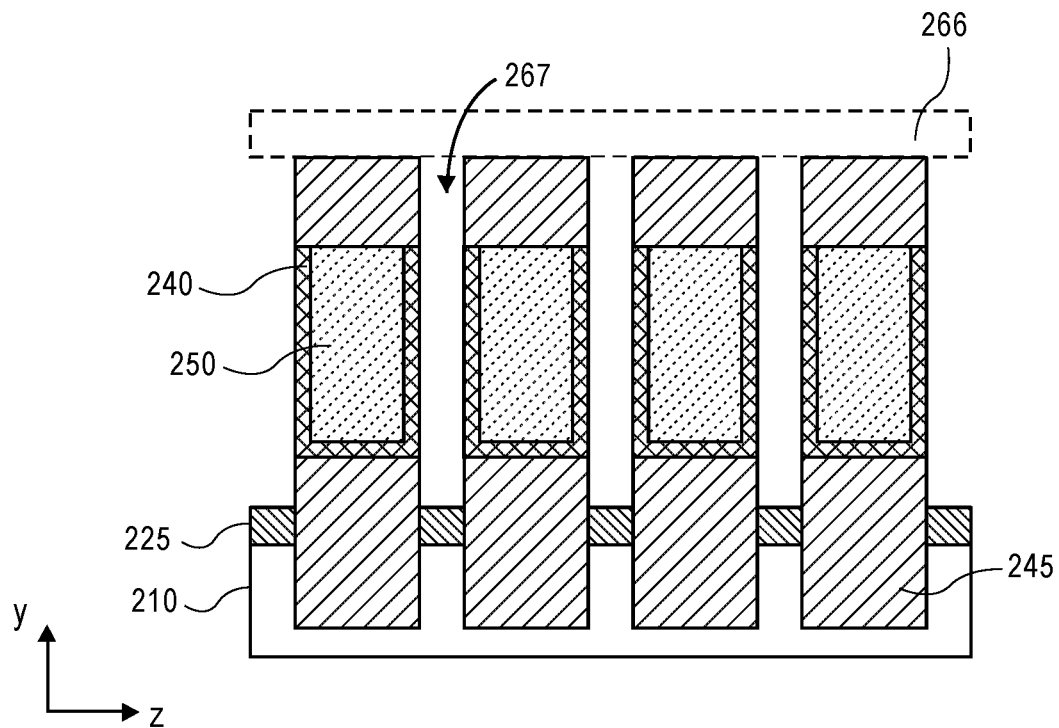
FIG. 13 shows a side view of the structure of FIG. 12 in a yz-dimension following the formation of trenches through the fins in areas of the fins that were not protected by the mask.

FIG. 13 shows a side view of the structure of FIG. 12 in a yz-dimension following the formation of trenches through the fins in areas of the fins that were not protected by mask 266. In one embodiment, the trenches are formed by anisotropically etching a portion of second diffusion region 235, film 230 and n-type silicon film 225 through mask 266. The etch, in one embodiment, is selective for the material of second diffusion region 235, film 230 and n-type silicon film 225 relative to dielectric material 255 so exposed dielectric material may mask underlying gate stacks. Where the diffusion regions and film 230 are a silicon material, trenches 267 may be formed by an HF etch. The etch proceeds to a depth below the gate stacks such as to substrate 210. Mask 266 is shown in dashed lines to reflect that it is deeper into the page than the cross-section.

Figure 14:
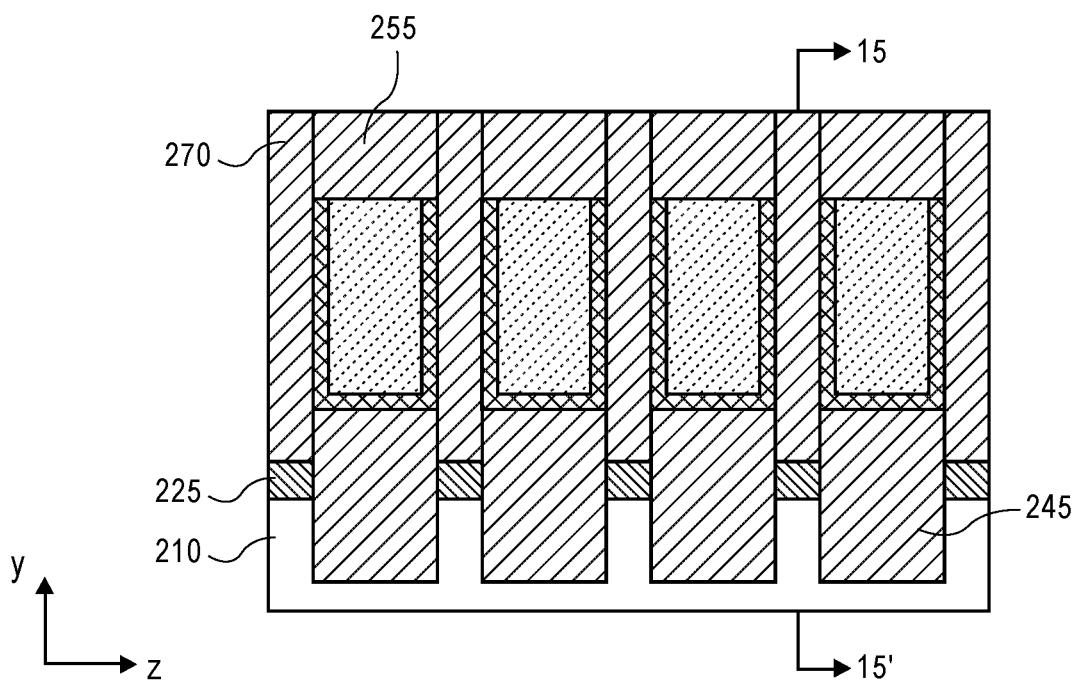
FIG. 14 shows the structure of FIG. 13 following the removal of the mask and deposition of a dielectric material in the trenches.

FIG. 14 shows the structure of FIG. 13 following the removal of mask 266 and a deposition of a dielectric material in the trenches. In one embodiment, dielectric material 270 is silicon dioxide or a low-k material similar to dielectric material 255. Following the deposition of dielectric material 270, the structure may be planarized.

At this point, an array of transistor structures is produced with a configuration similar to that shown in FIG. 1. Where multiple transistors are aligned in a z-dimension (e.g., a column), the transistors share a single gate electrode (an indivisible body connected to each channel through a gate dielectric material). The gate electrode of the gate stack may serve as an address line for addressing each of the transistors connected thereto.

Figure 15:
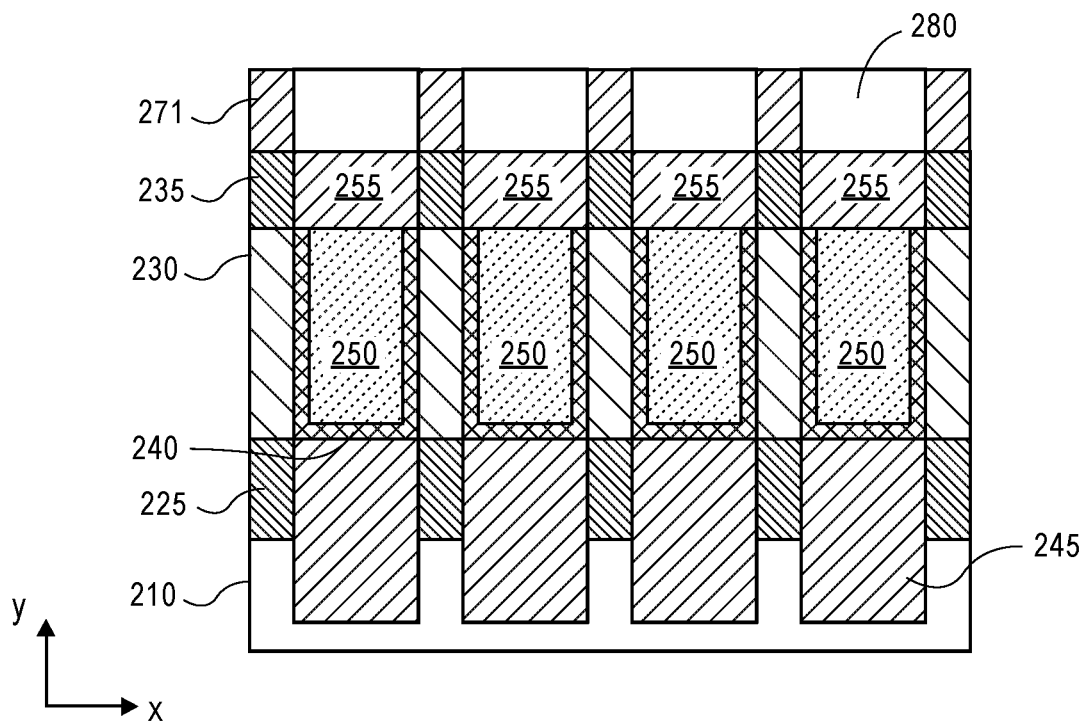
FIG. 15 shows the structure of FIG. 14 through line 15-15' following the formation of an active medium connected to the second diffusion region of each transistor.

FIG. 15 shows the structure of FIG. 14 through line 15-15' (an xy perspective) following the formation of an active medium connected to the second diffusion region (block 350, FIG. 20). Active medium 271 can be an electrically conductive material or a device, such as a programmable material or materials (e.g., a memory device). In one embodiment, dielectric material 280 such as silicon dioxide or a low-k dielectric material may be deposited and then patterned to have openings over respective ones including all the second diffusion regions 235 of the transistor in the array. Active medium 271 is then formed to be in electrical contact with the second diffusion region of ones or all of the transistors of the array. After forming active medium 271, the array shown in FIG. 15 is similar to that shown in FIG. 1 and FIG. 2.

As noted above, an array of transistor devices such as described above may be used in memory applications. Representatively, the gate electrodes of the transistor devices may be utilized as the word lines and the diffusion regions of the transistor devices may be connected to bit lines and programmable material, respectively. In the above referenced example, first diffusion regions 220 are connected to the substrate. It is appreciated that the first diffusion regions could be connected to a conductor or conductors (e.g., conductive lines) that extend, for example, perpendicular to the word lines and connect transistor devices in an x-dimension. Representatively, in an example where substrate 210 is an SOI structure, the transistors may be isolated by etching through the silicon layer and then strapping the diffusion region to a conductor.

Figure 16:
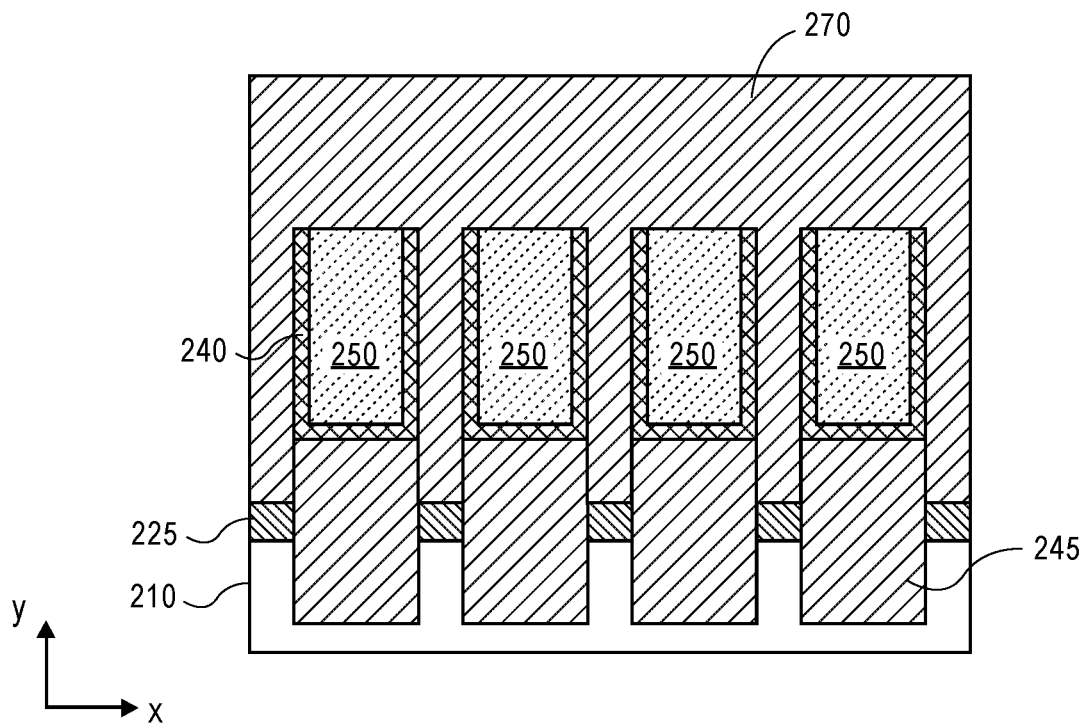
FIG. 16 shows the structure of FIG. 13 following the deposition of a dielectric material in the trenches with the mask retained.
Figure 17:
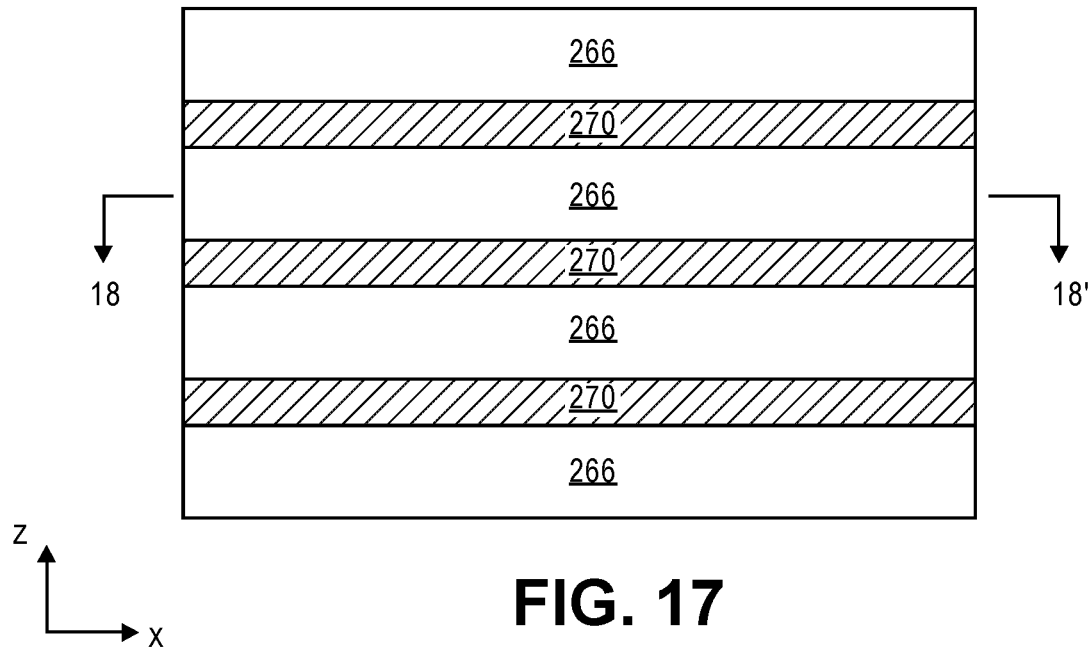
FIG. 17 shows a top view of the structure of FIG. 16.
Figure 18:
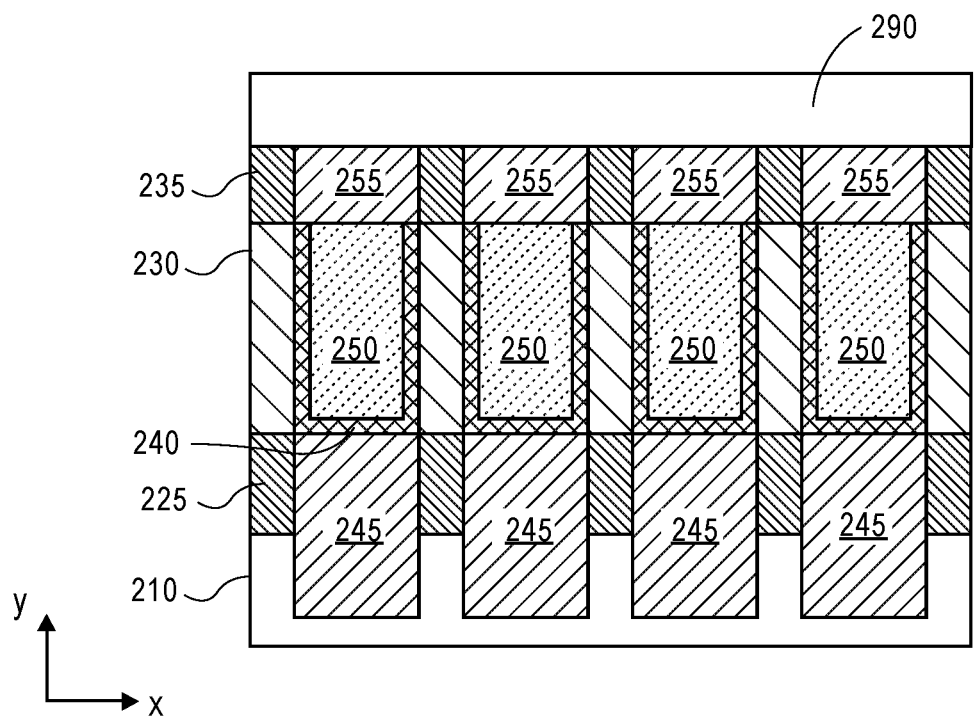
FIG. 18 shows the structure of FIG. 17 through line 18-18' after the replacement of the mask with electrically conductive material.

In another embodiment, address lines may be connected to second diffusion regions 235. In one embodiment, starting from FIG. 13, rather than removing mask 266, the mask is retained after trenches 267 are formed. FIG. 16 shows the structure of FIG. 13, according to this embodiment, following the deposition of dielectric material 270 in trenches 267. In this embodiment, dielectric material 270 is deposited at least to a height of mask 266. FIG. 17 shows a top view of the structure of FIG. 16. Once dielectric material 270 is deposited, the structure may be planarized by, for example, a polish. Following the deposition and optional planarization, mask 266 is removed by, for example, an etch (e.g., wet etch) and replaced with an electrically conductive material such as a contact metal. FIG. 18 shows the structure of FIG.

17 through line 18-18' after the replacement of mask 266 with electrically conductive material. FIG. 18 shows electrically conductive material 290 such as a metal (e.g., copper) connected to second diffusion region 235 of each of five transistors in a row. Conductive material 290 is self-aligned to the transistors in the row. Conductive material 290 may serve as an address line such as a bit line and the gate electrodes connecting transistors in columns may serve as address lines (e.g., word lines). FIG. 19 shows a top perspective view of the structure of FIG. 18 with the dielectric material removed. FIG. 19 shows four rows of transistors with each row connected to a respective address line (e.g., a bit line) of conductive material 290 and the individual address line is connected to driver 295 (e.g., a bit line driver). FIG. 19 also shows five columns of transistors with four transistors in each column connected through a respective address line of gate electrode 250 and the individual address lines connected to driver 296 (e.g., a word line driver).

Figure 21:
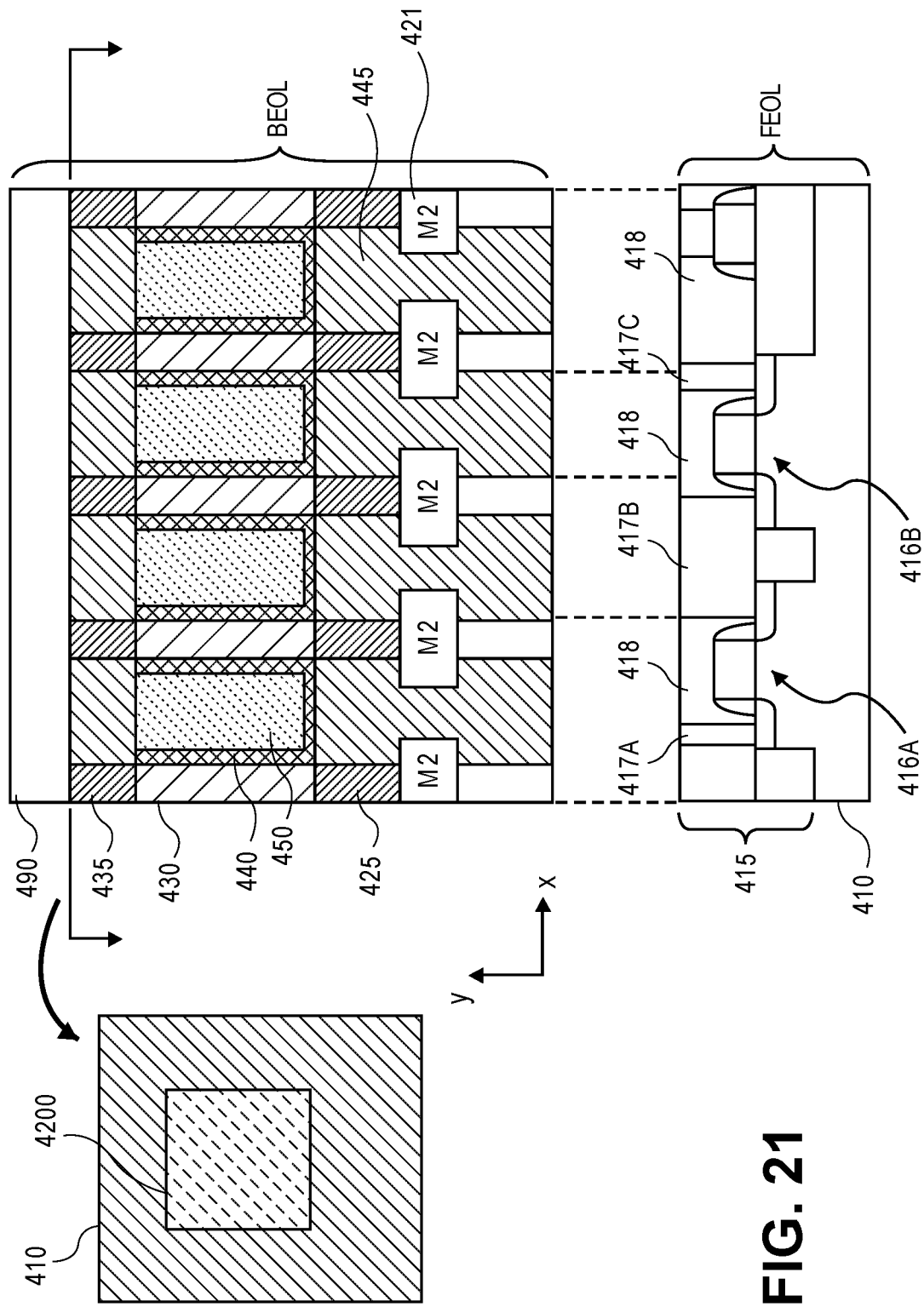
FIG. 21 shows a side view of a portion of an integrated circuit device or chip that includes vertical FETs integrated into the device in the back end of the line (BEOL) fabrication.

In the embodiment described with respect to FIGS. 1-20, vertical FETs are formed as part of front end of the line (FEOL) fabrication typically regarded as forming discrete transistor and other devices on a semiconductor substrate prior to any metallization to connect the devices. FIG. 21 shows a side view of a portion of an integrated circuit device or chip that includes vertical FETs integrated into the device in the back end of the line (BEOL). BEOL fabrication typically refers to those portions of integrated circuit fabrication where individual devices (e.g., transistors, capacitors, resistors, etc.) are interconnected with metallization layers on a wafer. FIG. 21 shows substrate 410 of, for example, a bulk silicon or an SOI structure. Disposed on substrate 410 is device layer 415 that representatively includes a number of transistors, capacitors, resistors, etc. The devices are formed as part of a front end of the line (FEOL) fabrication. FIG. 21 shows transistors 416A and 416B as representative of devices in device layer 415. FIG. 21 also shows contacts 417A, 417B and 417C to transistors 416A and 416B, respectively and dielectric layer 418 also as part of the FEOL fabrication. Overlying device layer 415 is typically metallization to interconnect devices and provides connection points to outside of the chip. Representatively, an integrated circuit chip may have six metallization layers. These metallization layers are formed as part of the BEOL fabrication along with dielectric layers that insulate the metallization layers. FIG. 21 shows that vertical FETs may also be formed during the BEOL fabrication. In this example, an array of vertical transistors are formed in an area between a second level of metallization (M2) and a fourth level of metallization (M4) thereby, in one area, replacing a third level of metallization (M3) and conductive vias between the second and third level and third and fourth level of metallization. In one embodiment, the vertical FETs may be formed as described above with reference to FIGS. 1-20. Rather than forming the transistors, as in that case, with a first diffusion region connected to a substrate, in this embodiment, the first diffusion regions 425 are representatively connected to or formed on the second level of metallization (M2) such as copper lines projecting into and out of the page. First diffusion regions 425, channels 430 and second diffusion regions 435 are stacked one on the other in a vertical orientation (as viewed). The diffusion regions and channel can be made from a variety of thin film materials that may be deposited or epitaxially grown on the second level of metallization. Examples include silicon, germanium or group III-V compound semiconductor materials that may be amorphous or crystalline (e.g., polycrystalline). Specific examples include, but are not limited to, silicon, germanium (Ge), silicon germanium (SiGe), gallium arsenide (GaAs), indium antimony (InSb), indium gallium arsenide (InGaAs), gallium antimony (GaSb), indium gallium oxide (IGO), indium gallium zinc oxide (IGZO) and tin oxide (SnO). Such thin films may be deposited as described above with reference to FIG. 4 across an area of the substrate above (as viewed) second level metallization 421. Representatively for an n-type device, a film for first diffusion regions 425 may be initially deposited on second level metallization 421 with the film being doped and n-type (n+ film) and a film for channel material 430 may be then be deposited on the film for first diffusion regions 425 with the film of the channel material being an intrinsic or lightly doped material. The film of first diffusion regions 425 and channel 430 are then patterned into fins or transistor bodies on second level metallization 421 as shown. A gate electrode and second diffusion regions 435 may be formed as described above offset from a respective transistor body or fin (see FIGS. 5-11). A gate electrode is formed self-aligned to a transistor body or fin. Second diffusion regions 435 may then be formed as described above with respect to FIGS. 9-10. In this embodiment, second diffusion regions 435 are connected to fourth level metallization 490 (e.g., a copper material) that is, for example, an address line (e.g., a bit line) deposited after the forming of the vertical transistors (e.g., an array of vertical transistors).

In one embodiment, an array of vertical FETs may be formed in BEOL fabrication and replaces some of the metallization layers and associated vias in one area while retaining such metallization layers and associate vias in other areas. FIG. 21 shows an inset that is a top view of the structure relative to a chip in which the transistor array is a portion thereof. The top view shows transistor array 4200 formed to be of an area less than an entire area of the chip.

Figure 22:
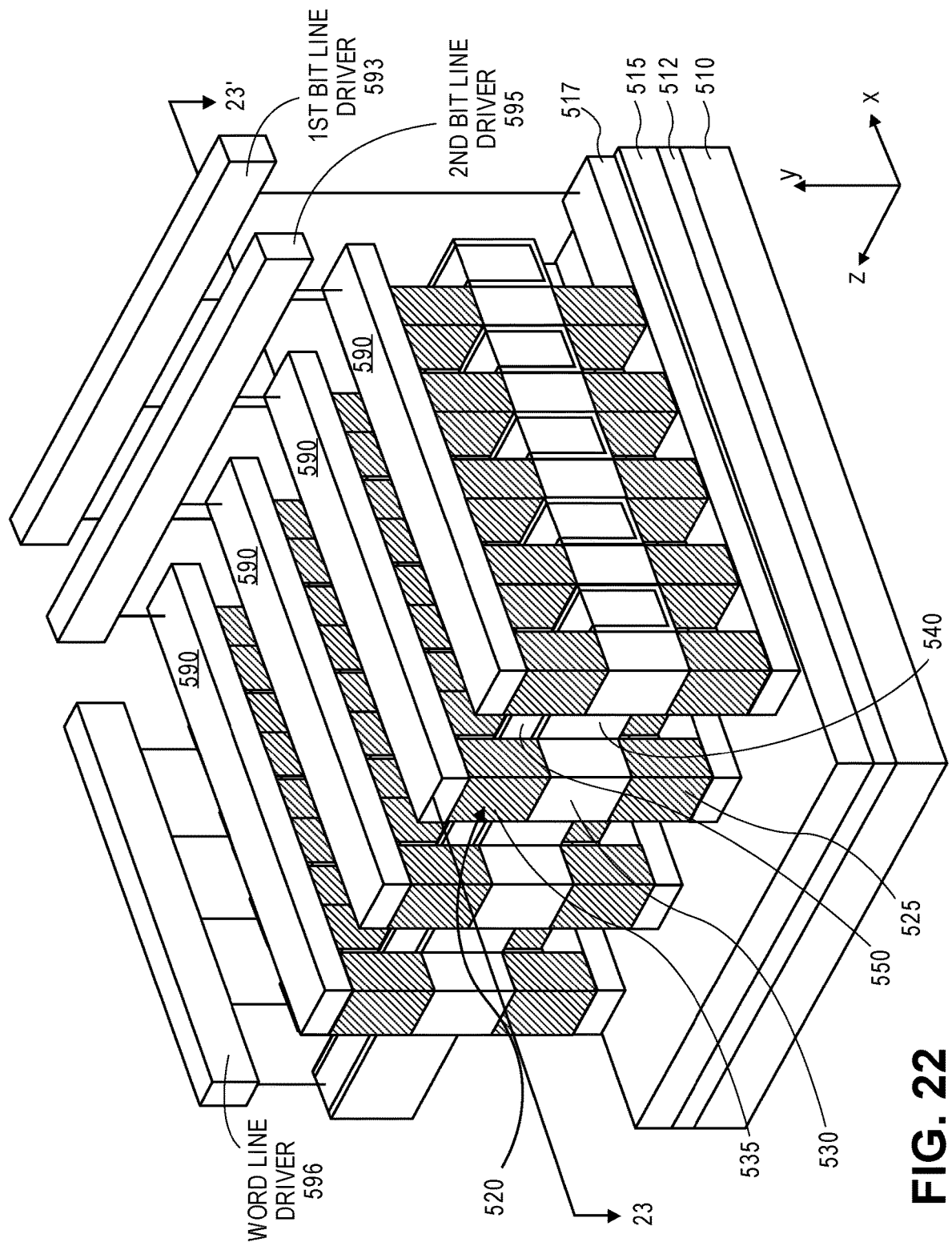
FIG. 22 shows a top perspective view of an embodiment of an array of vertical FET wherein each transistor in the array is connected to a bottom address line (e.g., a bottom bit line) and a top address line (e.g., a top bit line).
Figure 23:
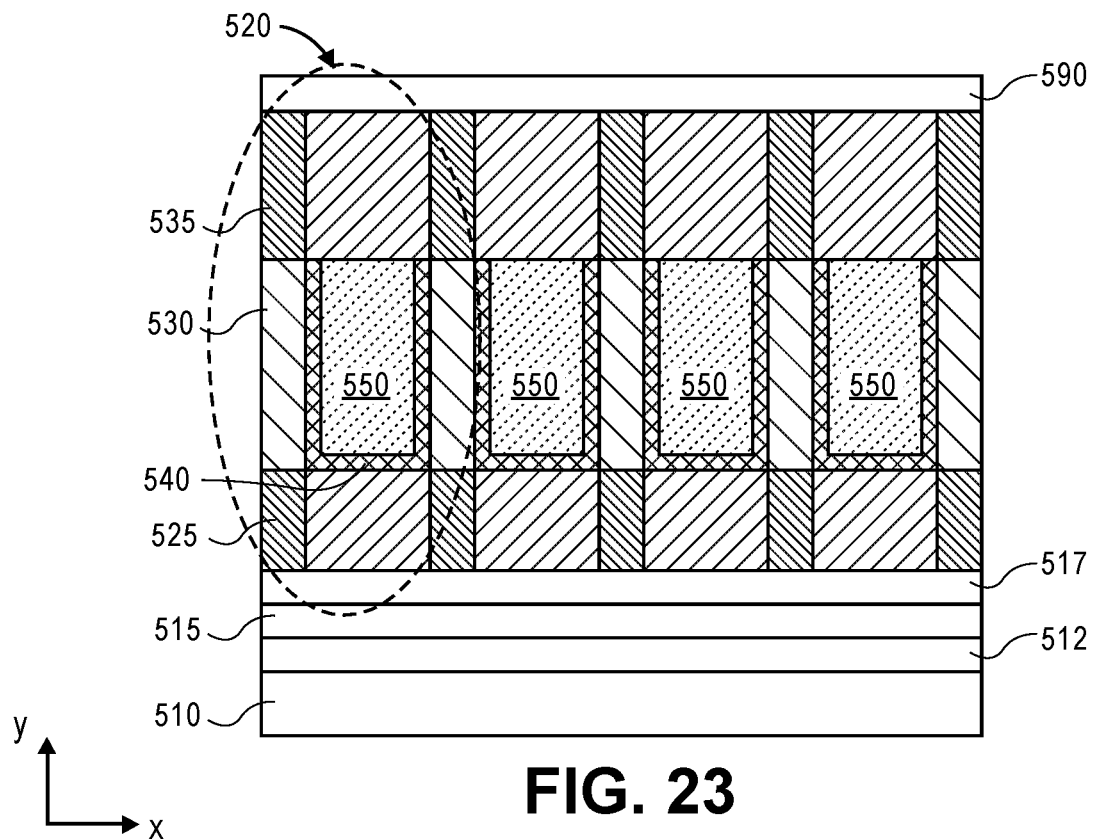
FIG. 23 shows the structure of FIG. 22 through line 23-23'.

Many memory applications such as RRAM and MRAM require independent source and drain address lines in a transistor array due to bipolar switching requirements. In one embodiment, the techniques described above including the use of vertical transistors and thin film semiconductor deposition can be used to create independent address lines for the source and the drain of the transistors, respectively, including a self aligned bottom address line. FIG. 22 shows a top perspective view of an embodiment of an array of vertical FET wherein each transistor in the array is connected to a bottom address line (e.g., a bottom bit line) and a top address line (e.g., a top bit line). Dielectric material surrounding the transistors is not shown in FIG. 22 so that the array may be visible. FIG. 23 shows the structure of FIG. 22 through line 23-23'. In this embodiment, non-planar, vertical (as viewed) BEOL transistors are described that include diffusion regions and a conducting channel in a stacked arrangement (one on the other) on a substrate. Transistor 520 is representative of the transistors in the array.

Referring to FIG. 22 and FIG. 23, in one embodiment, substrate 510 is a semiconductor substrate such as a bulk semiconductor (e.g., bulk silicon) or an SOI structure. Substrate 510 may be less than an entire portion of a chip. Disposed on substrate 510, in this example, is device layer 512 that may include a large number of devices (e.g., transistors, capacitors, resistors, etc.). Overlying device layer 512 is dielectric layer 515 (e.g., SiO2 or a low-k dielectric material) and, representatively, one or more metallization layers. Disposed on dielectric layer 515 is first address lines 517. FIG. 22 shows four first address lines 517 defining, representatively, four rows. Disposed on each of first address lines 517 are vertical FETs. FIG. 22 shows five vertical FETs disposed on respective first address lines. Transistor 520 is a representative of each of the transistors. Transistor 520 includes first diffusion region 525 such as a source in physical and electrical contact with first address line 517. Disposed on first diffusion region 525 is channel 530. Disposed on channel 530 is second diffusion region 535. First diffusion region 525, channel 530 and second diffusion region 535 are illustrated as a quadrilateral (e.g., rectangular) body or fin projecting generally vertically from a surface of first address line 517. Offset in an x-direction from the transistor body or fin and connected to only one side of the quadrilateral structure of the channel of the transistor body or fin is a gate stack including gate dielectric 540 of, for example, silicon dioxide or a high-k material or a combination of materials and gate electrode 550 of, for example, a metal material (e.g., tantalum), a metal nitride or a silicide. As shown in FIG. 22, the gate stack extends through the array in a z-dimension and, in such manner, is connected to multiple channels of transistor bodies or fins in the array. FIG. 22 shows a gate stack connected to four transistor bodies or fins to representatively define a column where gate electrode 550 may serve as an address line for each of the transistors aligned in a z-dimension column.

Disposed on and electrically connected to each of the second diffusion regions (second diffusion region 535) are respective second address lines 590. In one embodiment, in the illustration shown in FIG. 22, each second address line 590 is connected to five transistors in a row and is disposed in a parallel alignment with first address line 517. Second address line 590 may be a metal material such as copper that may be part of a BEOL metallization layer. FIG. 22 shows each of first address lines 517 are electrically connected to first bit line driver 593 and each of second address lines 590 are electrically connected to second bit line driver 595. Each gate electrode 550 defining a word line, in this embodiment, is connected to word line driver 596.

Figure 24:
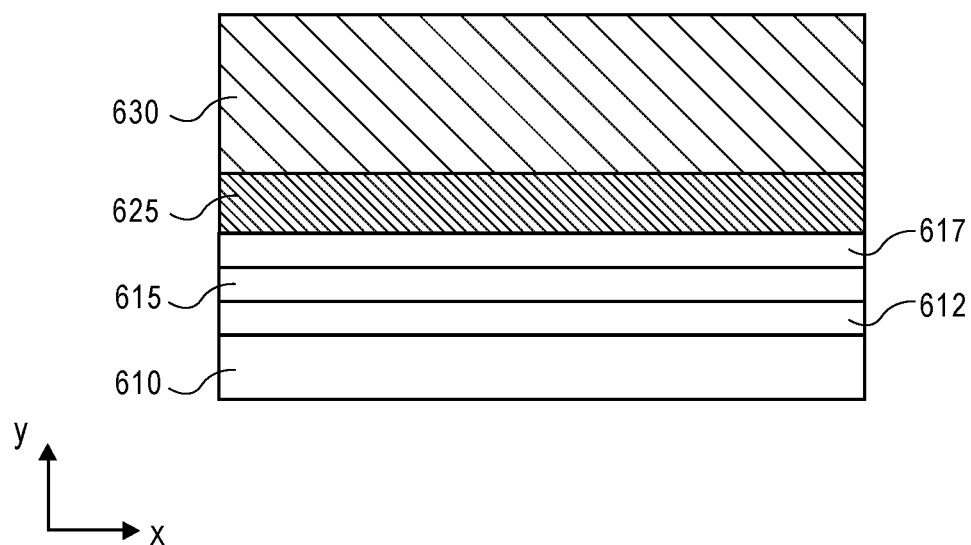
FIG. 24 shows a substrate having a device layer, a passivation layer and first diffusion region material film on a surface and a channel material film on the first diffusion region material film.

FIGS. 24-34 describe a method for forming the transistor array as shown in FIG. 22 and FIG. 23. FIG. 35 is a flow chart of the method. The method is similar to that described above with reference to FIGS. 3-20. A formation process for an array of n-type FETs is described. Again, it should be appreciated that the techniques for forming a transistor presented here are not limited to any particular device conductivity or transistor type. Referring to FIG. 24 and with reference to FIG. 35, the process begins following, in this example, any FEOL fabrication such as the forming of transistor or other devices on a substrate, the passivating of such devices and the formation of contacts to such devices. FIG. 24 shows substrate 610 that may be any material that may serve as a foundation on which an array of vertical FETs may be constructed. Representatively, substrate 610 is a portion of a larger substrate that is a wafer. In one embodiment, substrate 610 is a bulk semiconductor material such as a single crystal silicon or an SOI structure.

Disposed on a surface of substrate 610 (a top surface as viewed) is device layer 612 of, for example, a number of transistor, capacitor, and/or resistor devices. Overlying device layer 612 is passivation layer 615. In one embodiment, passivation layer 615 is a SiO2 layer or a low-k dielectric material. Passivation layer 615, in one embodiment, may be a base dielectric layer passivating the FEOL fabrication and, in another embodiment, may be insulating material passivating the FEOL fabrication and also insulating material between metallization layers formed as part of BEOL fabrication. Overlying or disposed on passivation layer 615 is conductive layer 617. Conductive layer 617 is an electrically conductive material that would be suitable, in one embodiment, to serve as an address line for an array of transistors connected thereto. In one embodiment, conductive layer 617 is a copper material that may be deposited by an electroplating process over an array area on a surface of an area including passivation layer 615 (block 705, FIG. 35). In another embodiment, conductive layer 617 is titanium nitride or tungsten deposited by, for example, a CVD or PVD process. In one embodiment, conductive layer 617 may be part of a metallization layer (e.g., M1-M6) in a BEOL fabrication.

FIG. 24 shows film 625 deposited on conductive layer 617. Film 625 is, for example, an amorphous or crystalline (e.g., polycrystalline) semiconductor material such as silicon, germanium (Ge), silicon germanium (SiGe), gallium arsenide (GaAs), indium antimony (InSb), indium gallium arsenide (InGaAs), gallium antimony (GaSb), indium gallium oxide (IGO), indium gallium zinc oxide (IGZO) or tin oxide (SnO). For n-type transistors, film 625 is n-doped (n+) and is epitaxially grown or deposited to a representative thickness on the order of 25 nm as a first diffusion region film (block 710, FIG. 35). Formed on film 625 is a film for a channel of a transistor (block 715, FIG. 35). In one embodiment, film 630 is undoped (intrinsic) or lightly doped semiconductor material that has a representative thickness on the order of 75 nm. Where film 625 is silicon, film 630 may also be silicon that is formed by an epitaxial growth or deposition process.

Figure 25:
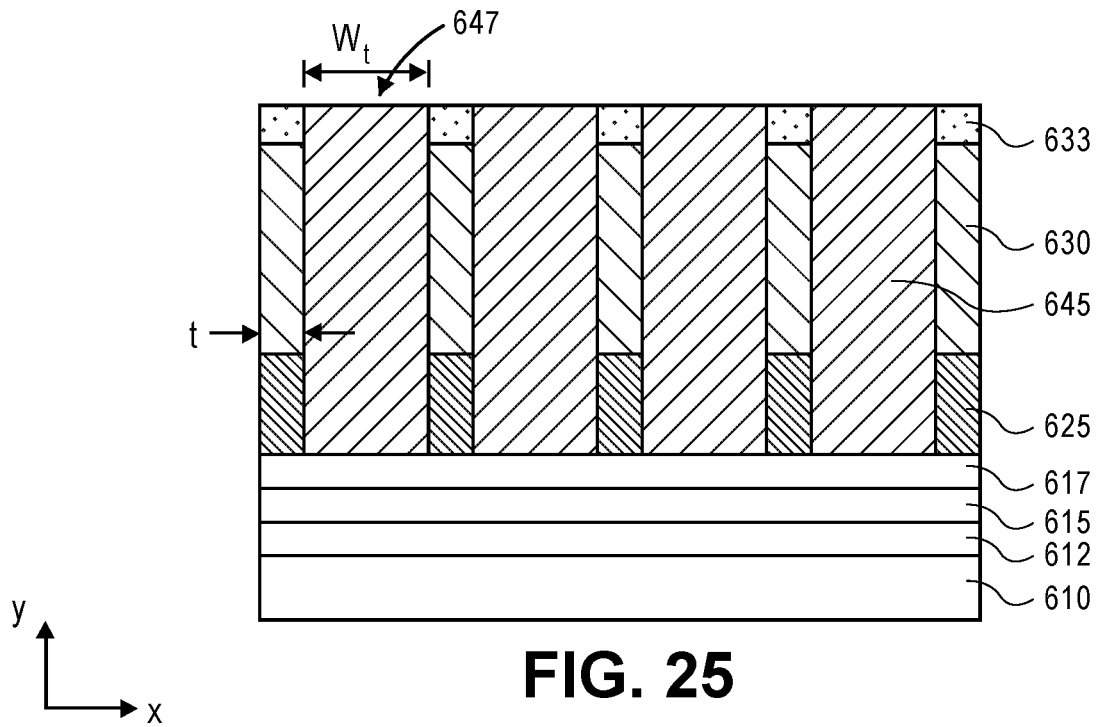
FIG. 25 shows the structure of FIG. 24 following the definition of the fin structures in the first diffusion region material film and the channel material film and a deposition of dielectric material between the fin structures.

FIG. 25 shows the structure of FIG. 24 following the definition of fin structures in film 625 and film 630 (block 720, FIG. 35) and a deposition of dielectric material between the fins (block 725, FIG. 35). FIG. 25 representatively shows five fins. The fins may be formed by a mask and etch process wherein mask 633 (e.g., hard mask of, for example, silicon nitride) is introduced on a surface (superior surface) of film 630 to protect areas of film 630 and underlying film 625 where the fins would be defined and provide openings in non-fin areas. Once mask 633 is patterned, the structure may be anisotropically etched to remove the material in unprotected areas. As shown in FIG. 25, in one embodiment, the etch is selective for a material of film 625 and film 630 but does not etch conductive layer 617. In this manner, trench or trenches 647 formed adjacent to the five fins have a depth to a surface of conductive layer 617. In one embodiment, each of the five fins, as shown in FIG. 25, has a thickness dimension, t, on the order of 10 nm. Representatively, a suitable etch for etching silicon films is a HF-based chemistry. Between adjacent fins is trench 647 having a representative width in an x-direction, wt, on the order of 40 nm. Following the definition of the fins, trenches 647 are filled with dielectric material 645 such as silicon dioxide or a low-k dielectric material.

Figure 26:
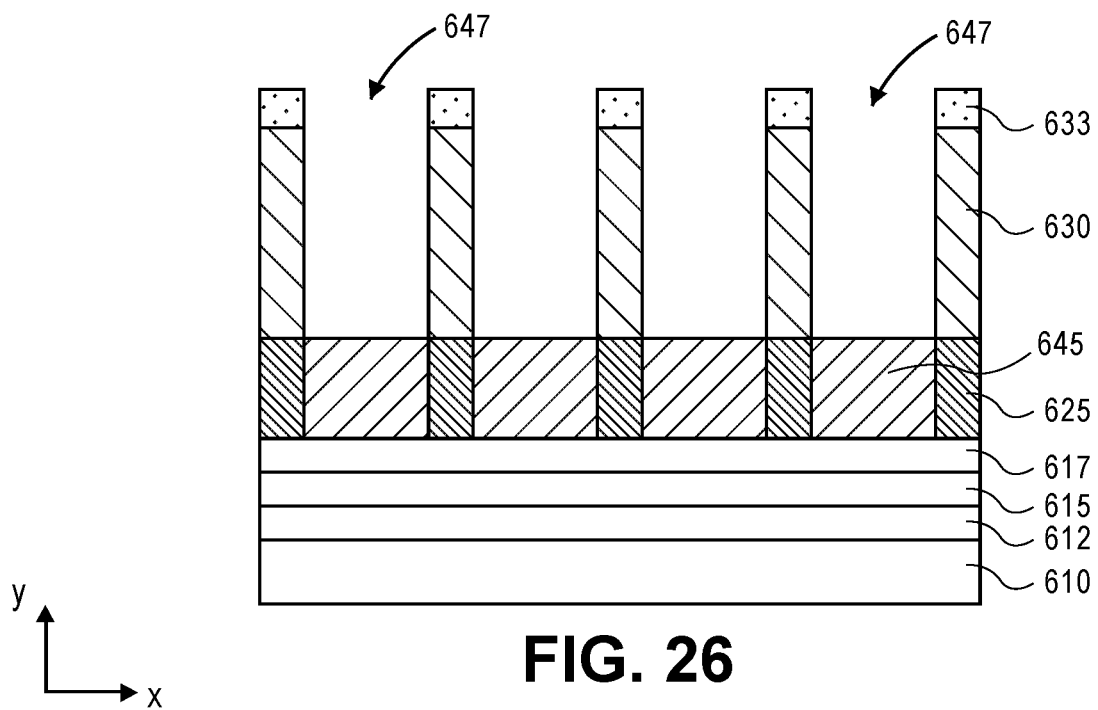
FIG. 26 shows the structure of FIG. 25 following a recessing of the dielectric material to a height of a film to expose an entire length dimension of the channel material film.

FIG. 26 shows the structure of FIG. 25 following a recessing of dielectric layer 645 to a height of film 625 to expose an entire length dimension of film 630 (block 730, FIG. 35). In one embodiment, such recessing may be done by retaining mask 633 and etching the dielectric material using a timed etch. As illustrated in FIG. 26, the depth of the etch forms trenches 647 having a depth of the length of film 630 (e.g., 75 nm).

Figure 27:
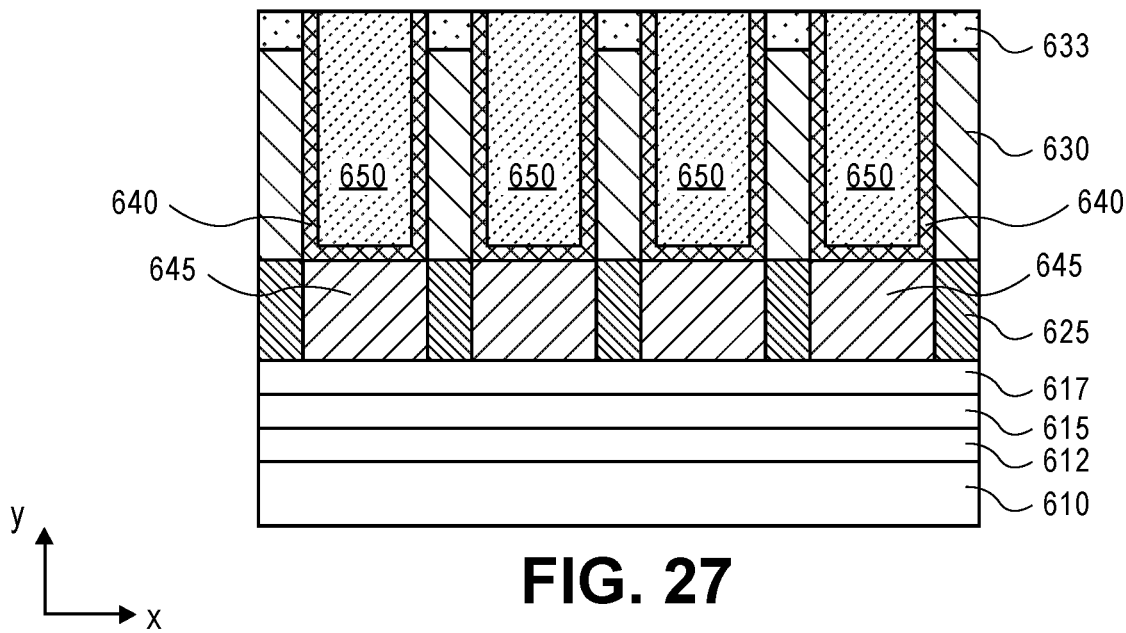
FIG. 27 shows the structure of FIG. 26 following the introduction of a gate dielectric and gate electrode material in trenches formed by recessing the dielectric material.

FIG. 27 shows the structure of FIG. 26 following the introduction of a gate dielectric and gate electrode material in the trenches of the structure. Initially, a gate dielectric material is introduced (block 735, FIG. 35). Gate dielectric 640 is, for example, silicon dioxide or a high-k dielectric material or a mixture of silicon dioxide and a high-k material or materials. As shown in FIG. 27, gate dielectric material 640 is introduced by, for example, CVD deposition to a thickness on the order of few nanometers in a manner that it conforms to the sidewalls of each trench 647 and a superior surface of dielectric layer 645. After forming gate dielectric 640, gate electrode 650 is formed in the trenches (block 740, FIG. 35). Representative materials for gate electrode 650 include, but are not limited to, tungsten, tantalum, titanium or a nitride, a metal alloy, silicide or another material. In one embodiment, gate electrode 650 may be introduced by a CVD or other deposition process. In one embodiment, a material for gate electrode 650 is introduced in an amount to fill each trench 647. Following the introduction of gate electrode 650 in each trench, a surface of the structure (a top or superior surface as viewed) may be polished by, for example, a chemical-mechanical polish to planarize the structure.

Figure 28:
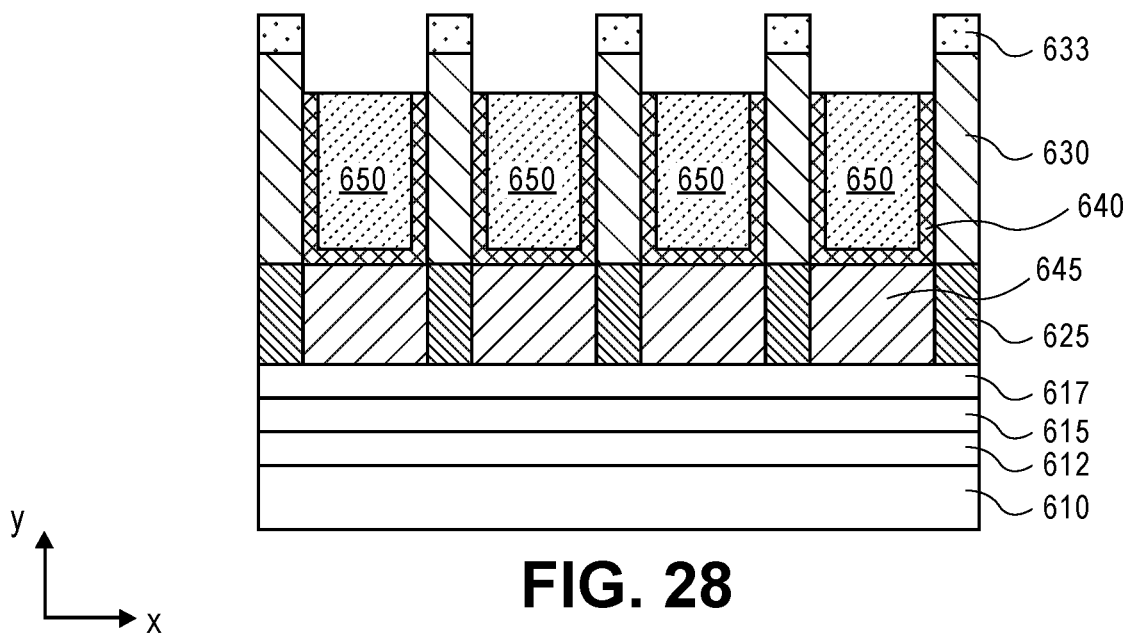
FIG. 28 shows the structure of FIG. 27 following a recessing of the gate stack material in each trench to expose a portion of the channel material film.

FIG. 28 shows the structure of FIG. 27 following a recessing of the gate stack material (gate dielectric 640 and gate electrode 650) in each trench 647 (block 745, FIG. 35). In one embodiment, a combination of dry or wet etches may be used to recess a metal gate electrode material and a high-k gate dielectric material. A recess is performed to expose a portion of film 630 such that the exposed portion can be modified or converted to form a second diffusion region in each fin. In one embodiment, the recess of gate dielectric 640 and gate electrode 650 exposes approximately 20 nm of film 630.

Figure 29:
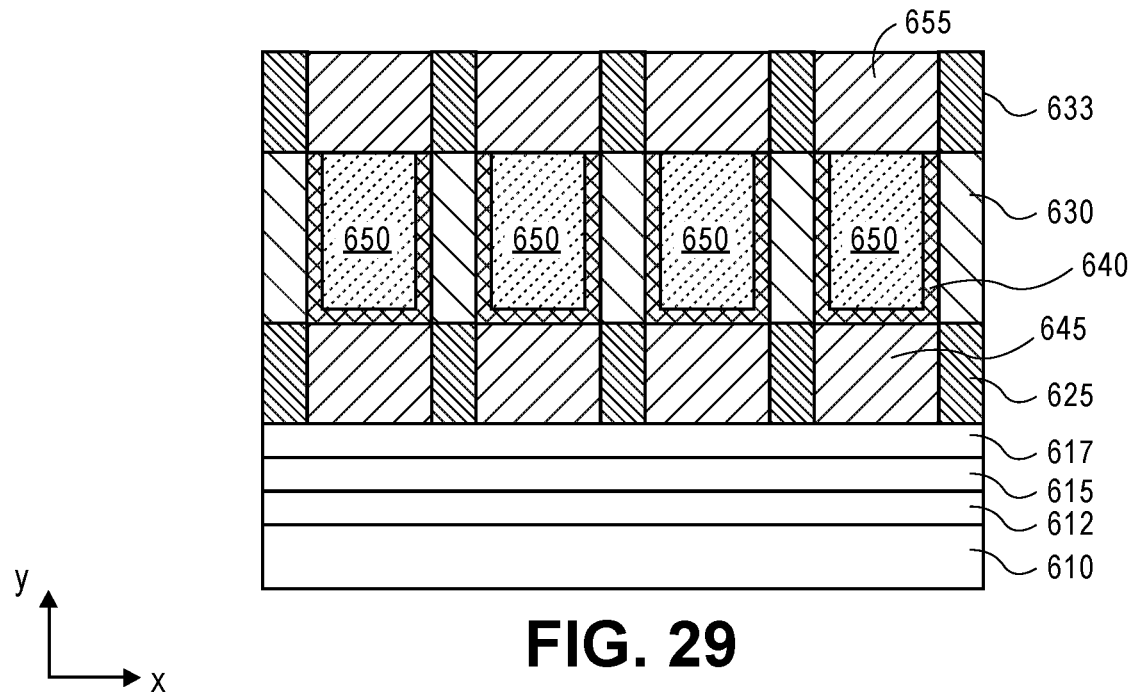
FIG. 29 shows the structure of FIG. 28 following a removal of the mask on each fin and the conversion of the exposed portion of the channel material film into second diffusion region material.

FIG. 29 shows the structure of FIG. 28 following a removal of the mask on each fin and the conversion of a portion of film 630 into second diffusion region material. The removal of mask 633 exposes a top portion of film 630. Following the removal, the exposed portion of film 630 may be converted to a second diffusion region material (block 750, FIG. 35). In one embodiment, second diffusion region 635 is formed by implanting an n-type implant such as arsenic or phosphorous into the exposed portion of film 630 to form an n+ second diffusion region. In another embodiment, a portion of film 630 can be removed and replaced with another material to form second diffusion region 635. FIG. 29 shows second diffusion region 635 having a x-dimension (thickness dimension) similar to that of film 630. In another embodiment, the x-dimension may be greater than an x-dimension of film 630 to form, for example, a raised diffusion region. In still another embodiment, an optional dielectric layer of silicon dioxide or a low-k dielectric material or a combination of materials may be formed on an exposed portion of the gate stack prior to the formation of second diffusion region 635 as a sidewall spacer on the gate electrode.

FIG. 29 shows the structure of FIG. 28 following the introduction of a dielectric material in trenches 647. In one embodiment, dielectric material 655 is silicon dioxide or a low-k dielectric material or a combination of materials that may be introduced by a deposition process. Following the deposition, a top surface of the structure (as viewed) may be planarized.

Figure 30:
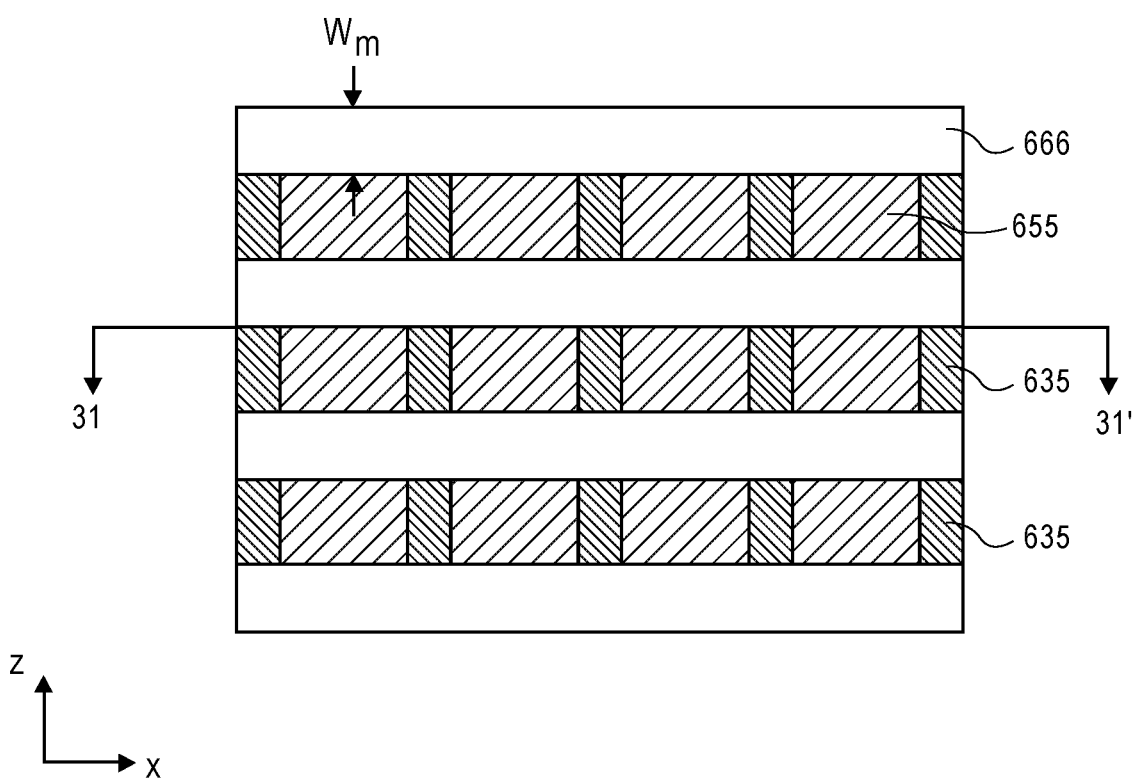
FIG. 30 shows a top view of the structure of FIG. 29 following the patterning of a masking material generally perpendicular to a direction of the gate stacks.

FIG. 30 shows a top view of the structure of FIG. 29 following patterning of a masking material generally perpendicular to a direction of the gate stacks. A width, wm, of mask 666 is selected to define a z-dimension thickness or width of individual transistor bodies or fins in a column. A representative width is on the order of 20 nm to 500 nm (e.g., 50 nm to 100 nm). One suitable material for mask 666 is a silicon nitride material.

Figure 31:
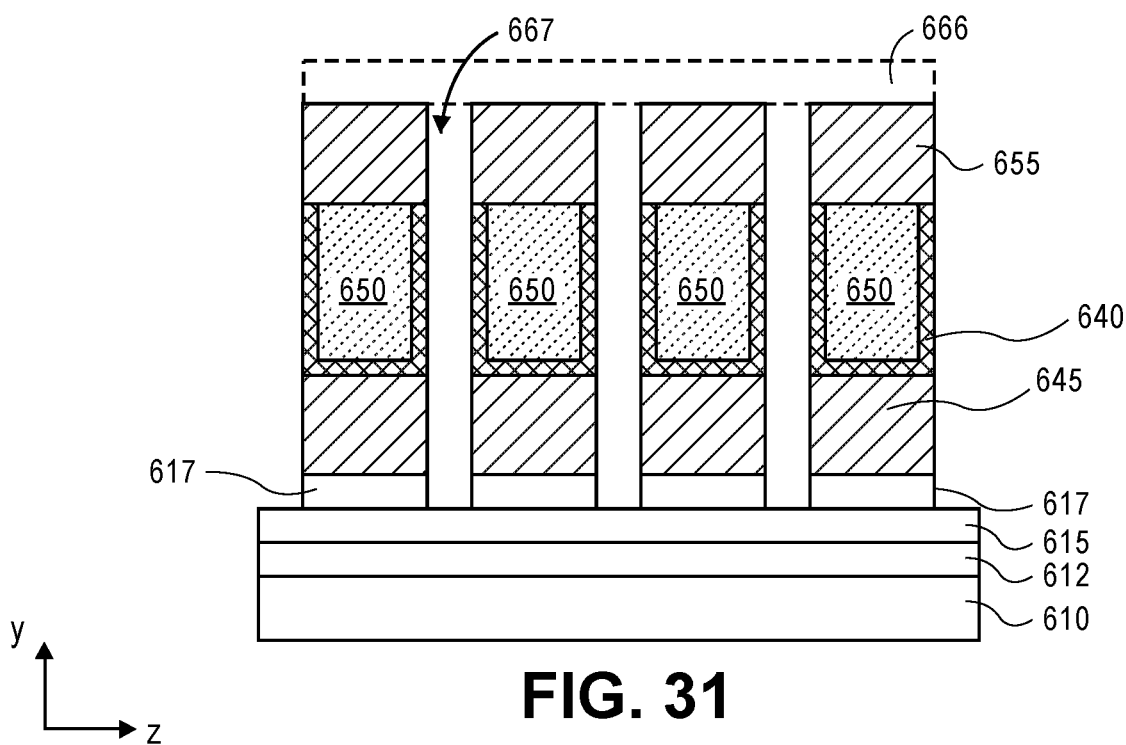
FIG. 31 shows the structure of FIG. 30 through line 31-31' to show a yz-dimension following the formation of trenches through the fins in areas of the fins that were not protected by a mask.

FIG. 31 shows the structure of FIG. 30 through line 31-31' to show a yz-dimension following the formation of trenches through the fins in areas of the fins that were not protected by mask 666 (block 755, FIG. 35). In one embodiment, the trenches are formed by anisotropically etching a portion of second diffusion region 635, film 630, film 625 and conductive layer 617 by an etch or series of etches. Such etching is selective to the noted materials and stops on passivation layer 615. Such etching also does not etch dielectric material 655 above each gate stack.

Figure 32:
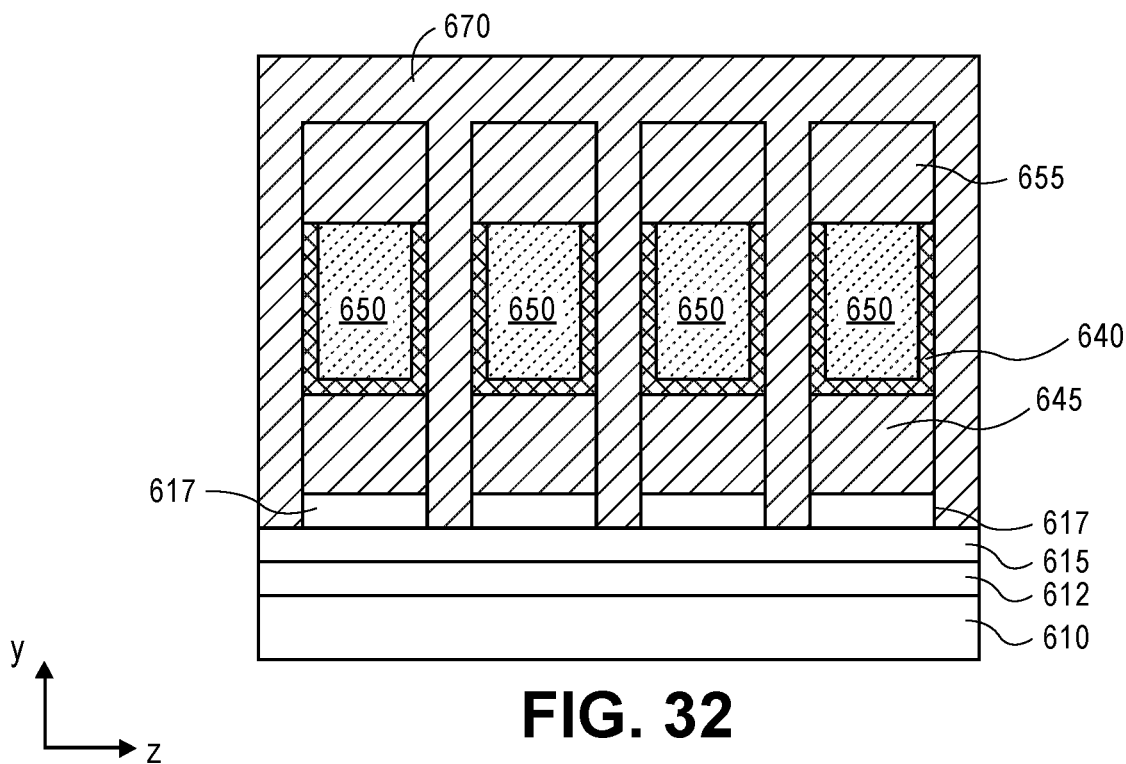
FIG. 32 shows the structure of FIG. 31 following the deposition of a dielectric material in the trenches.
Figure 33:
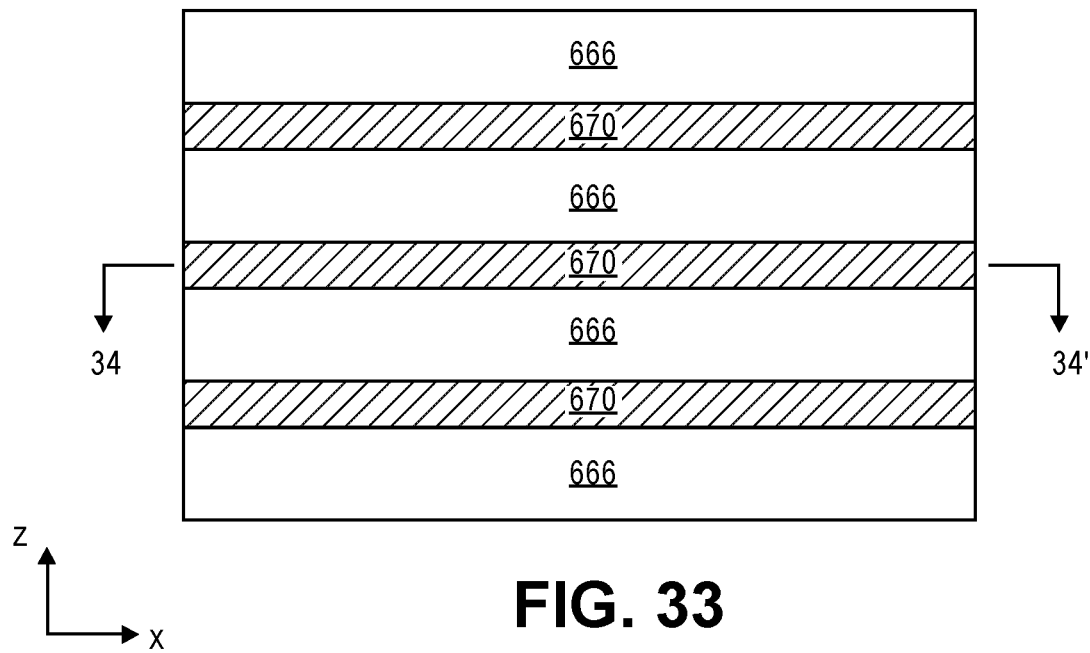
FIG. 33 shows a top view of the structure of FIG. 32.

FIG. 32 shows the structure of FIG. 31 following the deposition of dielectric material 670 in trenches 667 (block 760, FIG. 35). In this embodiment, dielectric material 670 is deposited to at least a height of mask 666. FIG. 33 shows a top view of the structure of FIG. 32. Once dielectric material 670 is deposited, the structure may be planarized by, for example, a polish. Following the deposition and optional planarization, mask 666 is removed by, for example, an etch and replaced with electrically conductive material such as a metallization metal (e.g., copper).

Figure 34:
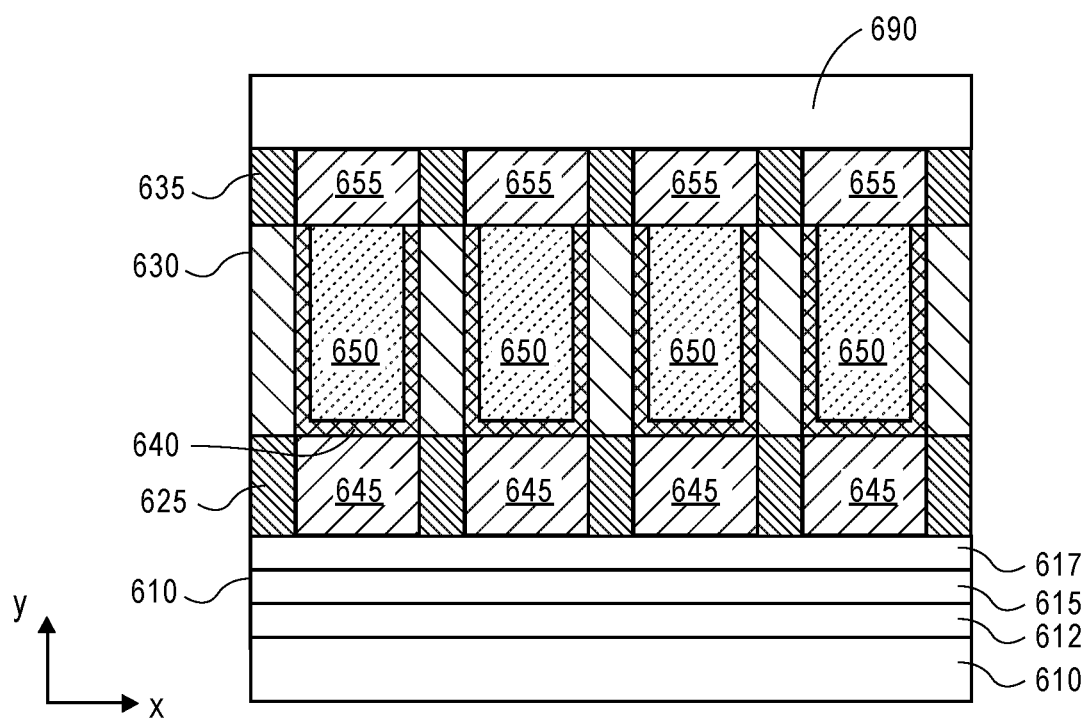
FIG. 34 shows the structure of FIG. 33 through line 34-34' after the replacement of the mask with electrically conductive material.
Figure 35:
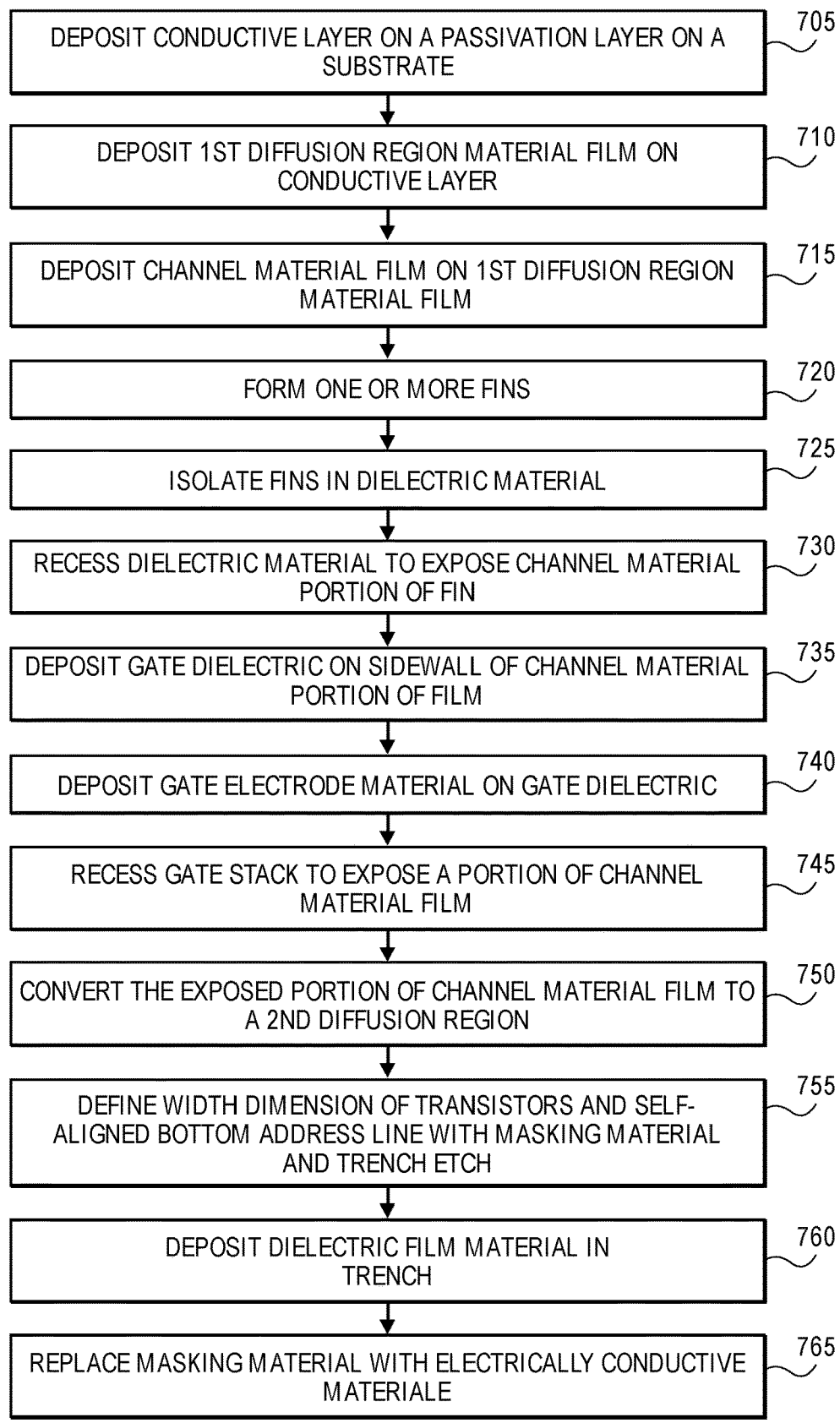
FIG. 35 is a flow chart of the methods illustrated in FIGS. 24-34.

FIG. 34 shows the structure of FIG. 33 through line 34-34' after the replacement of mask 666 with electrically conductive material (block 765, FIG. 35). FIG. 34 shows electrically conductive material 690 such as a metal (e.g., copper) physically connected to second diffusion region 625 of each of five transistors in a row. Conductive material 690 may serve as a second address line (e.g., a second bit line) as described above with respect to FIGS. 22-23. The structure shown in FIG. 34 is similar to that described above with respect to FIGS. 22-23.

Figure 36:
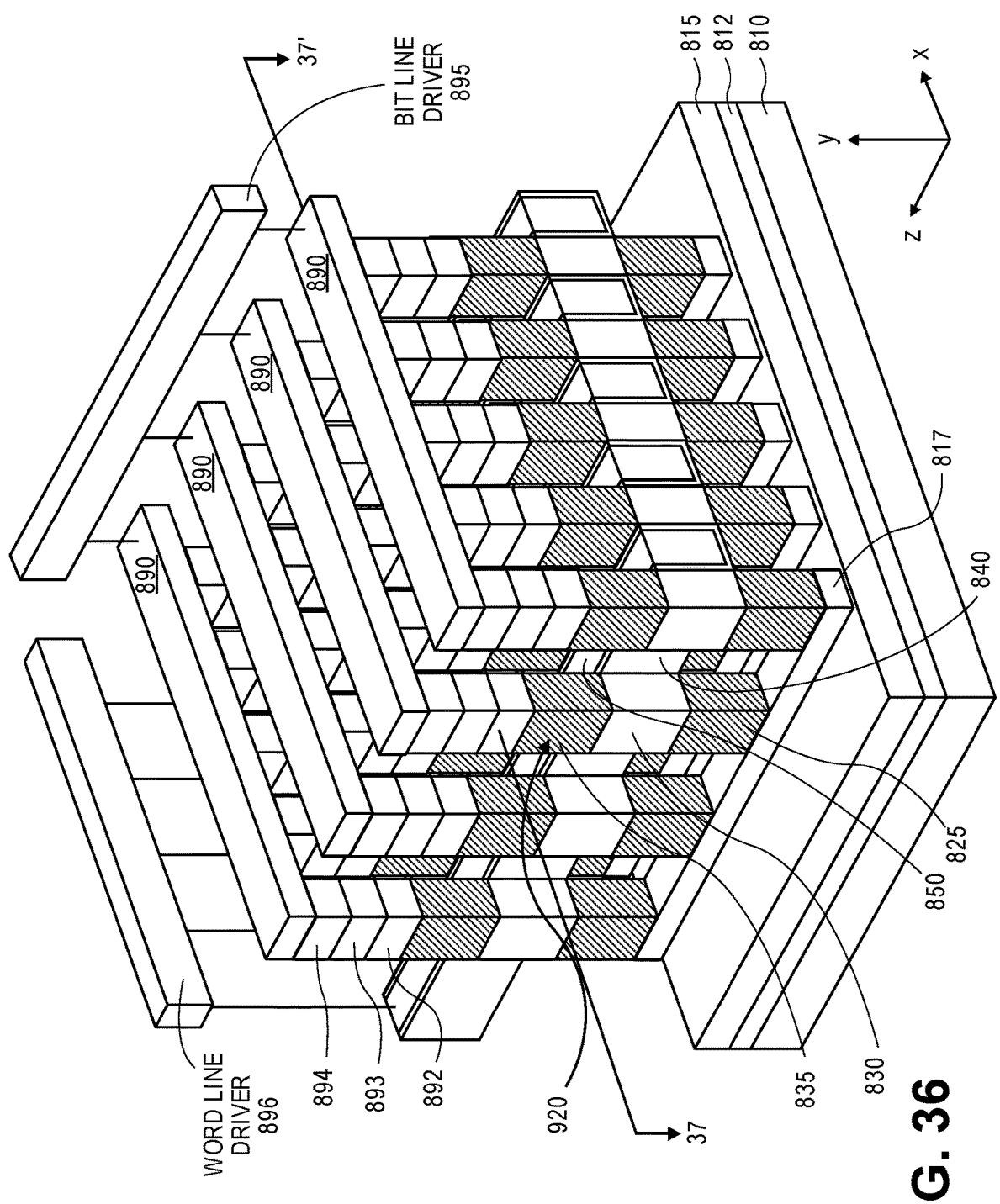
FIG. 36 shows an embodiment of a 1T-1R cross-grid memory array on a substrate wherein a memory element (e.g., MRAM, RRAM) is self-aligned to a vertical access transistor.
Figure 37:
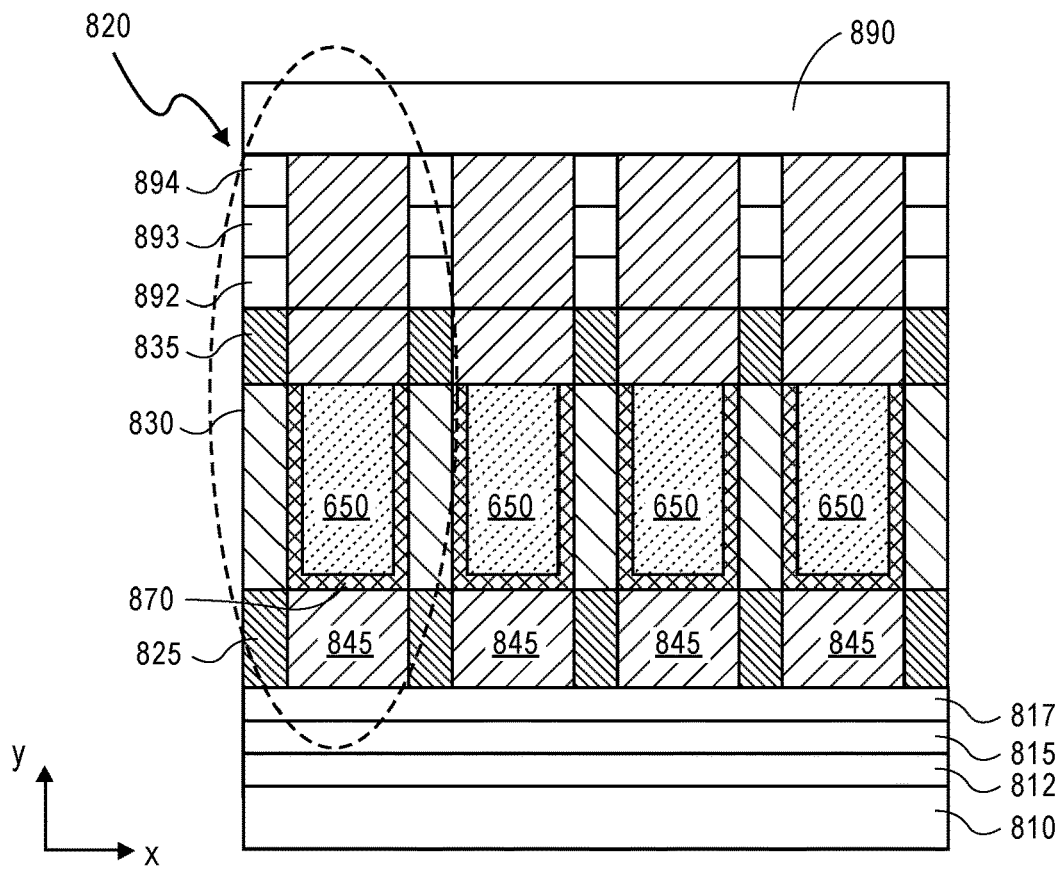
FIG. 37 shows a cross-sectional side view of the array of FIG. 36 through line 37-37'.

In another embodiment, a scaled and self-aligned 1T-1R cross grid memory array is described. FIG. 36 shows an embodiment of a 1T-1R cross-grid memory array on a substrate wherein a memory element (e.g., MRAM, RRAM) is self-aligned to a vertical access transistor. In one embodiment, a word line and a bit line as well as the memory element are all self-aligned in the array. In the illustration, dielectric material surrounding the transistor array is not shown so that the array may be visible. FIG. 37 shows a cross-sectional side view of the array of FIG. 36 through line 37-37'. In this embodiment, non-planar vertical (as viewed) BEOL access transistors are described with a programmable element such as RRAM or MRAM non-volatile memory stack oriented vertically thereon. Referring to FIG. 36 and FIG. 37, in one embodiment, substrate 810 is a semiconductor substrate such as a bulk semiconductor or an SOI structure. Substrate 810 may be less than an entire portion of a chip substrate. Disposed on substrate 810, in this example, is device layer 812 that may include a large number of devices (e.g., transistors, capacitors, resistors). Overlying device layer 812 is dielectric layer 815 such as SiO2 or a low-k dielectric material and representatively one or more metallization layers. Disposed on dielectric layer 815 is metallization layer 817 that may be one of several metallization layers formed on substrate 810 as part of a chip fabrication process (e.g., the BEOL fabrication of a chip). Representatively, metallization 817 is a second level of metallization (M2) formed as traces or metal lines on dielectric layer 815 and connected, for example, to an underlying first level of metallization (M1). In this example, an assembly of vertical transistors and an active medium of a memory element on each transistor is described where the assembly is formed in an area between the second level of metallization (M2) and, for example, a fourth level of metallization (M4). FIG. 36 shows five vertical FETs aligned in representative rows and assemblies including and directly connected to disposed respective metallization lines of metallization 817. Five assemblies are shown in each of four representative columns (see FIG. 36) with the columns disposed perpendicular to the rows. Stacked on each transistor of an assembly is a memory element. Assembly 820 in FIGS. 36 and 36 is representative of the assemblies of transistor and memory elements in the array. Assembly 820 includes a transistor including first diffusion region 825 such as a source in direct physical contact with metallization 817. Disposed on first diffusion region 825 is channel 830. Disposed on channel 830 is second diffusion region 835 such as a drain. First diffusion region 825, channel 830 and second diffusion region 835 are illustrated in a quadrilateral (e.g., rectangular) body or fin projecting generally vertically from a surface of metallization 817. Offset in an x-direction from the transistor body and connected to only one side of the quadrilateral structure of the channel of the transistor body is a gate stack including gate dielectric 840 of, for example, silicon dioxide or a high-k material or a combination of materials and gate electrode 850 of, for example, a metal material (e.g., tantalum), a metal nitride or a silicide. As shown in FIG. 36, gate electrode 850 extends through the array in a z-dimension as an indivisible body and, in such manner, is connected to multiple channels of transistor bodies in a representative column of the array. FIG. 36 shows a gate stack connected to four transistor bodies of a representation column define a column where gate electrode may serve as an address line (e.g., a word line) for each of the transistors aligned in a z-dimension column.

Disposed on and electrically connected to each of the second diffusion region (second diffusion region 835) are respective active media, in this case, a programmable element. In one embodiment, the programmable element is a MRAM memory element formed of two ferromagnetic plates or electrodes, each of which can hold a magnetization, separated by a thin insulating layer. FIG. 36 and FIG. 37 show first magnetic electrode or plate 892 that may be a ferromagnetic material or a stack of ferromagnetic materials such as platinum, manganese, cobalt, iron, ruthenium, aluminum and nickel iron. Disposed on first magnetic electrode or plate 892 is dielectric layer 893 of a material such as aluminum oxide. Disposed on dielectric layer 893 is second magnetic electrode or plate 894 that, in one embodiment, is a structure similar to the material or materials of first magnetic electrode or plate 892. In another embodiment, the programmable element is a RRAM non-volatile memory element that generally works by changing a resistance across a dielectric solid state material. In one example of RRAM, electrode 892 is a bottom electrode of, for example, titanium nitride, tantalum nitride, tungsten or platinum. Disposed on electrode 892 is a dielectric material such as a transition metal oxide (e.g., titanium oxide, nickel oxide, hafnium oxide, tungsten oxide, tantalum oxide). Disposed on dielectric layer 893 is electrode 894 of, for example, platinum, titanium nitride/titanium, titanium nitride, ruthenium, or nickel.

Disposed on electrode 894 and connected to each of the assemblies in a row are respective address lines 890. In the illustration shown in FIG. 36, each of address lines 890 is connected to five transistors in a row. Address line 890 may be a metal material such as a copper that may be part of a BEOL metallization layer (e.g., M4). FIG. 36 shows each of address lines 890 connected to bit line driver 895 and each gate electrode 850 defining a word line connected to word line driver 896.

Figure 38:
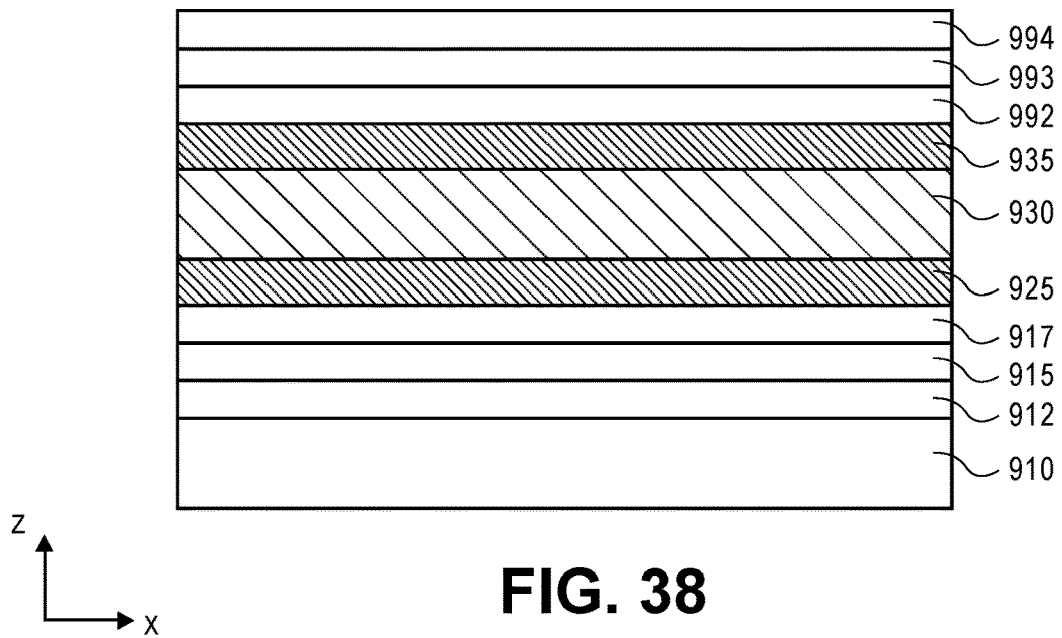
FIG. 38 shows a cross-sectional side view of a substrate including a device layer, a passivation layer on the device layer, at least one metallization layer on the passivation layer, transistor device films on the at least one metallization layer and programmable element layers or films on the transistor device layer films.

FIGS. 38-47 describe a method for forming a memory array such as shown in FIG. 36 and FIG. 37. FIG. 48 is a flow chart of the method. A formation process formed an array including n-type FET is described. Again, it should be appreciate that the techniques for forming transistors presented herein are not limited to any particular device conductivity or transistor type. Referring to FIG. 38 and with reference to FIG. 48, the process begins, in this example, following any FEOL fabrication such as the forming of transistor or other devices on a substrate, the passivating of such devices and the formation of contacts to such devices. FIG. 38 shows substrate 910 of a material that may serve as a foundation in which a memory array including vertical FET may be constructed. Representatively, substrate 910 is a portion of a larger substrate that is a wafer. In one embodiment, substrate 910 is a bulk semiconductor material such as a single crystal silicon or an SOI structure. Disposed on a surface of substrate 910 (a top surface as viewed) is device layer 912 of, for example, a number of transistor, capacitor, and/or resistor devices. Overlying device layer 912 is passivation layer 915 such as a SiO2 layer or low-k dielectric material. Passivation layer 915, in one embodiment, may be a single dielectric layer passivating the FEOL fabrication and, in another embodiment, may be dielectric layer passivating the FEOL fabrication as well as one or more dielectric layers between metallization layers formed as part of BEOL fabrication. According to the method of FIG. 48, overlying or disposed on passivation layer 915 is metallization layer 917 that is, for example, an electrically conductive material that is suitable, in one embodiment, to serve as a metallization material in BEOL fabrication in connecting transistor devices and routing signals therefrom and thereto. In one embodiment, metallization layer 916 is a copper material that may be deposited and patterned by an electroplating process over an array area on a surface of an area including passivation layer 915. In another embodiment, metallization 917 is tungsten deposited by, for example, a CVD process (block 1005, FIG. 48).

FIG. 38 shows semiconductor film 925 deposited on metallization 917 as a first diffusion region material (block 1010, FIG. 48). Film 915 is, for example, an amorphous or crystalline (e.g., polycrystalline) silicon, germanium (Ge), silicon germanium (SiGe), gallium arsenide (GaAs), indium antimony (InSb), indium gallium arsenide (InGaAs), gallium antimony (GaSb), indium gallium oxide (IGO), indium gallium zinc oxide (IGZO) or tin oxide (SnO). For n-type transistors, film 925 is n-doped (n+) and is epitaxially grown or deposited to a representative thickness on the order of 25 nm as a first diffusion region film. Formed on film 925 is a film for a channel of a transistor (block 1015, FIG. 48). In one embodiment, film 930 is undoped, intrinsic or lightly doped semiconductor material that has a representative thickness on the order of 75 nm. Where film 925 is silicon, film 930 is also silicon that may be formed by an epitaxial growth or deposition process.

Disposed on film 930 is film 935 as a second diffusion region material (block 1020, FIG. 48). Film 935 is, for example, amorphous or crystalline semiconductor film similar to film 925 that is also n-doped (n+) and is epitaxially grown or deposited to a representative thickness on the order of 25 nm as a second diffusion region film.

Disposed on film 930 of substrate 910 in FIG. 38 is an electrically conductive material that is suitable to serve as a bottom electrode or plate for a programmable element (block 1025, FIG. 48). Where the programmable element is an MRAM memory element, a suitable material for the bottom electrode 992 is, for example, one or more ferromagnetic materials such as platinum, manganese, cobalt, iron, ruthenium, aluminum and nickel iron. Where the programmable element is an RRAM memory element, a material for bottom electrode layer 992 is, for example, nitride, tantalum nitride, tungsten or platinum. Bottom electrode layer 992 is deposited by, for example, chemical vapor deposition (CVD) or physical vapor deposition (PVD) to a thickness on the order of 5 nm to 30 nm over an array area. Overlying bottom electrode 992 is dielectric layer 993. For an MRAM memory element, dielectric layer 993 is, for example, aluminum oxide (block 1030, FIG. 48). For an RRAM memory element, dielectric layer 993 is, for example, a transistor metal oxide. In one embodiment, dielectric layer 993 may be deposited by CVD deposition on the thickness of 1 nm to 100 nm. Deposited on dielectric layer is a top electrode or plate material (block 1035, FIG. 48). For either an MRAM or an RRAM memory element, top electrode 994 is, for example, a material or materials similar to bottom electrode 992 that may be formed by a CVD or PVD process to a thickness on the order of 5 nm to 30 nm.

Figure 39:
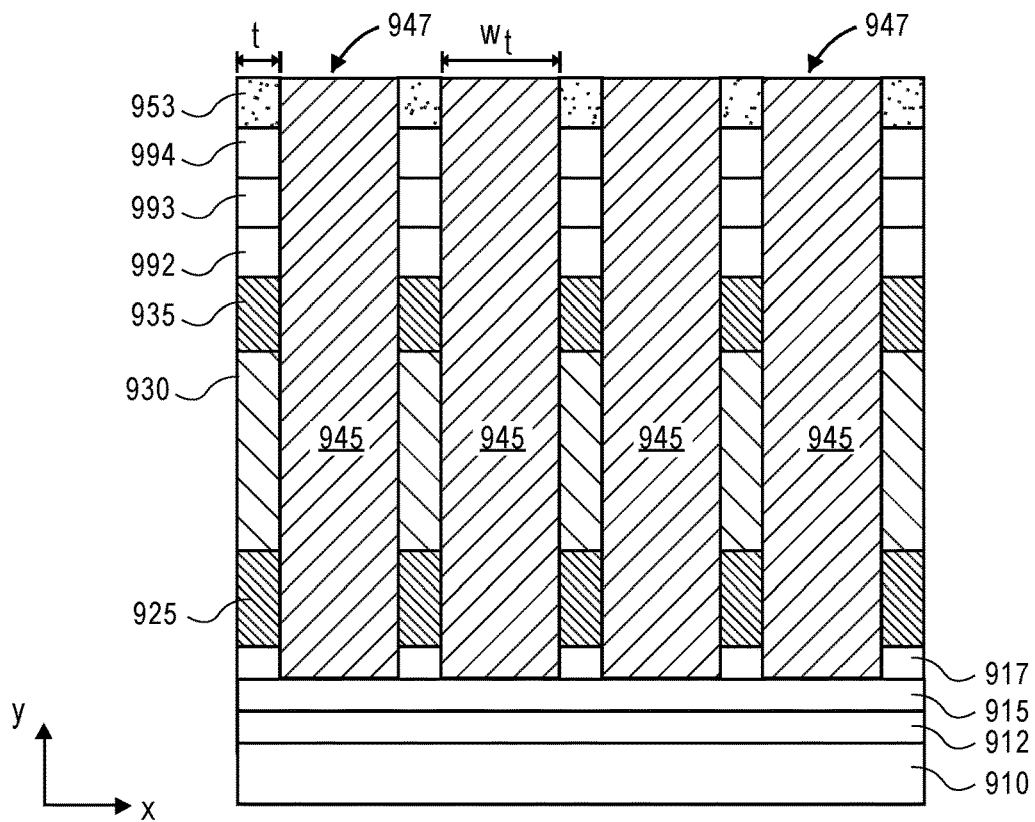
FIG. 39 shows the structure of FIG. 38 following the patterning of a hard mask and the definition of fin structures in the layers and films including the metallization layer, the films of the transistor and the films of the programmable element and the isolation of the fins with a dielectric material in trenches between adjacent fins.

FIG. 39 shows the structure of FIG. 38 following the definition of fin structures in the layers and films including metallization layer 917, the films of the transistor (of film 925, film 930 and film 935) and the layers or films of the programmable element (bottom electrode layer 992, dielectric layer 993 and top electrode layer 994) (block 1040, FIG. 48). FIG. 39 representatively shows five fins. The fins may be formed by a mask and etch process wherein mask 933 (e.g., hard mask of, for example, silicon nitride) is introduced on a surface (superior surface) of top electrode layer 994 to protect areas of the underlying layers or films where the fins are to be defined and provide openings in non-fin areas. Once mask 933 is patterned, the structure may be anisotropically etched to remove the material in unprotected areas. As shown in FIG. 39, in one embodiment, the etch proceeds through metallization layer 917 but does not etch dielectric layer 915. In one embodiment, each of the five fins, as shown, has a thickness dimension, t, on the order of 10 nm. In one embodiment, a series of etches may be used to anisotropically etch for etching through the programmable element, the transistor films and metallization layer 915. Adjacent fins are separated by trench 947 having a representative width in an x-direction, wt, on the order of 40 nm. Following the definition of the fins, trenches 947 are filled with dielectric material 945 such as silicon dioxide or a low-k dielectric material (block 1045, FIG. 48).

Figure 40:
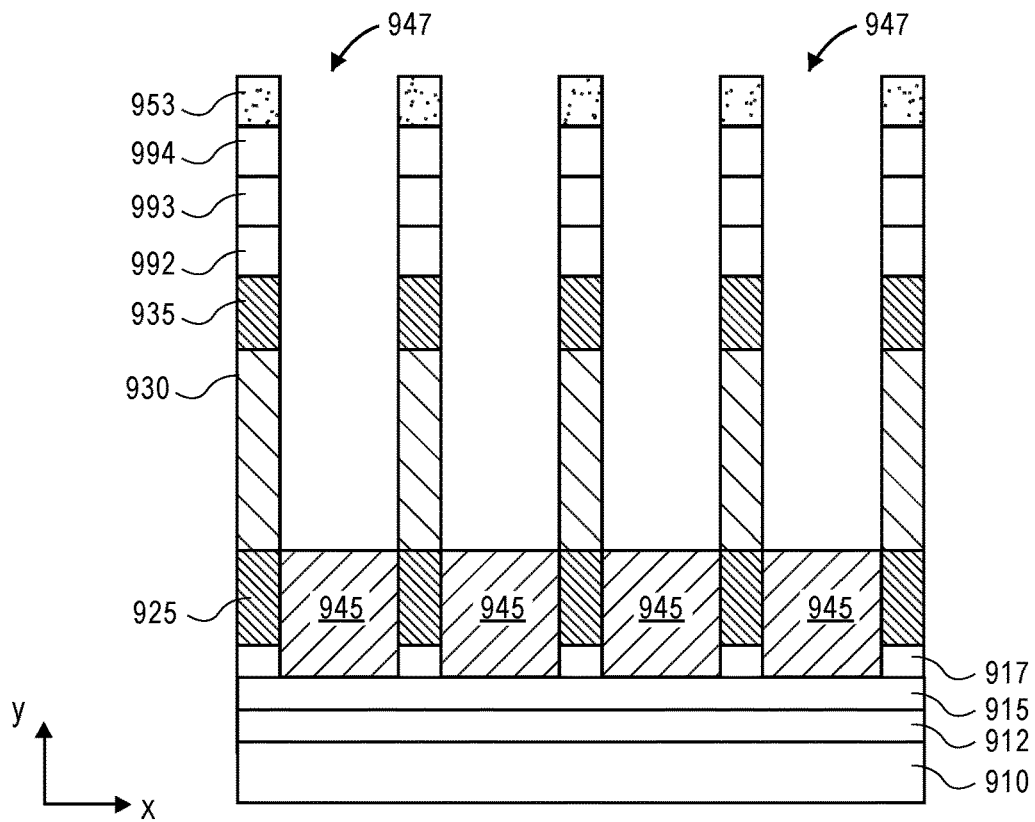
FIG. 40 shows the structure of FIG. 39 following a recessing of a dielectric material in each trench to a height of the first diffusion region material film to expose an entire length dimension of the channel material film.

FIG. 40 shows the structure of FIG. 39 following a recessing of dielectric material 945 in each trench 947 to a height of film 925 to expose an entire length dimension of film 930 (block 1050, FIG. 48). In one embodiment, such recessing may be done by retaining mask 933 and etching the dielectric material using, for example, a timed etch.

Figure 41:
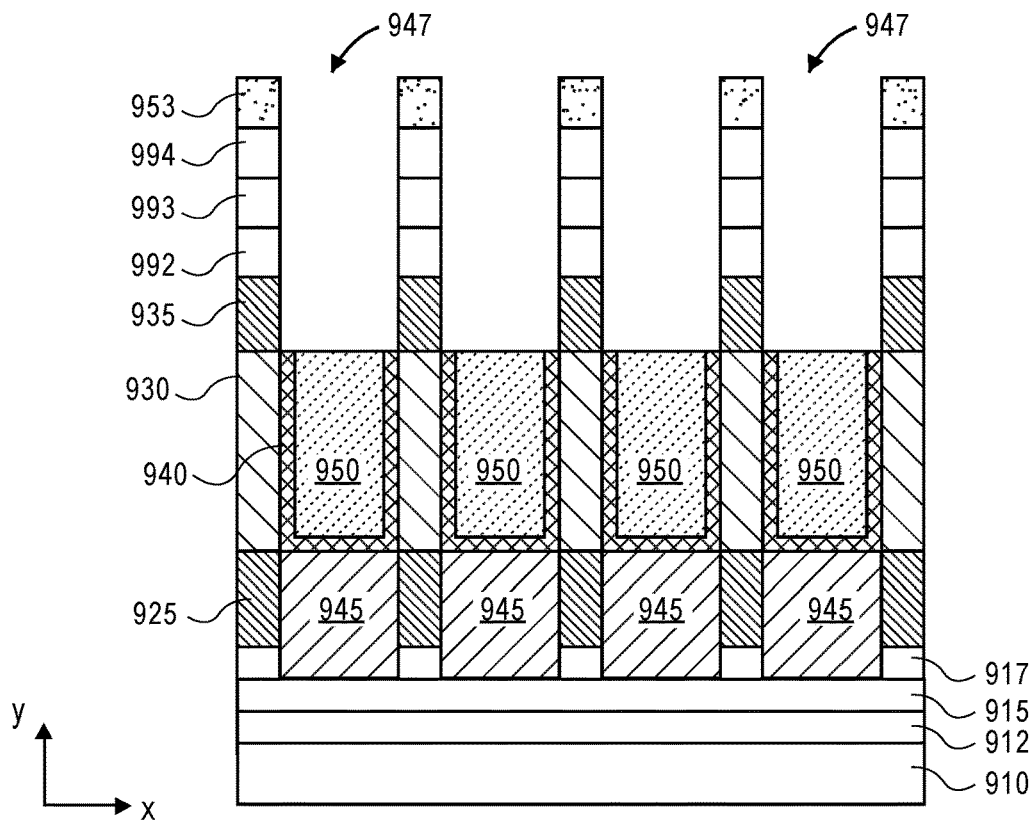
FIG. 41 shows the structure of FIG. 40 following the introduction of a gate stack in the trenches of the structure.

FIG. 41 shows the structure of FIG. 40 following the introduction of a gate stack in the trenches of the structure. Initially, a gate dielectric material is introduced (block 1055 FIG. 48). Gate dielectric 940 is, for example, silicon dioxide or a high-k dielectric material or a mixture of silicon dioxide and a high-k material or materials. As shown in FIG. 41, gate dielectric material 940 is introduced by, for example, a CVD process to a thickness on the order of few nanometers in a manner that it conforms to the sidewalls of each trench 947 and a superior surface of dielectric layer 945. After forming gate dielectric 940, gate electrode 950 is formed in the trenches (block 1060, FIG. 48). Representative materials for gate electrode 950 include, but are not limited to, tungsten, tantalum, titanium or a nitride, a metal alloy, silicide or another material. In one embodiment, gate electrode 950 may be introduced by a CVD or other deposition process. In one embodiment, a material for gate electrode 950 and for a gate dielectric 940 is introduced to a height of film 930.

Figure 42:
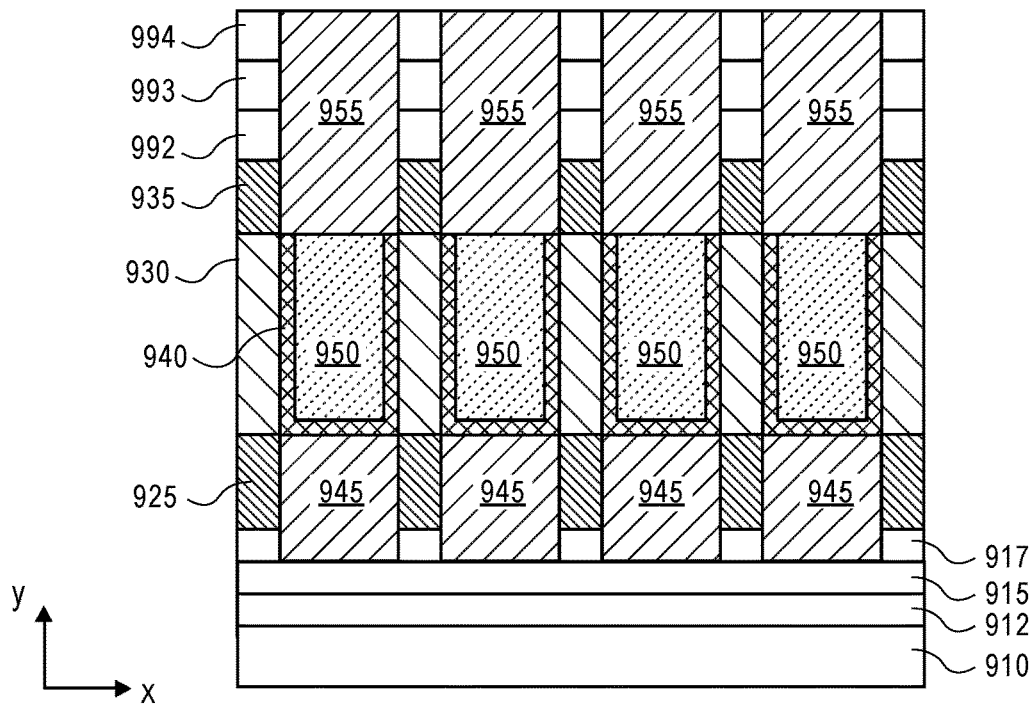
FIG. 42 shows the structure of FIG. 41 following the removal of the hard mask and the filling of the trenches with dielectric material.

FIG. 42 shows the structure of FIG. 41 following the removal of the hard mask and the filling of trenches 947 with dielectric material. Hard mask 933 may be removed by an etch process and dielectric material 955 of, for example, SiO2 or a low-k dielectric material may be introduced in trenches 947 by a CVD process to fill the trenches. Following the introduction of dielectric layer 955, a surface of the structure (a top or superior surface as viewed) may be polished by, for example, a chemical-mechanical polish to planarize the structure.

Figure 43:
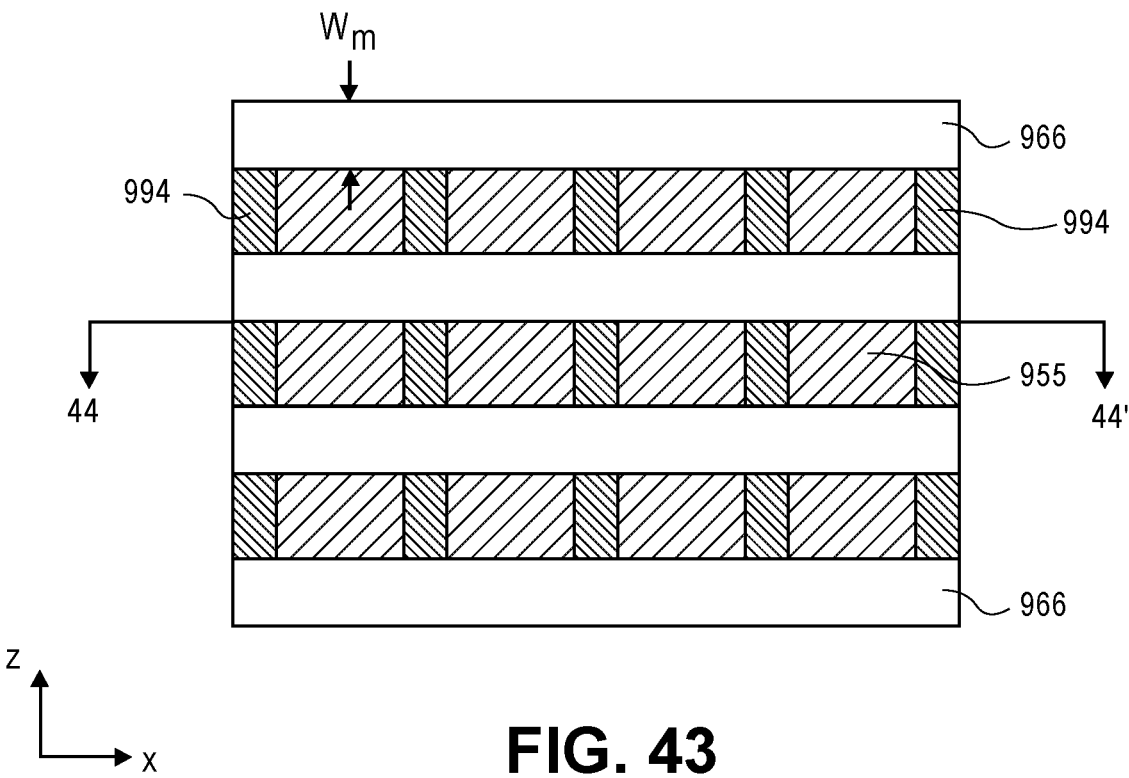
FIG. 43 shows a top view of the structure of FIG. 42 following patterning of a mask generally perpendicular to a direction of the fins.
Figure 44:
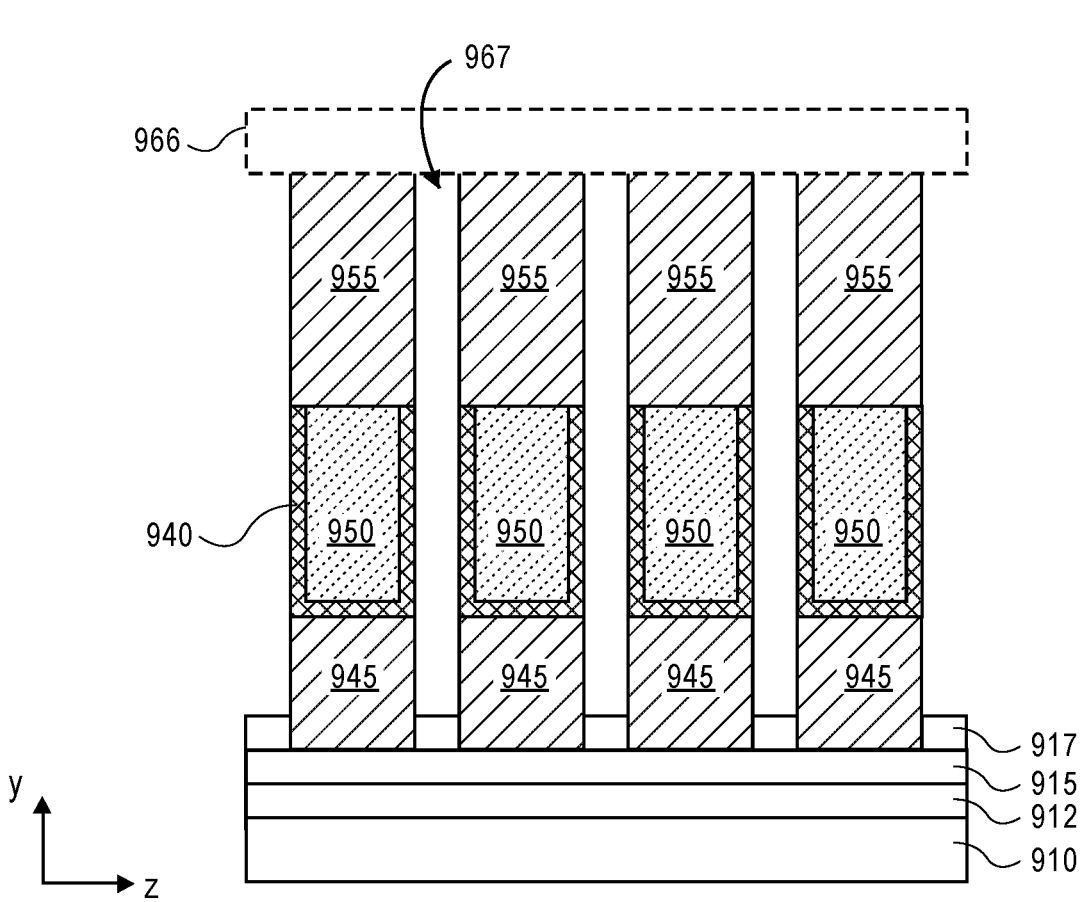
FIG. 44 shows the structure of FIG. 43 through line 44-44' to show a yz-dimension following the formation of trenches through the fins in areas of the fins that are not protected by a mask.

FIG. 43 shows a top view of the structure of FIG. 42 following patterning of a masking material generally perpendicular to a direction of the fins (a transverse direction across the structure in an area for the array). A width, wm, of mask 966 is selected to define a z-dimension thickness or width of individual fins of transistor bodies and memory elements in a representative column. A representative width is on order of 20 nm to 500 nm (e.g., 50 nm to 100 nm). One suitable material for mask 966 is a silicon nitride material. FIG. 44 shows the structure of FIG. 43 through line 44-44' to show a yz-dimension following the formation of trenches through the fins in areas of the fins that are not protected by mask 966 (block 1070, FIG. 48). In one embodiment, trenches 967 are formed by anisotropically etching a portion of the memory element (top electrode 994, dielectric layer 993, bottom electrode 992), the transistor (film 935, film 930 and film 925). Such etch may be a combination of etches with the etch or etches selective to the noted materials and to not etch a material of dielectric material 955 and for a material of metallization 917. In this manner, the etch or etches does/do not significantly etch dielectric material 955 above each gate stack or metallization 917.

Figure 45:
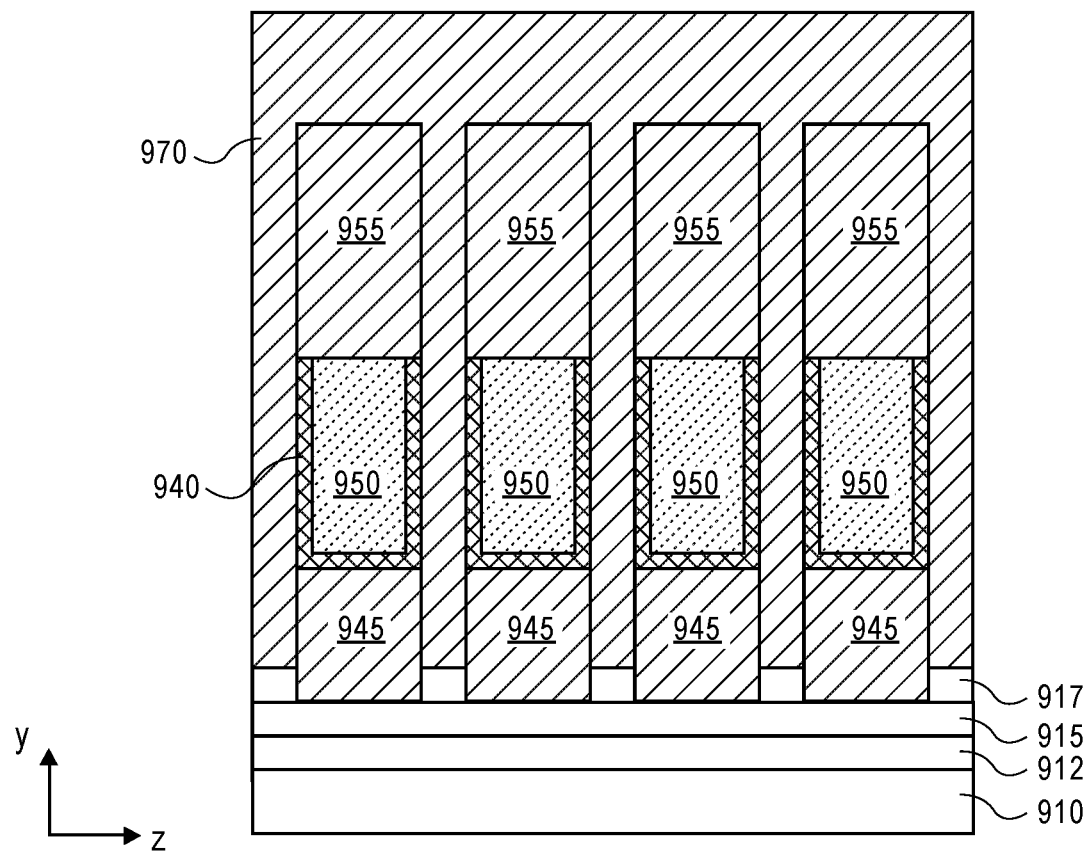
FIG. 45 shows the structure of FIG. 44 following the deposition of a dielectric material in the trenches.
Figure 46:
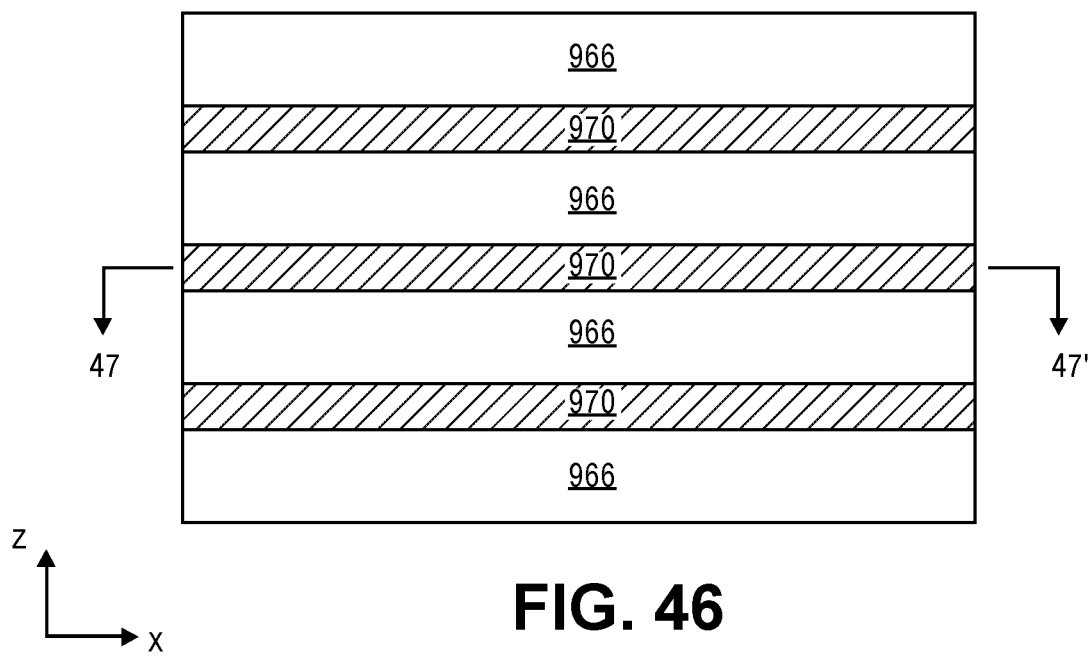
FIG. 46 shows a top view of the structure of FIG. 45.

FIG. 45 shows the structure of FIG. 44 following the deposition of dielectric material 970 in trenches 967 (block 1075, FIG. 48). A representative material for dielectric material 970 is SiO2 or a low-k dielectric material that may be deposited by a CVD process. In this embodiment, dielectric material 970 is deposited to at least a height of mask 966. FIG. 46 shows a top view of the structure of FIG. 45. Once dielectric material 970 is deposited, the structure may be planarized by, for example, a polish. Following the deposition and optional planarization of dielectric material 970, mask 966 is removed by, for example, an etch and replaced with electrically conductive material such as a metallization metal (e.g., copper) (block 1080, FIG. 48).

Figure 47:
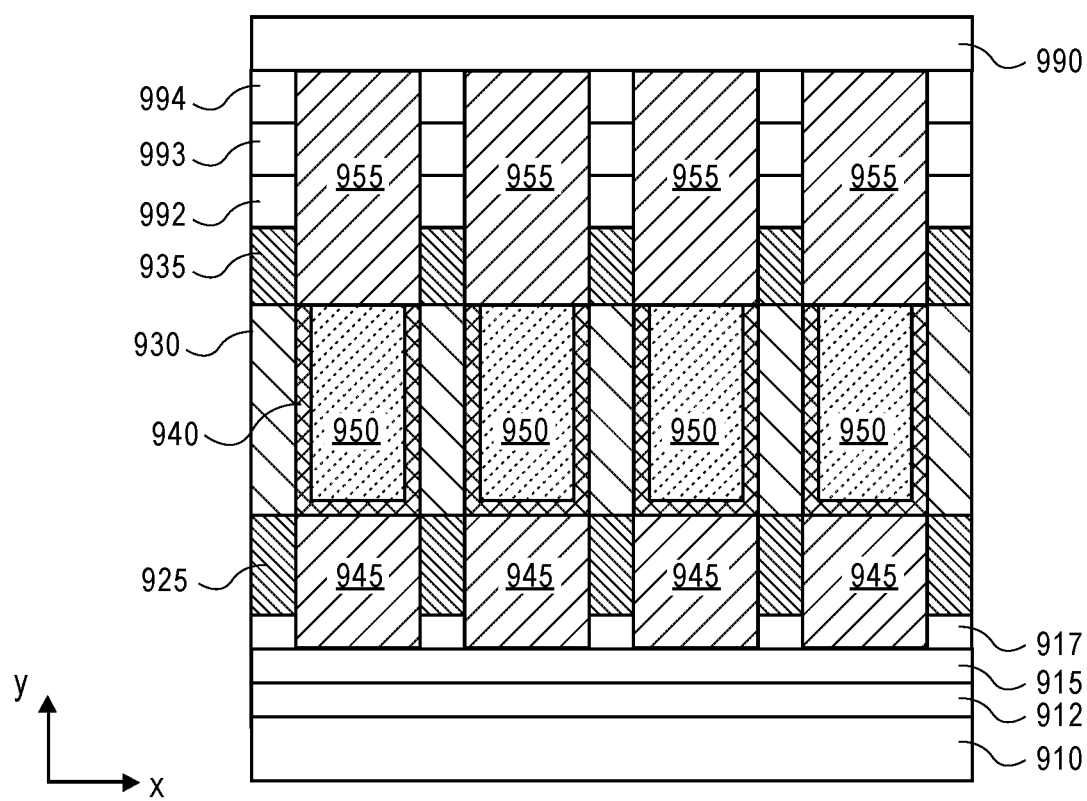
FIG. 47 shows the structure of FIG. 46 through line 47-47' after the replacement of the mask with an electrically conductive material.
Figure 48:
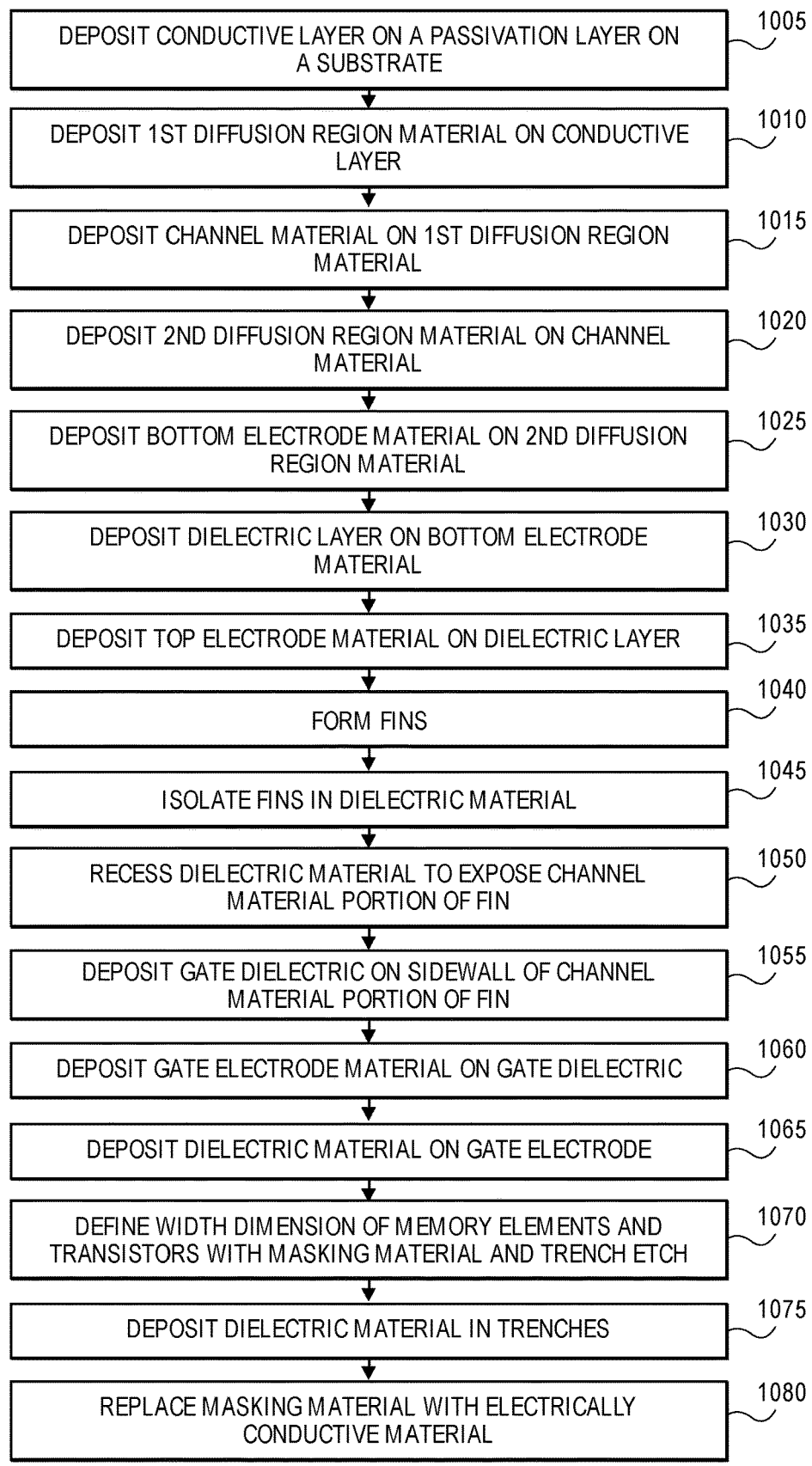
FIG. 48 is a flow chart of the method of FIGS. 38-47.

FIG. 47 shows the structure of FIG. 46 through line 47-47' after the replacement of mask 966 with electrically conductive material 990. FIG. 47 shows electrically conductive material 990 physically connected to top electrode 994 of each memory element in a row (five memory elements). Conductive material 990 may serve as an address line (e.g., a bit line) as described above with respect to FIGS. 36 and 37. The structure shown in FIG. 47 is similar to that described above with respect to FIGS. 36 and 37. As described, the memory element (e.g., RRAM or MRAM) is self-aligned to a superior surface of the vertical transistor (self-aligned to second diffusion region 935). According to this method, a technique for word line, bit line and memory element to self-alignment is provided. The self-alignment reduces the cell area required for a 1T-1R cell and makes such cells more scalable. The address lines of conductive material 990 may be subsequently connected to a bit line driver and gate electrodes 950 connected to a word line driver.

Figure 49:
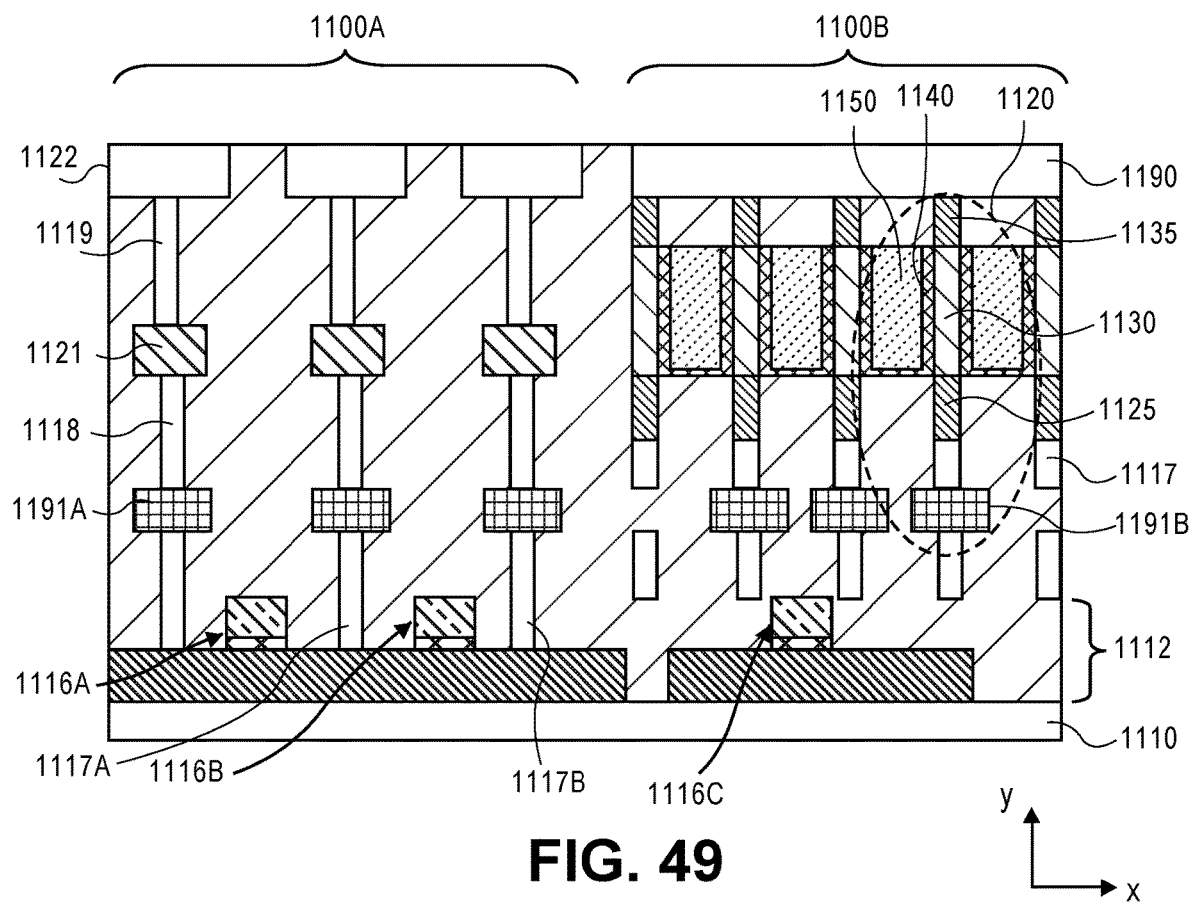
FIG. 49 shows a cross-sectional side view of a portion of an integrated circuit device or chip that includes two forms of memory that may be cointegrated in one process.

The ability to implement self-aligned and scaled non-volatile memory utilizing vertical access transistors as described allows the cointegration or coupling of such memory with other memory technology such as main cache memory, typically static random access memory (SRAM). Current embedded non-volatile memory (e.g., embedded flash, RRAM) generally utilizes a different process technology than the main cache memory (e.g., SRAM). Because of the different process technologies, the two forms of memory would generally be decoupled to the extent both forms were incorporated into a integrated circuit chip. FIG. 49 shows a cross-sectional side view of a portion of an integrated circuit device or chip that includes two forms of memory that may be cointegrated in one process. More specifically, FIG. 49 shows an illustration of SRAM-like cache memory and embedded non-volatile memory (eNVM) where the eNVM utilizes thin film vertical access transistors built above memory elements (e.g., MRAM or RRAM). Each memory utilizes 1T-1R cells that may be produced together in similar process operations collapsing the memory element integration into such single process operations.

Referring to FIG. 49, the assembly includes two memory arrays formed on an integrated circuit device or chip. The integrated circuit device includes substrate 1110 that, in one embodiment, is a semiconductor substrate such as a bulk semiconductor (e.g., silicon) or a SOI structure. Substrate 1110 may be less than an entire portion of the chip substrate. Disposed on substrate 1110, in this example, is device layer 1112 that may include a large number of devices. FIG. 49 representatively shows transistor devices 1116A, 1116B and 1116C.

Figure 50:
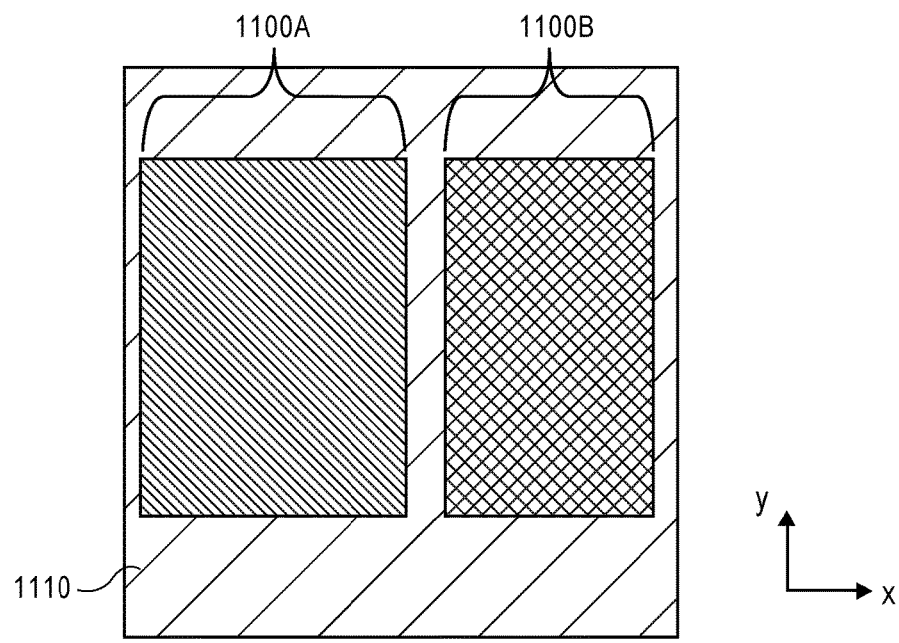
FIG. 50 is a representative top view of the structure of FIG. 49 and illustrates the memory arrays in the different areas.

Referring to FIG. 49, the portion of substrate 1110 illustrated may be defined by two areas. FIG. 49 shows memory array 1100A in a first area and memory array 1100B in a second area. FIG. 50 is a representative top view of the structure of FIG. 49 and illustrates the memory arrays in the different areas. Memory array 1100A, in one embodiment, is made up of 1T-1R cells and represents, for example, an SRAM memory array with access transistors formed in device level 1112 of substrate 1110. Memory array 1100B is an eNVM array including thin film vertical access transistors formed in BEOL fabrication. Thus, in one embodiment, memory array 1100A includes memory elements formed above the access transistors and memory array 1100B has access transistors formed above the memory elements. In one embodiment, the memory elements for each of the each of memory array 1100A and memory array 1100B are produced in the same process steps. FIG. 49 shows programmable elements (memory elements) 1191A formed above or on device level 1112 in memory array 1100A and programmable elements 1191B formed at approximately the same level above device level 1112 in memory array 1100B. In this embodiment, programmable elements 1191A and 1191B, as shown in FIG. 49, are formed following FEOL fabrication and prior to metallization. In one embodiment, programmable elements 1191A and 1191B are similar. In one embodiment, programmable elements utilize non-volatile spin torque transfer (STT)-RAM. Each programmable element includes a fixed ferromagnetic layer or electrode and a free ferromagnetic layer or electrode with a tunneling oxide therebetween. In array 1100A, programmable elements 1191A are connected to access transistors in device level 1112 (e.g., multi-gate transistors) by trench contact 1117B between a drain of a transistor device (e.g., transistor device 1116B) and one of programmable elements 1191A. The programmable elements 1191A are connected to an address line (e.g., a bit line) at metallization layer 1121 (e.g., M1) through condutive via 1118. Word lines are formed through connections to gate electrodes of device level transistors. FIG. 49 also shows second level metallization layer 1122 (e.g., M2) in area 1100A and conductive vias 1119 between metallization layer 1121 and 1122.

FIG. 49 shows that access transistors in array 1100B are disposed above programmable elements 1191B and are connected to the programmable elements through respective diffusion regions of each access transistor. FIG. 49 shows five representative memory cells aligned in a row in an x-dimension. Memory cell 1120 is representative of the memory cells in memory array 1100B. Memory cell 1120 includes programmable element 1191B and an access transistor connected thereto, the access transistor including first diffusion region 1125, channel 1130 and second diffusion region 1135 disposed as a vertical stack or projection (one on the other) as viewed on first diffusion region 1125 with channel 1130 between the diffusion regions. Offset from channel 1130 is gate stack including gate dielectric 1140 and gate electrode 1150. In one embodiment, the gate electrode is an indivisible body and extends through the array in a z-dimension (into the page) and, in in such manner, is connected to all the channels of transistor bodies in a representative column of the array with the gate electrode serving as a word line for memory array 1100B.

In one embodiment, the access transistors of memory array 1100B are formed in an area between metallization layers such as between progammable elements 1191B and metallization layer 1122 (M2). FIG. 49 shows memory array 1100B including address line 1190 that may be metal material such as copper that may be part of a metallization layer (e.g., M2) connected to second diffusion region 1135 of each of the five transistors in a representative row of the array. In one embodiment, first diffusion regions (first diffusion region 1125) of each transistor is connected to programmable element 1191B through a metal contact of, for example, copper.

Figure 51:
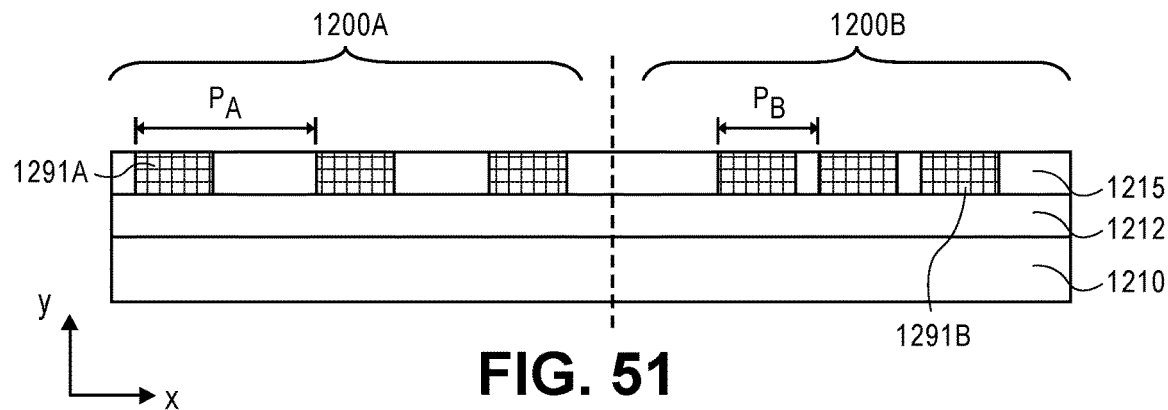
FIG. 51 shows a cross-sectional side view of a substrate including a device layer, a passivation layer on the device layer and programmable elements on the passivation layer in two different areas of the substrate.

FIGS. 51-60 describe a method of forming an integrated circuit device cointegrating two memory arrays such as cache and eNVM using a single memory technology. FIG. 61 is a flow chart of the method. A formation process using n-type FETs as access transistors is representatively described. Referring to FIG. 51 and with reference to FIG. 61, the process begins in this example following FEOL fabrication such as the forming of transistors and possible other devices on a substrate, the passivating of such devices and the formation of contacts to such devices. FIG. 51 shows substrate 1210 of a material that may serve as a foundation on which memory arrays may be constructed. Representatively, substrate 1210 is a portion of a larger substrate such as a wafer. Substrate 1210, in one embodiment, is a bulk semiconductor material such as a single crystal silicon or an SOI structure. Disposed on a surface of substrate 1210 (a top surface as viewed) is device layer 1212 of, for example, a number of transistor devices. Overlying device layer 1212 is passivation layer 1215 such as a SiO2 layer or a low-k dielectric material layer.

In the embodiment shown in FIG. 51, the structure including substrate 1210 and device layer 1212 is representatively partitioned into two areas where two different memory arrays are to be formed. FIG. 51 shows area 1200A on the left side of the illustration and area 1200B on the right side of the illustration. FIG. 51 also shows programmable elements formed in passivation layer 1215 (block 1305, FIG. 61). In one embodiment, the programmable elements are STT memory elements each including a fixed electrode and a free electrode with the electrodes separated by a tunnel oxide. FIG. 51 shows programmable elements 1291A formed in area 1200A and programmable elements 1291B formed in area 1200B. Programmable elements 1291A and 1291B may be formed at the same time using similar fabrication techniques. In one embodiment, the memory array to be formed in area 1200A is similar to conventional SRAM-like utilizing 1T-1R memory cells with the programmable elements (memory elements) connected to access transistors in device layer 1212 (below programmable elements 1291A) through, for example, trench contacts as known in the art. FIG. 51 does not show the connection to the devices. For that, reference is made to FIG. 49. In this embodiment, the memory array to be formed in area 1200B is an eNVM array utilizing thin fin vertical access transistors formed in BEOL fabrication. Accordingly, in area 1200B, programmable elements 1291B will be connected to vertical FETs (access transistors) above programmable elements 1291B (as viewed).

FIG. 51 shows programmable elements 1291A having a pitch, pA, and programmable elements 1291B having a pitch, pB. In one embodiment, pB is less than pA. The process described above and herein utilizing thin film vertical transistors is scalable and allows pB to be smaller than pA of a conventional cache memory. Therefore, memory area 1200B may consume less chip area.

Figure 52:
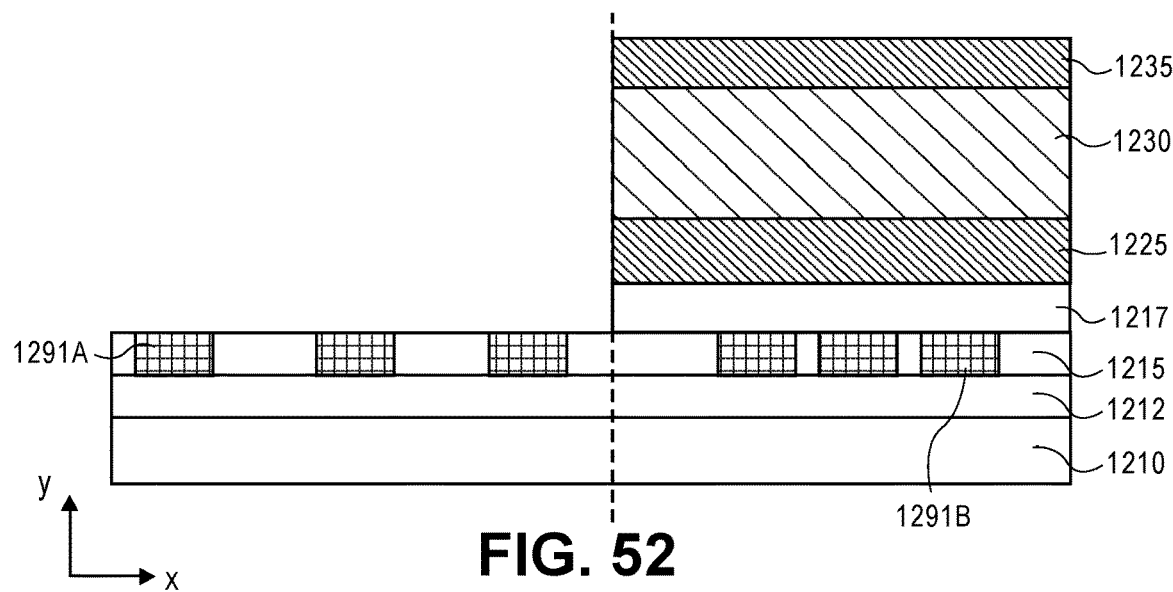
FIG. 52 shows the structure of FIG. 51 following the formation of transistor device films in one of the two areas of the substrate.

FIG. 52 shows the structure of FIG. 51 following the formation of a contact layer and transistor device layer films in area 1200B. At this point, area 1200A may optionally be masked. FIG. 51 shows contact layer 1217 of a metal such as tungsten deposited on dielectric layer 1215 and in contact with programmable elements 1291B. In one embodiment, contact material 1217 of tungsten may be deposited to a thickness on the order of 5 nm to 20 nm by CVD (block 1310, FIG. 61). Contact layer 1217 may be deposited over area 1200B.

Overlying contact layer 1217 in the illustration chart of FIG. 52, is first diffusion region material 1225 of, for example, an n-doped (n+) seminconductor material such as silicon (block 1315, FIG. 61). In one embodiment, film 1225 is epitaxially grown or deposited to a representative thickness on the order of 25 nm as a first diffusion region cell. Overlying film 1230 for a channel of a transistor (block 1320, FIG. 61). In one embodiment, film 1230 is an n-doped or lightly doped semiconductor material (silicon) that has a representative thickness on the order of 75 nm. Disposed on film 1230 is film 1235 as a second diffusion region material (block 1325, FIG. 61). Film 1235 is, for example, an amorphous or crystalline semiconductor film similar to film 1225 that is also an n-doped and may be epitaxially grown or deposited to the representative thickness on the order of 25 nm as the second diffusion region film.

Figure 53:
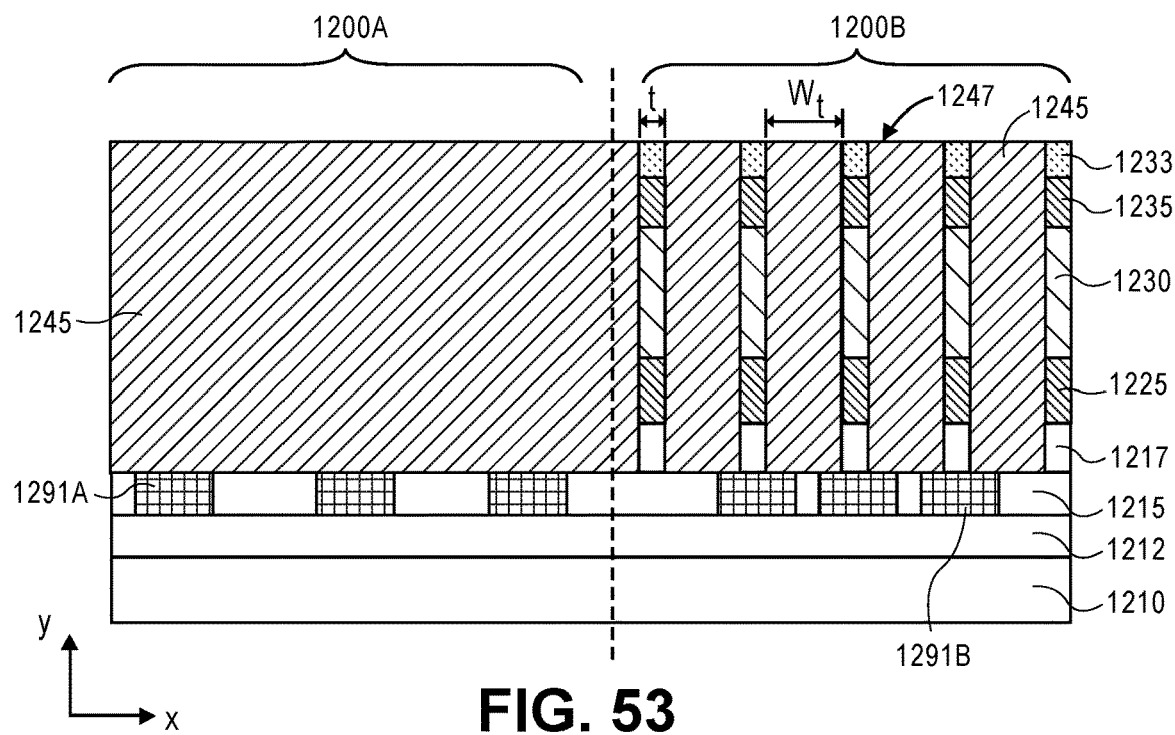
FIG. 53 shows the structure of FIG. 52 following the patterning of a hard mask on the transistor device films and definition of fins in the transistor device films and isolating the fins with dielectric materials in trenches between fins.

FIG. 53 shows the structure of FIG. 52 following the definition of fin structures in the films and contact layer in area 1200B of the structure (block 1330, FIG. 61). FIG. 53 representatively shows five fins formed in area 1200B. The fins may be formed by a mask and etch process where mask 1233 (e.g., a hard mask of, for example, silicon nitride) is introduced on a surface of film 1235 to protect areas of the film and underlying layers of films where the fins are to be defined and provide openings to non-fin areas. Once mask 1233 is patterned, the structure may be anisotropically etched to remove material in unprotected areas of area 1200B. As shown in FIG. 53, in one embodiment, the etch proceeds through each of film 1235, film 1230 and film 1225 as well as through contact layer 1217 but does not etch dielectric layer 1215. In one embodiment, each of the five fins has a thickness dimension, t, on the order of 10 nm. Adjacent fins are separated by trench 1247 having a representative width in an x-direction, wt, on the order of 40 nm. Following the definition of the fins, trenches 1247 are filled with dielectric material 1245, such as silicon dioxide or a low-k dielectric material. In one embodiment, the deposition of dielectric material 1245 is performed to both area 1200B (to isolate the fins) and in area 1200A (block 1335, FIG. 61).

Figure 54:
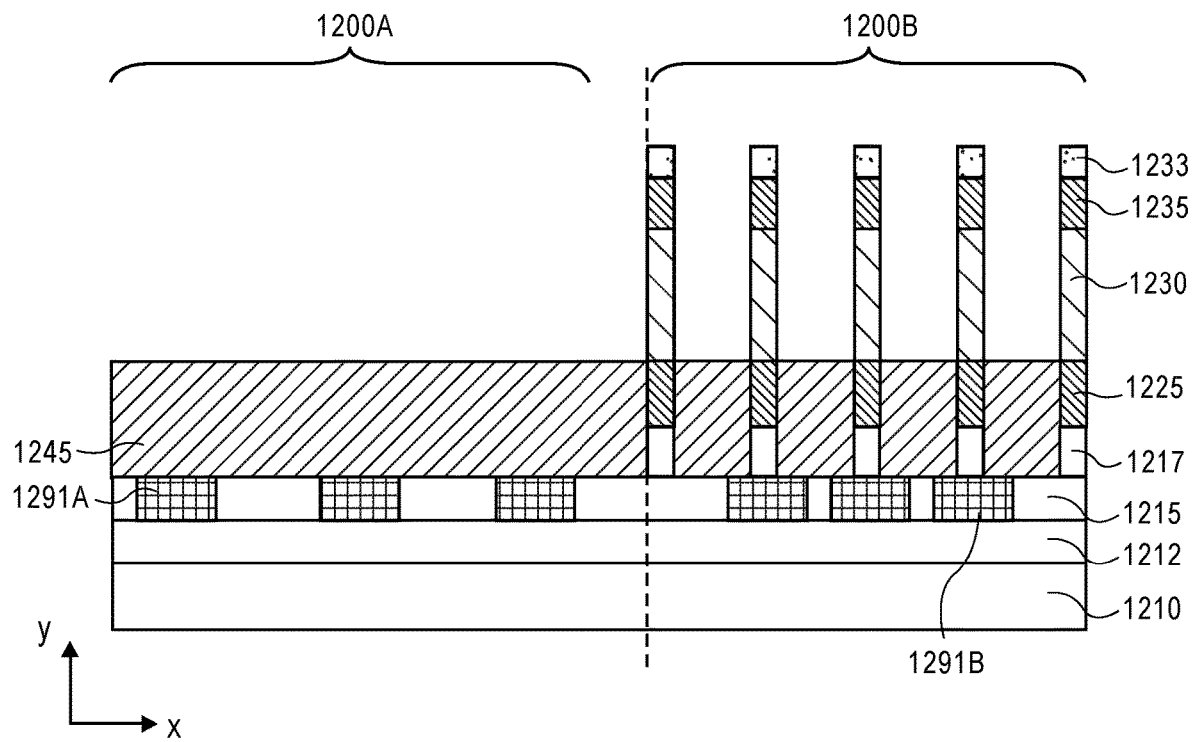
FIG. 54 shows the structure of FIG. 53 following a recessing of the dielectric layer in each trench to a height of the first diffusion region material and film to expose an entire length dimension of a channel material film of each of the fins.

FIG. 54 shows the structure of FIG. 53 following a recessing of dielectric layer 1245 in each trench 1247 to a height of film 1225 to expose an entire length dimension of film 1230 (block 1340, FIG. 61). The recessing proceeds both in area 1200B as well as in area 1200A. In area 1200A, the height of dielectric layer 1245 on the substrate establishes a location for a metallization layer (e.g., M1).

Figure 55:
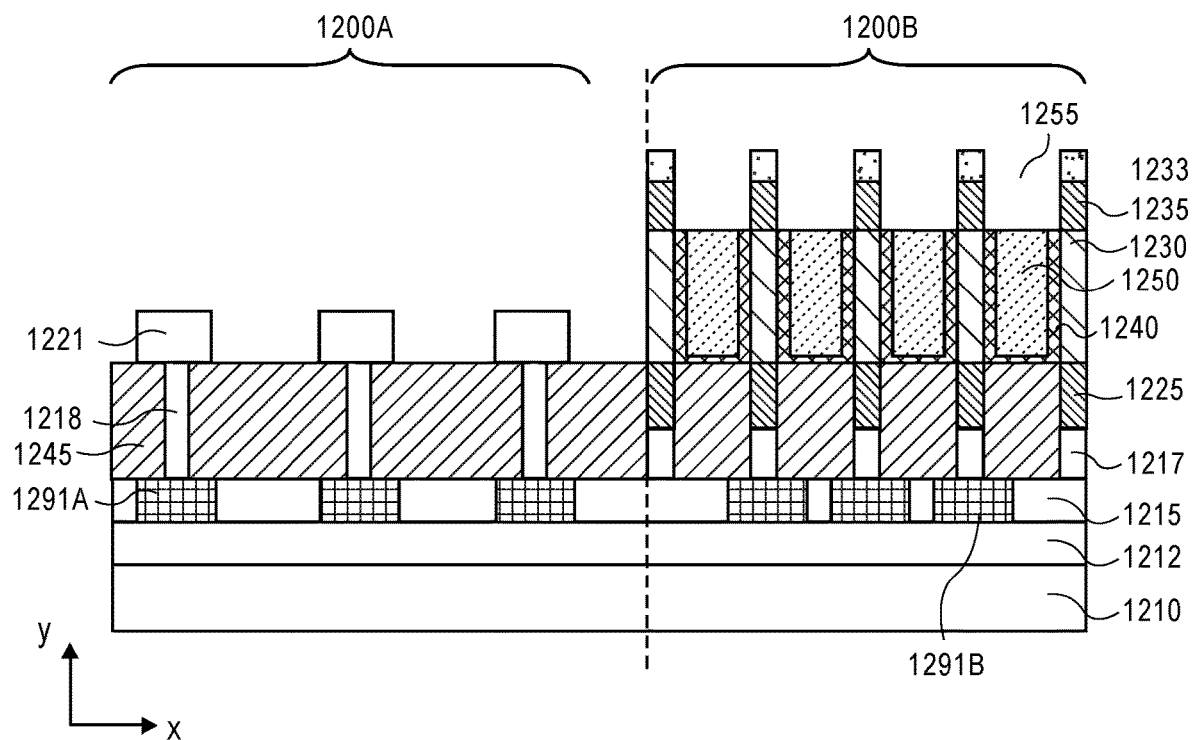
FIG. 55 shows the structure of FIG. 54 following the deposition of a metallization layer in a second area of the substrate and gate stacks on the fins in the first area.

FIG. 55 shows the structure of FIG. 54 following the deposition of a metallization layer in area 1200A and gate stacks on the fins in area 1200B. In area 1200A, conductive vias 1218 are formed to respective prommable elements 1291A and metal lines 1221 are formed according to conventional processes (block 1345, FIG. 61). FIG. 55 shows a gate stack in each of trenches 1247 in area 1200B (block 1350, FIG. 61). Initially, a gate dielectric material such as silicon dioxide or a high-k dielectric material or a mixture of silicon dioxide and a high-k material or materials is introduced by, for example, a deposition process to a thickness on the order of two nm in a manner that it conforms to the sidewalls of trench 1247 (a sidewall of film 1230). After forming gate dielectric 1240, gate electrode 1250 is formed in the trenches. Representative materials for gate electrode 1250 include, but are not limited to, tungsten, tantalum, titanium or a nitride, a metal alloy, silicide or another material. In one embodiment, gate electrode may be introduced by a CVD or PVD process. As shown, a material for gate electrode 1250 and gate dielectric 1240 are each introduced to a height of film 1230.

Figure 56:
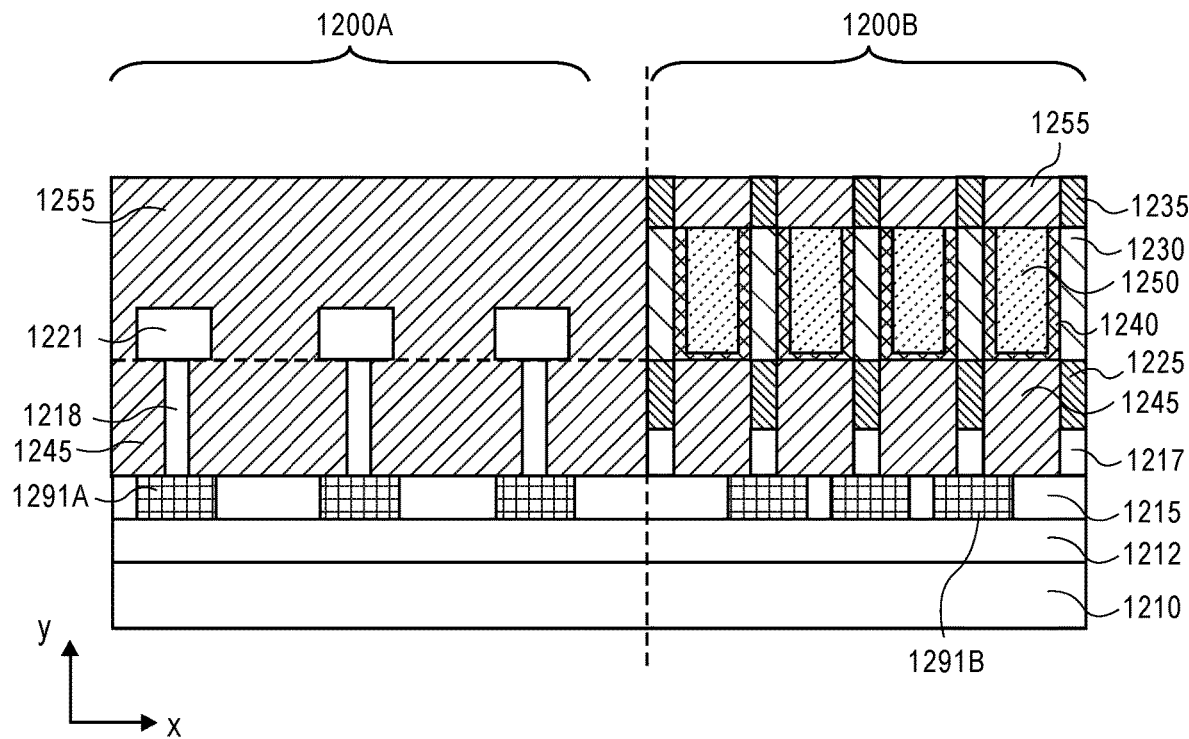
FIG. 56 shows the structure of FIG. 55 following a removal of the hard mask and filling the trenches in the first area with a dielectric material.

FIG. 56 shows the structure of FIG. 55 following a removal of hard mask 1233 in area 1200B and the filling of trenches 1247 with dielectric material (block 1355, FIG. 61). Hard mask 1233 may be removed by an etch process. Dielectric material 1255 of, for example, silicon dioxide, a low-k dielectric material may then be introduced into trenches 1247 by, for example, a CVD process. Dielectric material 1255, in one embodiment, is introduced in both area 1200A and area 1200B to a height of film 1235.

Figure 57:
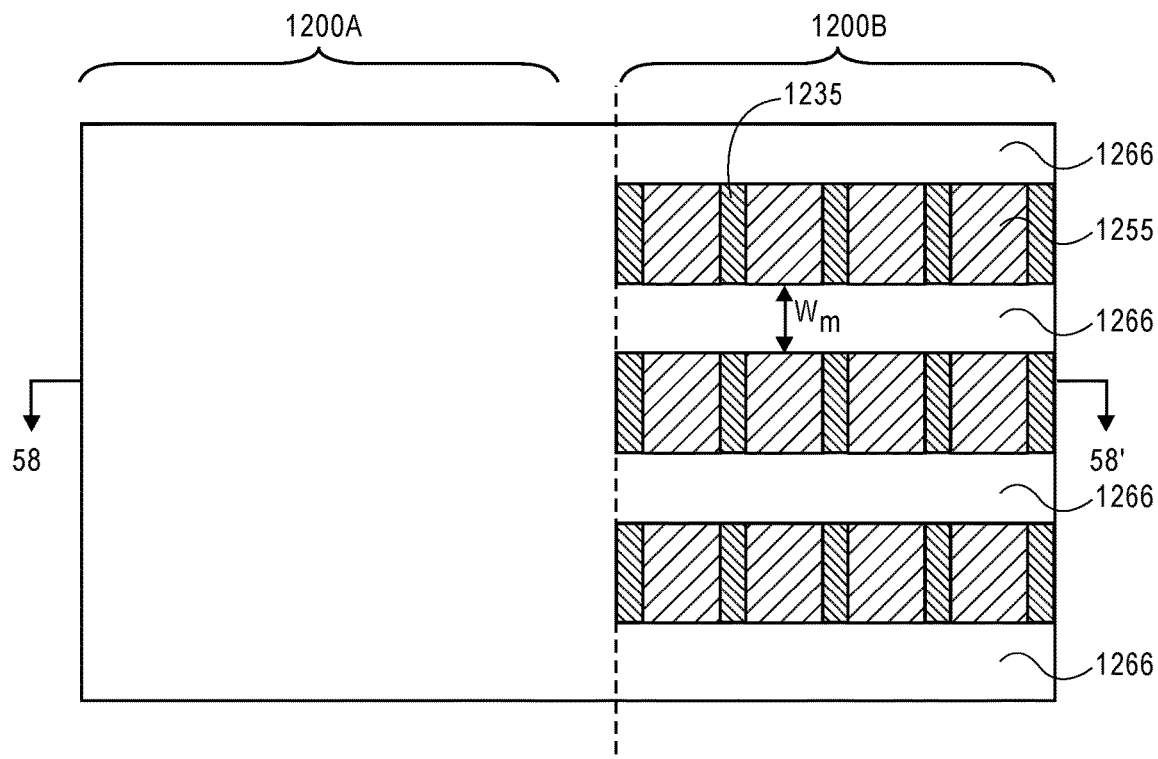
FIG. 57 shows a top view of the structure of FIG. 56 following the patterning of a masking material over the structure.

FIG. 57 shows a top view of the structure of FIG. 56 following the patterning of a masking material over the structure (block 1360, FIG. 61). In one embodiment, masking material 1266 is patterned to completely blanket or cover area 1200A and is patterned generally into lateral projections that are generally perpendicular to a direction of the fins (a transverse direction across the structure in area 1200B). A width, wm, of the lateral projection of mask 1266 is selected to define a z-dimension thickness or width of individual fin or transistor body in a representative column. A representative width is on the order of 20 nm to 500 nm (e.g., 50 nm to 100 nm). One suitable material from mask 1266 is a silicon nitride material that may be deposited by a CVD process.

Figure 58:
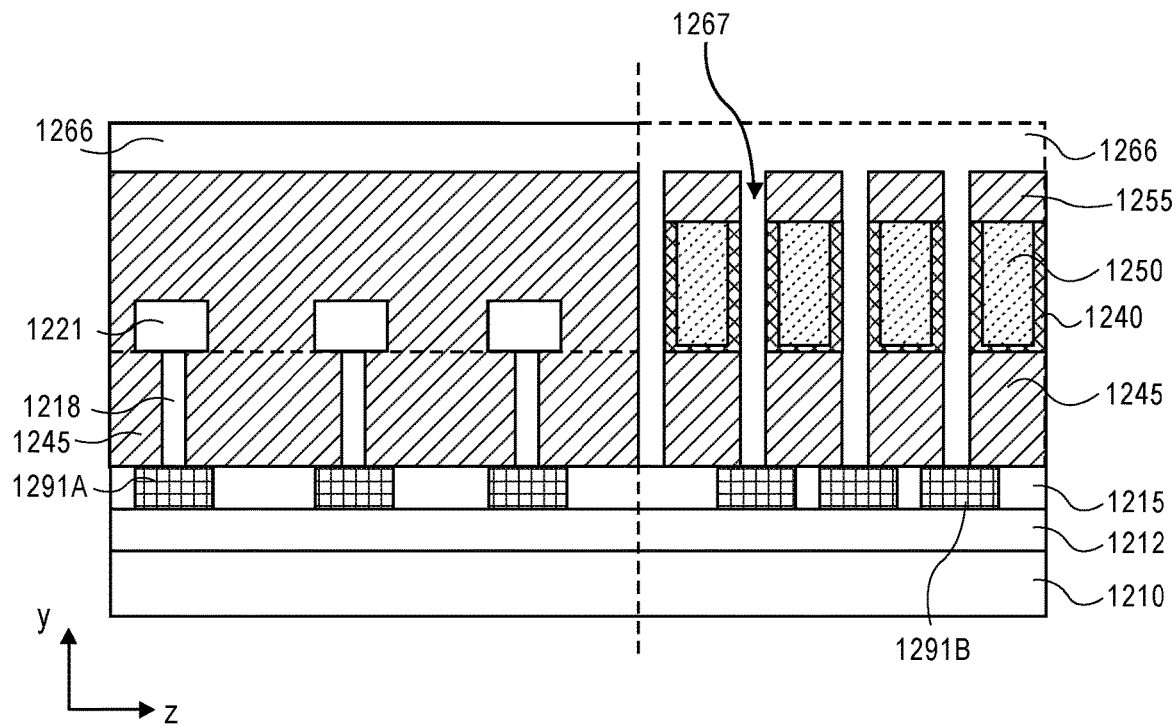
FIG. 58 shows the structure of FIG. 57 through line 58-58' to show a yz-dimension following the formation of trenches through the fins in areas of the fins that are not protected by a mask.

FIG. 58 shows the structure of FIG. 57 through line 58-58' to show a yz-dimension following the formation of trenches through the fins in areas of the fins that are not protected by mask 1266 (block 13265 FIG. 61). In one embodiment, trenches 1267 are formed by anisotropically etching a portion of film 1235, film 1230 and film 1225 and contact layer 1217. As shown in FIG. 58, the etch does not significantly etch dielectric material 1255 or dielectric material 1215.

Figure 59:
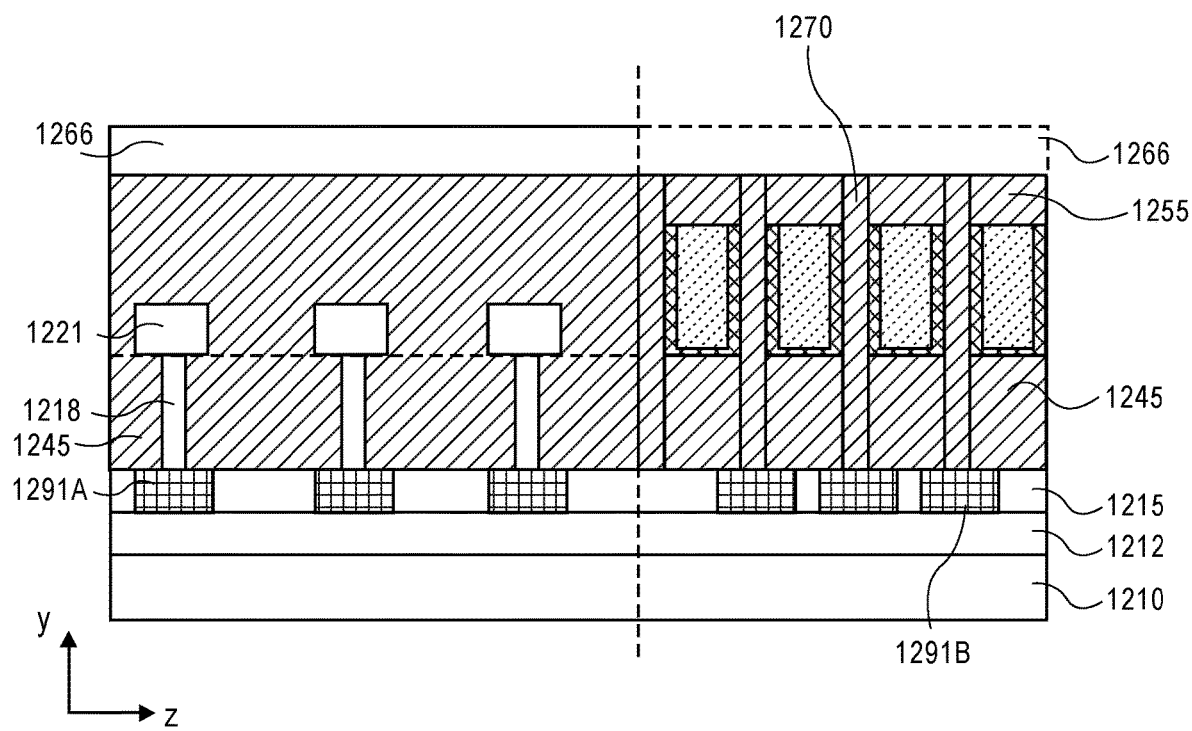
FIG. 59 shows the structure of FIG. 58 following the deposition of dielectric material in the trenches.

FIG. 59 shows the structure of FIG. 58 following the deposition of dielectric material in trenches 1267 (block 1370, FIG. 61). A representative material for dielectric material 1270 is SiO2 or a low-k dielectric material that may be deposited by a CVD process. In one embodiment, dielectric material may be deposited to a height of mask 1266.

Once dielectric material 1270 is deposited, the structure may be planarized by, for example, a polish.

Figure 60:
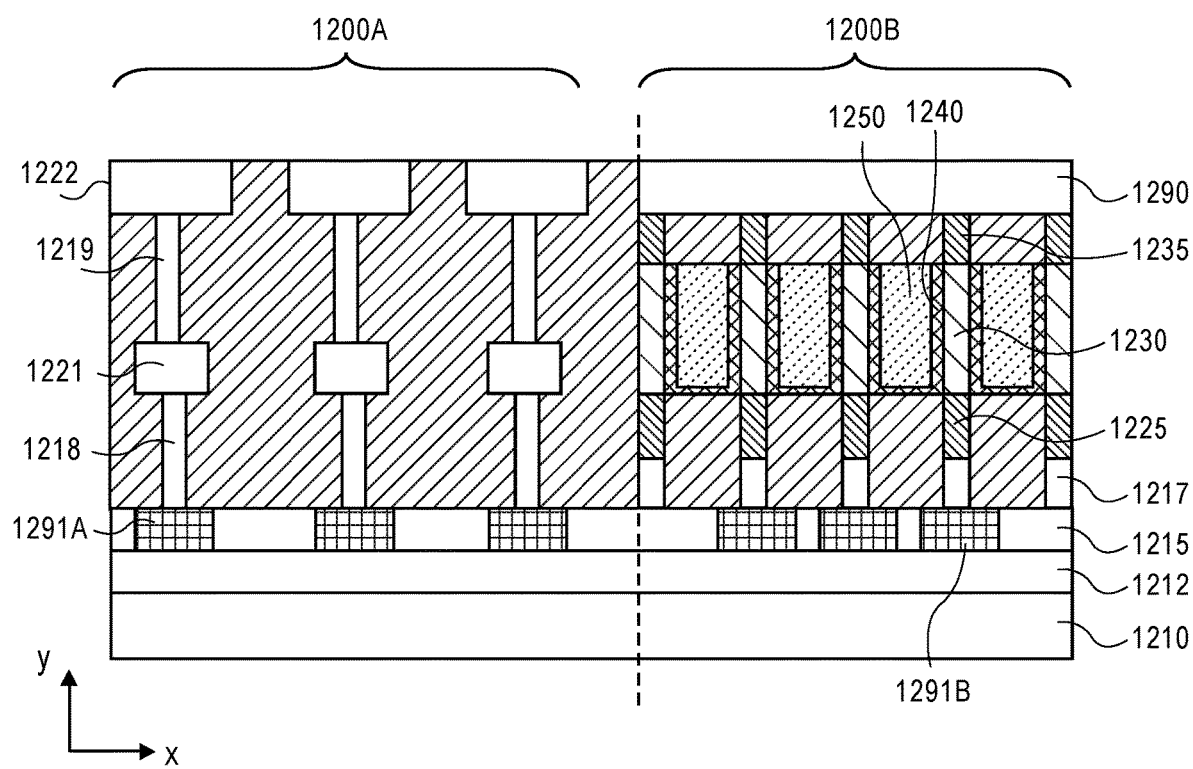
FIG. 60 shows an xy-dimension of the structure of FIG. 59 following a removal of the mask and formation of a metallization layer in each area.
Figure 61:
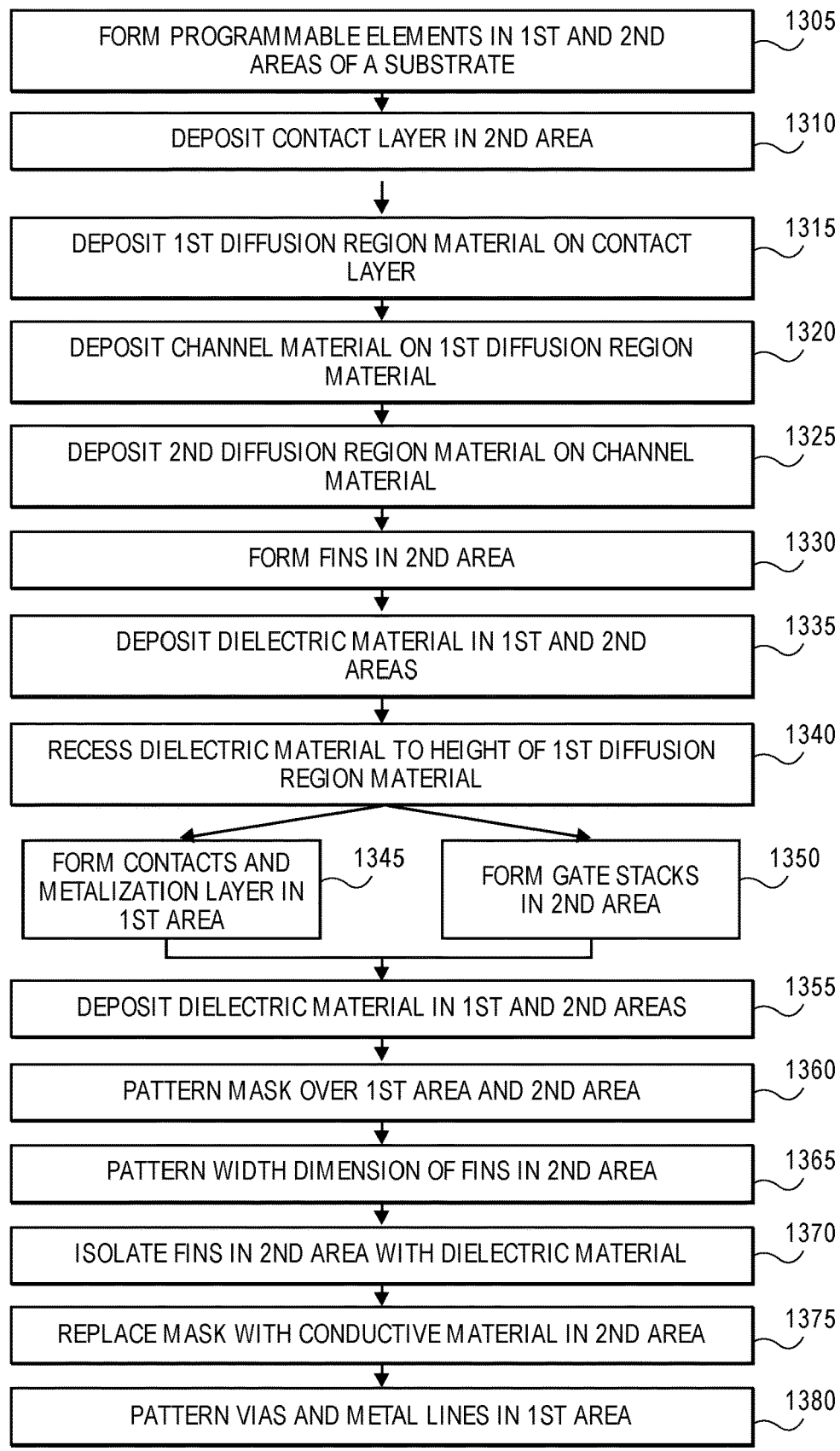
FIG. 61 is a flow chart of the method of FIGS. 51-60.

FIG. 60 shows an xy-dimension of the structure of FIG. 59 following the removal of the mask and the formation of a metallization layer in each area. In one embodiment, mask 1266 is removed by, for example, an etch and replaced with electrically conductive material such as a metallization metal (e.g., copper) (block 1375, FIG. 61). Metallization layer 1290 in second area 1200B serves as an address line (e.g., a bit line for the memory array formed in the area). Similarly, conductive vias 1219 and metallization layer 1222, metal lines at the same level as metallization layer 1290, may be formed in area 1200A (block 1380, FIG. 61). As illustrated, conductive vias 1219 connected to respective metal lines of metallization layer 1222 (e.g., M2) to underlying metallization layer 1221 (e.g., M1). In this embodiment, the metal lines of metallization layer 1221 may serve as an address line (e.g., a bit line) for the memory array in area 1200A. The address lines of metallization layer 1290 (bit lines) may be subsequently connected to a bit line driver and gate electrode 1250 connected to a word line driver associated with the memory array in area 1200B. Similarly, metal lines of metallization layer 1221 may be connected to a bit line driver and gate electrodes in device layer 1212 in area 1200A may be connected to a word line driver.

In another embodiment, the vertical FET architecture described herein may be used to form dynamic random access memory (DRAM). Conventional capacitor-based one transistor-one capacitor (1T-1C) DRAM memory generally uses conventional transistors in the 1T-1C cell. Conventional transistors, such as multi-gate or planar transistors take up a relatively large amount of cell area. Utilizing vertical FETs such as described herein as access transistors provided a much more scalable memory array that can be confined to a smaller chip area.

Figure 62:
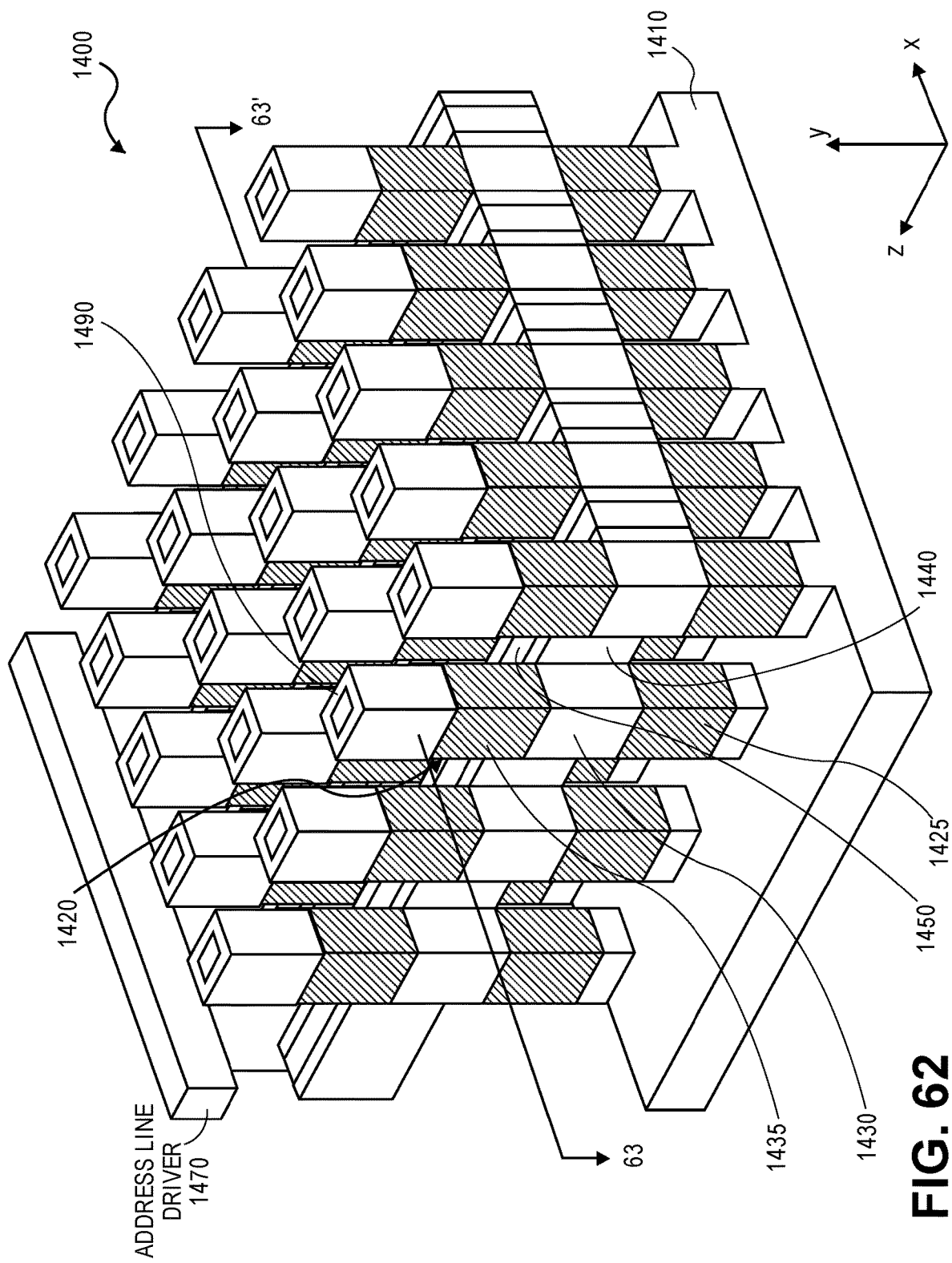
FIG. 62 shows a top perspective view of an embodiment of an array of DRAM memory cells each including a capacitor and a vertical FET as an access transistor.
Figure 63:
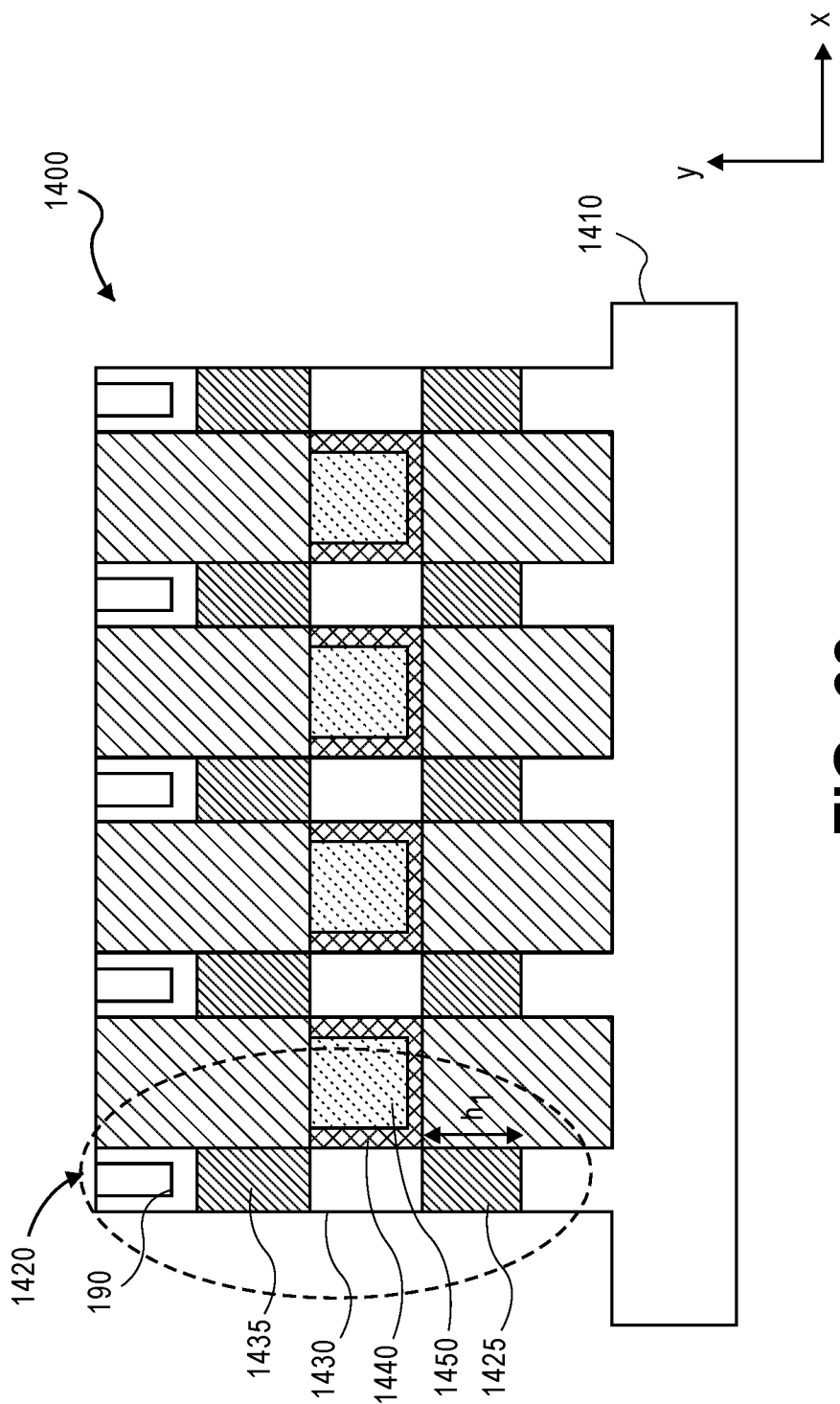
FIG. 63 shows the structure of FIG. 62 through line 63-63'.

FIG. 62 shows a top perspective view of an embodiment of an array of DRAM memory cells each including a capacitor and a vertical FET as an access transistor (a 1T-1C cell). Dielectric material that otherwise would surround each cell is not illustrated so that the array is visible. FIG. 63 shows the structure of FIG. 62 through line 63-63'. In this embodiment, each cell includes a programmable element (a capacitor) and an access transistor. Each access transistor includes diffusion regions (source/drain) and a conducting channel in a stacked arrangement (one on the other) above a base surface of a substrate at a transistor body. In the views shown, the transistor bodies or fins are projected vertically from a base surface of the substrate. A gate electrode is disposed on a side of the channel. In this embodiment, the transistors of each cell may be formed in a device level of an integrated circuit chip or die.

Referring to FIG. 62 and FIG. 63, device 1400 includes substrate 1410 that is, for example, a single crystal silicon semiconductor substrate such as a bulk silicon substrate or an SOI substrate. Substrate 1410, as viewed, may be less than an entire area of a chip substrate. Disposed on substrate 1410 are a number of transistor bodies or fins arranged in an array (five fins in an exemplary row in an x-dimension and four fins in an exemplary column in a z-dimension). Such bodies or fins may be formed directly on substrate 1410 or on a buffer or sub-fin layer that forms a base surface of the substrate.

FIG. 62 and FIG. 63 show cell 1420 that is representative of the other cells in the array. Cell 1420 includes a vertically projecting body or fin including first diffusion region 1425 (a source or a drain), channel 1430 and second diffusion region 1435 (other of source/drain) with channel 1430 on first diffusion region 1425 and second diffusion region 1435 on channel 1430. Where substrate 1410 is a silicon substrate, in one embodiment, first diffusion region 1425 is, representatively, a doped silicon material (e.g., n+). Alternative materials for first diffusion region 1425 include, but are not limited to, germanium or a group III-V compound semiconductor material. The material of first diffusion region 1425 may be crystalline (e.g., polycrystalline) or amorphous. In one embodiment, first diffusion region 1425 has a height, hl, on the order of 10 nm to 50 nm (e.g., 25-30 nm). Channel 1430 is disposed on first diffusion region 1425. Where a material for first diffusion region 1425 is doped silicon material, a material of channel 1430 is, for example, a silicon material that may or may not be lightly doped. Disposed on channel 1430 is second diffusion region 1435 that is, for example, a material similar to a material of first diffusion region 1425 and doped similar to first diffusion region 1425. In the example shown in FIG. 62 and FIG. 63, the transistor bodies or fins have a generally quadrilateral cross-section (e.g., rectangular cross-section). It is appreciated that bodies or fins may adopt other shapes depending, for example, on how the bodies or fins are formed.

Disposed on channel 1430 and offset from the body or fin is a gate stack including gate dielectric 1440 and gate electrode 1450. In this embodiment, the gate stack is disposed on only one sidewall of a multi-sidewall channel. In one embodiment, gate dielectric 1440 is a silicon dioxide or a dielectric material having a dielectric constant greater than $SiO_2$ or a combination of $SiO_2$ and a high-k material(s) or a combination of high-k materials. Representatively, gate dielectric 1440 has a thickness on the order of a few nanometers. Disposed on gate dielectric 1440 and gate electrode 1450 of, for example, an electrically conductive material such as a metal material (e.g., tantalum), a metal nitride or a silicide. As shown in FIG. 62, in one embodiment, gate electrode 1450 extends through the array in a z-dimension and, in such manner, is connected to multiple channels of transistor bodies or fins in the array. In this embodiment, gate electrode 1450 may serve as an address line (e.g., a word line) for each of the transistors aligned in a z-dimension column. In such an embodiment including multiple columns, each gate electrode may be connected to address line driver 1470.

In the embodiment shown in FIG. 62 and FIG. 63, each of the vertical transistors in the array have a first diffusion region (first diffusion region 1425) such as a source connected to the substrate. In one embodiment, the source connection is to the substrate at zero volts. Second diffusion regions of each transistor (second diffusion region 1435) such as a drain, is connected to programmable element 1490. In one embodiment, programmable element 1490 is a capacitor. In one embodiment, a capacitor includes two electrodes or plates of an electrically conductive material (e.g., titanium, titanium nitride, doped polycrystalline silicon, a metal, etc.) separated by dielectric material such as silicon nitride or an oxide-nitride-oxide (ONO). The top plate or electrode or cap plate of the capacitor may be connected through back end metallization to an address line (e.g., a bit line) as known in the art.

Figure 64:
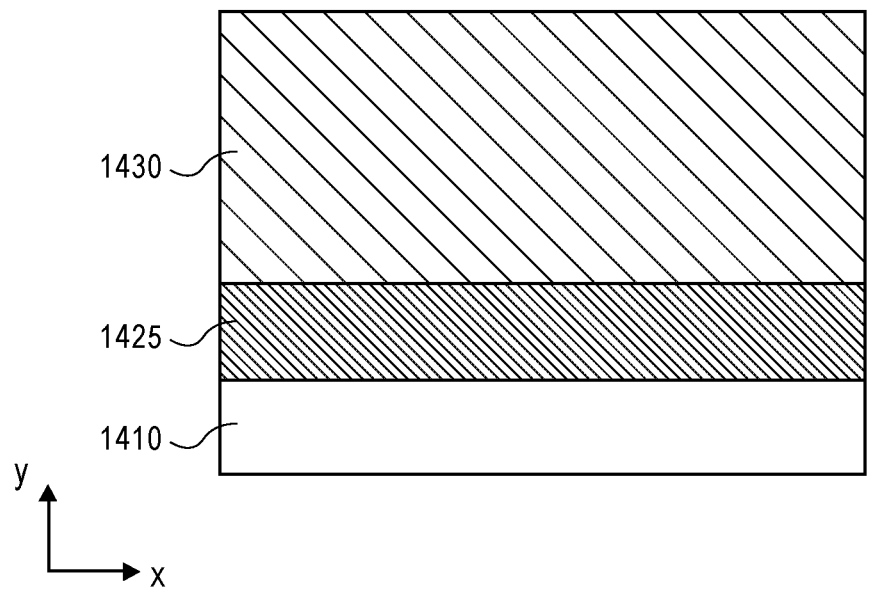
FIG. 64 shows a cross-sectional side view of a substrate with a first diffusion region material film on a surface of the substrate and a channel material film on the first diffusion region film.

FIGS. 64-77 describe a method for creating a DRAM memory array including a plurality of cells each cell including a programmable element and an access transistor such as shown in FIG. 62 and FIG. 63. FIG. 78 presents a flow chart of the process. A formation process for an array of n-type FETs is described. Referring to FIG. 64 and with reference to flow chart of FIG. 78, the process begins by the introduction of a first diffusion region material film on a surface of a substrate (block 1505, FIG. 78). FIG. 64 shows a cross-sectional side view of substrate 1410 that may be any material that may serve as a foundation on which multiple vertical FETs may be constructed. Representatively, substrate 1410 is a portion of a larger substrate such as a wafer. In one embodiment, substrate 1410 is a semiconductor material such as a single crystal silicon. Substrate 1410 may be a bulk substrate or, in another embodiment, an SOI structure. In an embodiment where substrate 1410 is silicon, an n-doped (n+) silicon film (crystalline or amorphous) is formed on the surface of substrate 1410 as a first diffusion region material film by, for example, an epitaxial growth process to a thickness on the order of 25 nm as a first diffusion region film. Film 1425 of n-type silicon is formed across a surface of substrate 1410 in an area designated for a transistor array. Formed on film 1425 is a film for a channel of a transistor (block 1510, FIG. 78). In one embodiment, film 1430 is an undoped (intrinsic) or lightly n-type doped silicon material that has a representative thickness on the order of 75 nm and is formed by an epitaxial growth process.

Figure 65:
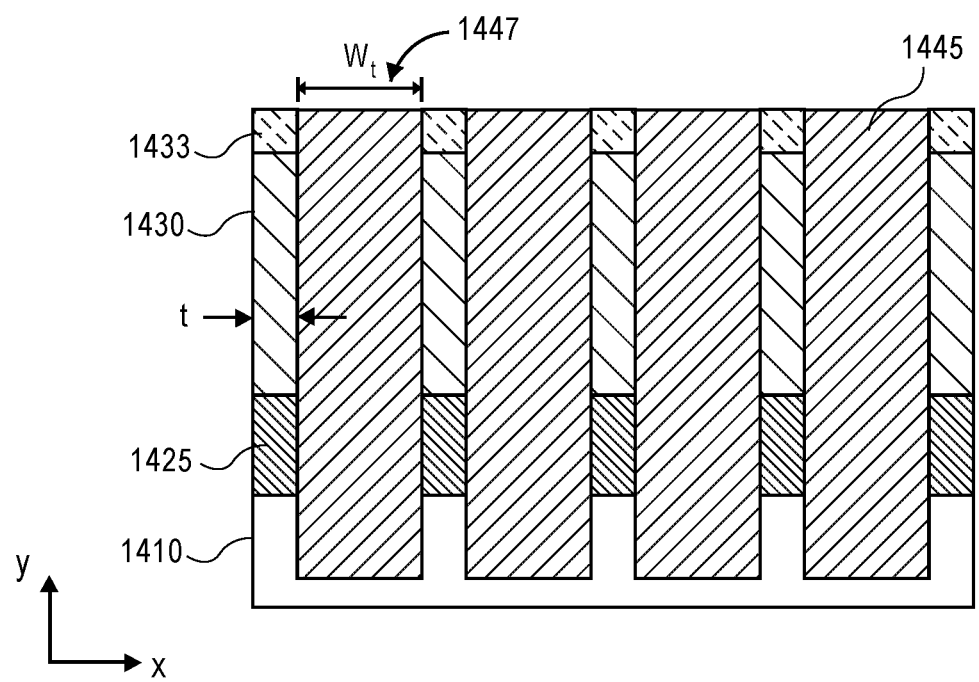
FIG. 65 shows the structure of FIG. 64 following the patterning of a hard mask on the channel material film and definition of fins in the channel material and first diffusion region material films on a substrate and isolation of the fins with a deposition of dielectric material in trenches between fins.

FIG. 65 shows the structure of FIG. 64 following the definition of fin structures in film 1425 and film 1430 on substrate 1410 (block 1515, FIG. 78). FIG. 65 representatively shows five fins. The fins may be formed by a mask and etch process wherein mask 1433 (e.g., a hard mask of, for example, silicon nitride) is introduced on a surface (superior surface) of film 1430 to protect areas of the film and underlying film 1425 on substrate 1410 where the fins will be defined and to provide openings in non-fin areas. Once mask 1433 is patterned, the structure may be anisotropically etched to remove material in unprotected areas. FIG. 65 shows the fins defined in substrate 1410, film 1425 and film 1430. For a substrate of silicon and silicon films, the etch may be a wet or dry etch. Representatively, a suitable etch is a HF-based chemistry. FIG. 65 shows the structure after the definition of five fins, each having a representative thickness dimension, t, on the order of 10 nm. FIG. 65 shows trenches 1447 formed in the structure between fins, each trench has a width, wt, in one embodiment, on the order of 40 nm. Following the definition of the fins, trenches 1447 between fins may be filled with dielectric material 1445 such as silicon dioxide or a low-k dielectric material (block 1520, FIG. 78).

Figure 66:
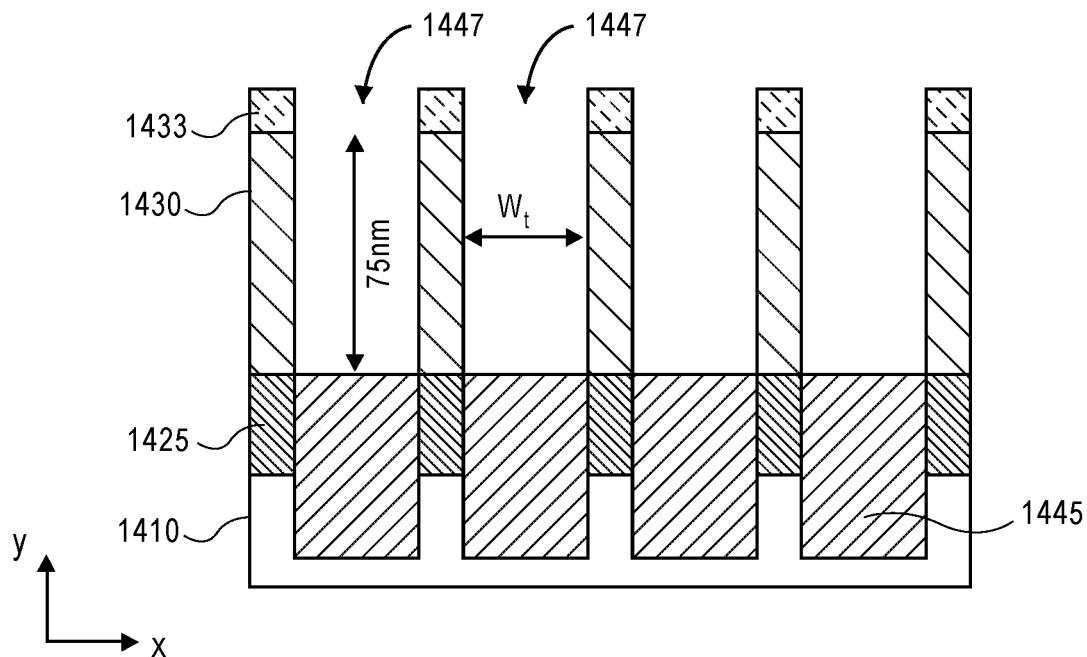
FIG. 66 shows the structure of FIG. 65 following a recessing of the dielectric material to a height of the first diffusion region film to expose an entire length of the channel material film in the trench.

FIG. 66 shows the structure of FIG. 65 following a recessing of dielectric material 1445 to a height of film 1425 to expose an entire length of film 1430 in trench 1447 (block 1525, FIG. 78). In one embodiment, such recessing may be done by retaining mask 1433 and etching the dielectric material using a timed etch. As illustrated in FIG. 66, the etch forms trenches having a depth of film 1430 (e.g., 75 nm).

Figure 67:
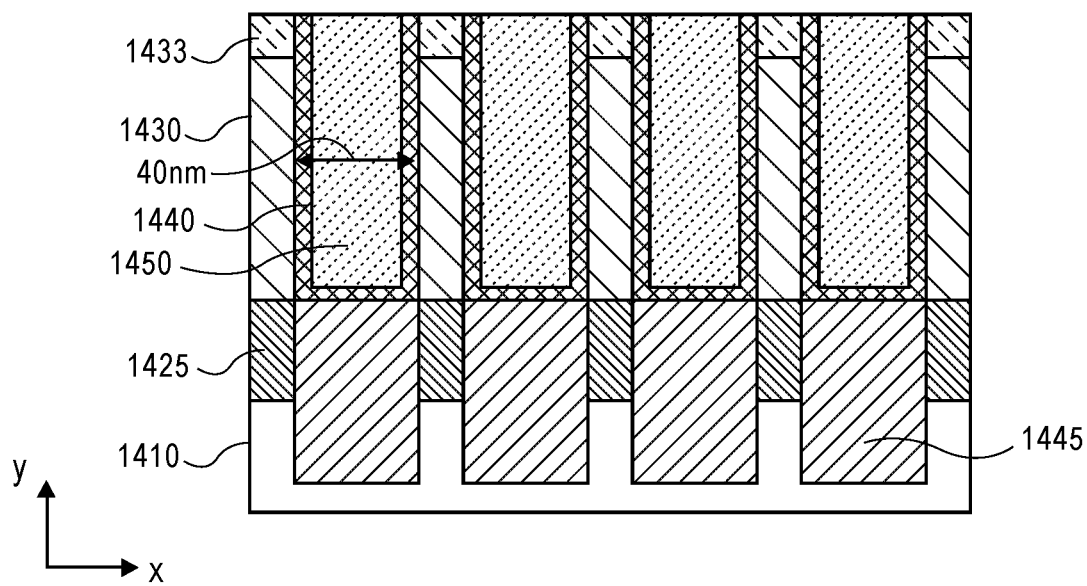
FIG. 67 shows the structure of FIG. 66 following the introduction of a gate stack including a gate dielectric material and gate electrode material in the trenches of the structure.

FIG. 67 shows the structure of FIG. 66 following the introduction of a gate dielectric and gate electrode material in the trenches of the structure (block 1530, FIG. 78). Initially, a gate dielectric material is introduced followed by the introduction of a gate electrode material. As shown in FIG. 67, gate dielectric 1440 is, for example, silicon dioxide or a high-k dielectric material or a mixture of silicon dioxide and a high-k material or materials. As shown in FIG. 67, gate dielectric material 1440 is introduced by, for example, CVD deposition to a thickness on the order of a few nanometers in a manner that it conforms to the sidewalls of each trench 1447 (e.g., gate dielectric 1440 is disposed on a sidewall of film 1430) and a superior surface of dielectric layer 1445. After forming gate dielectric 1440, gate electrode 1450 is formed in trench 1447. Representative materials for gate electrode 1450 include, but are not limited to, tungsten, tantalum, titanium or a nitride, a metal alloy, silicide or another material. In one embodiment, gate electrode material 1450 may be introduced by a CVD or other deposition process. In one embodiment, a material for gate electrode 1450 is introduced in an amount to fill each trench 1447. Once gate dielectric 1442 and gate electrode 1450 are introduced in trenches 1447, a surface of the structure (a top surface as viewed) may be polished by, for example, a chemical mechanical polish.

Figure 68:
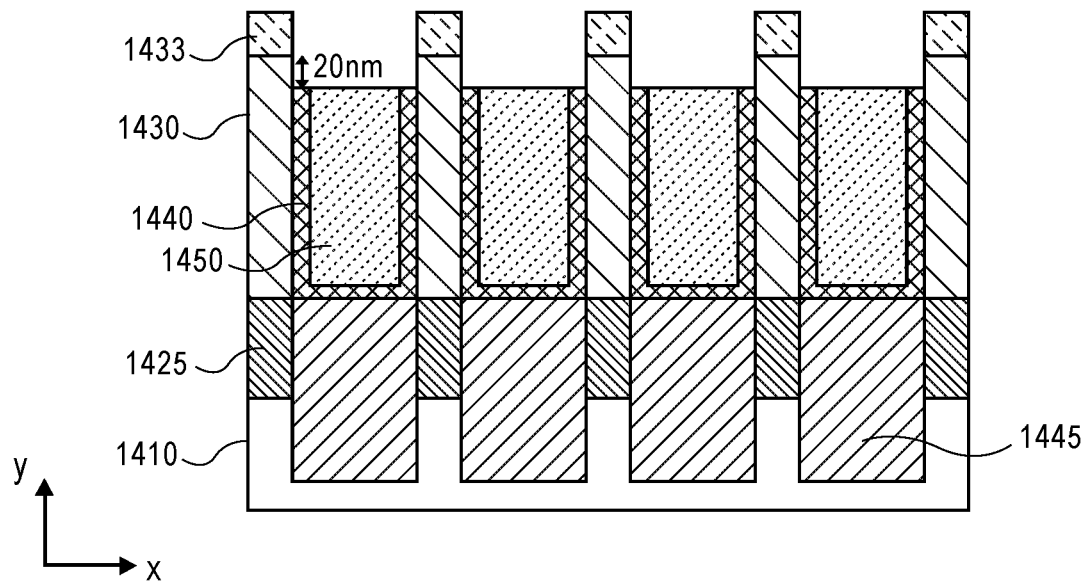
FIG. 68 shows the structure of FIG. 67 following a recessing of the gate stack materials in each trench.

FIG. 68 shows the structure of FIG. 67 following a recessing of the gate stack material (gate dielectric 1440 and gate electrode 1450) in each trench 1447 (block 1535, FIG. 78). In one embodiment, a combination of dry and wet etches may be used to recess a metal gate electrode material and a high-k gate dielectric material. A recess is performed to expose a portion of film 1430 such that the exposed portion can be modified or converted to form a second diffusion region. In one embodiment, the recess of gate dielectric 1440 and gate electrode 1450 exposes approximately 20 nm of film 1430.

Figure 69:
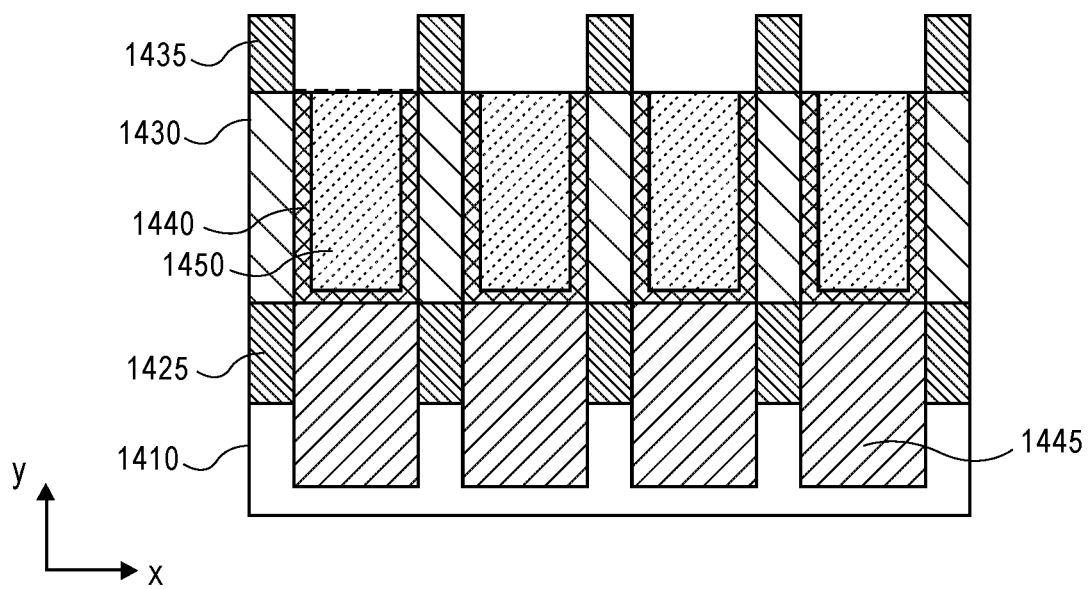
FIG. 69 shows the structure of FIG. 68 following a removal of a mask and a formation of a second diffusion region.

FIG. 69 shows the structure of FIG. 68 following a removal of mask 1433 and a formation of a second diffusion region (block 1540, FIG. 78). A hard mask of silicon nitride may be removed by a phosphoric acid or plasma ash etch. The removal of mask 1433 exposes a top portion of film 1430 (as viewed). In one embodiment, second diffusion region 1435 is formed by implanting an n-type implant such as arsenic or phosphorous into film 1430 to form an n+ second diffusion region. In another embodiment, a portion of film 1430 can be removed and replaced with another material to form second diffusion region 1435. FIG. 69 shows second diffusion region 1435 having a x-dimension (thickness dimension) similar to that of film 1430. In another embodiment, the x-dimension may be greater than an x-dimension of film 1430 to form, for example, a raised diffusion region. In still another embodiment, an optional dielectric layer 1437 of silicon dioxide or a low-k dielectric material or a combination of materials may be formed on an exposed portion of the gate stack prior to the formation of second diffusion region 1435. The optional dielectric layer may be characterized as a sidewall spacer on the gate electrode. Such may be desirable, for example, where second diffusion region 1435 is a raised diffusion region.

In the above embodiment, a second diffusion region of a transistor is formed by modifying a portion of a channel material film. In another embodiment, rather than modify a portion of a channel material, a film of a second diffusion region material may be introduced (e.g., deposited) over an array area on film 1430 prior to forming the fins or transistor bodies. The fins or transistor bodies may subsequently be defined to include film 1425 of a first diffusion region material, film 1430 of a channel material and a film of second diffusion region material. This embodiment for forming a transistor body is similar to that described with reference to FIG. 38 and FIG. 39.

Figure 70:
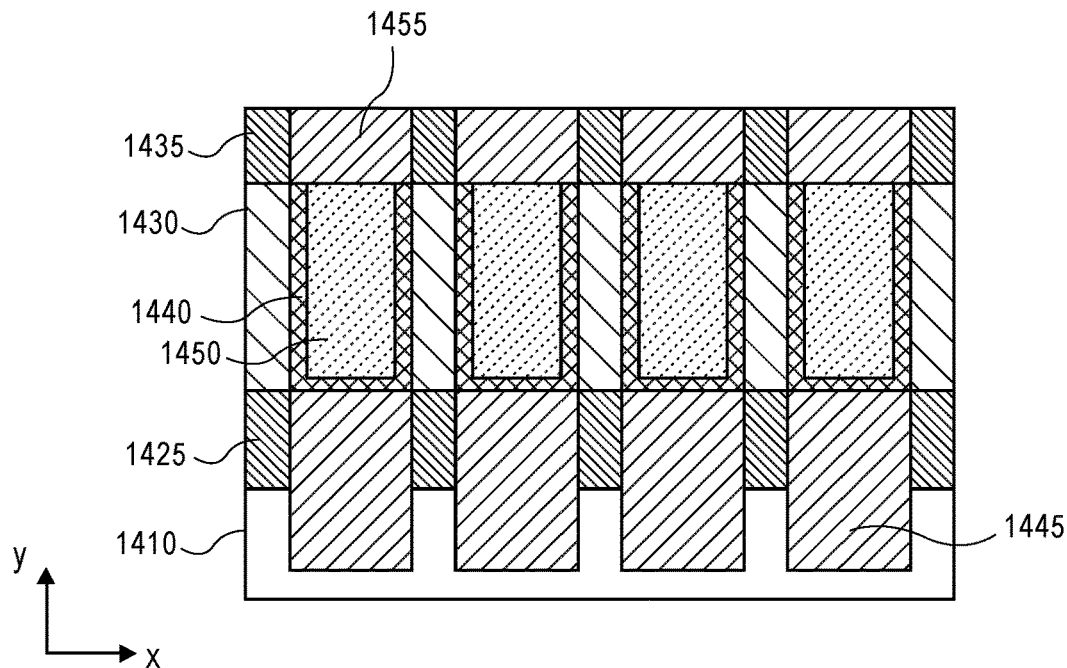
FIG. 70 shows the structure of FIG. 69 following the introduction of a dielectric material between the fins.

FIG. 70 shows the structure of FIG. 69 following the introduction of a dielectric material between the fins (block 1545, FIG. 78). In one embodiment, dielectric material 1455 is silicon dioxide or a low-k dielectric material or a combination of materials that may be introduced by a deposition process. Following the deposition, a top surface of the structure (as viewed) may be planarized.

Figure 71:
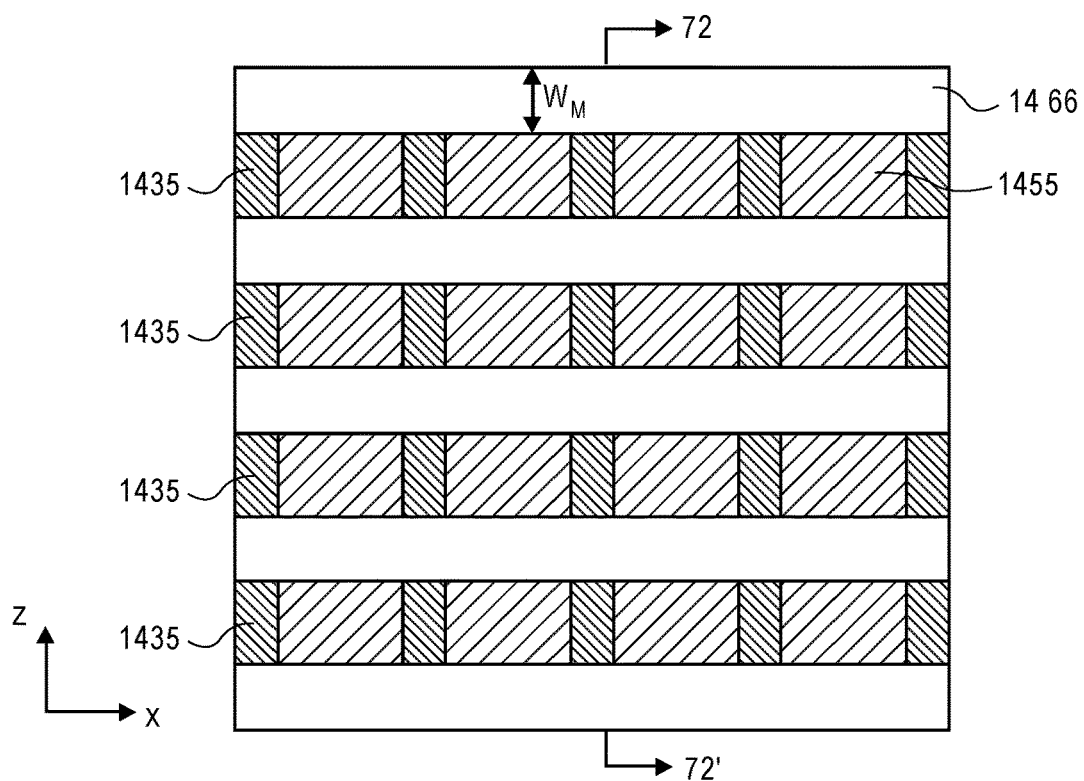
FIG. 71 shows a top view of the structure of FIG. 70 following patterning of a masking material as lateral projections projecting generally perpendicular to a direction of the gate stacks.

FIG. 71 shows a top view of the structure of FIG. 70 following patterning of a masking material as lateral projections projecting generally perpendicular to a direction of the gate stacks (block 1550, FIG. 78). A width, wm, of the projections of mask 1466 is selected to define a z-dimension thickness of individual transistor bodies or fins in a column. A representative width, wm, is on the order of 20 nm to 500 nm (e.g., 50 nm to 100 nm). One suitable material for mask 1466 is a silicon nitride material. In one embodiment, mask 1466 has a thickness, tm, for a thickness of a capacitor that will ultimately serve as a programmable element in the cell.

Figure 72:
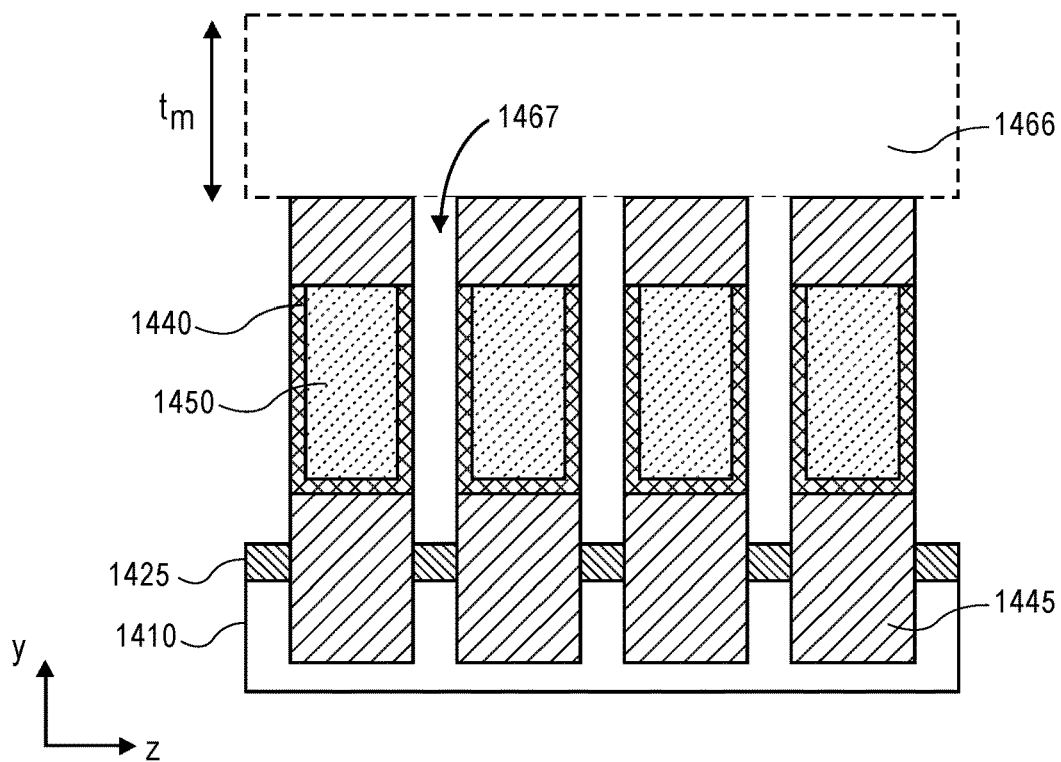
FIG. 72 shows a side view of the structure of FIG. 71 in a yz-dimension following the formation of trenches through the fins in areas of the fins that were not protected by a mask.

FIG. 72 shows a side view of the structure of FIG. 71 in a yz-dimension following the formation of trenches through the fins in areas of the fins that were not protected by mask 1466 (block 1550, FIG. 78). In one embodiment, the trenches are formed by anisotropically etching a portion of second diffusion region 1435, film 1430 and film 1425 through mask 1466. The etch, in one embodiment, is selective for the material of second diffusion region 1435, film 1430 and film 1425 relative to dielectric material 1455 so exposed dielectric material may mask underlying gate stacks. The etch proceeds to a depth below the gate stacks such as to substrate 1410. Mask 1466 is shown in dashed lines to reflect that it is deeper into the page than the cross-section.

Figure 73:
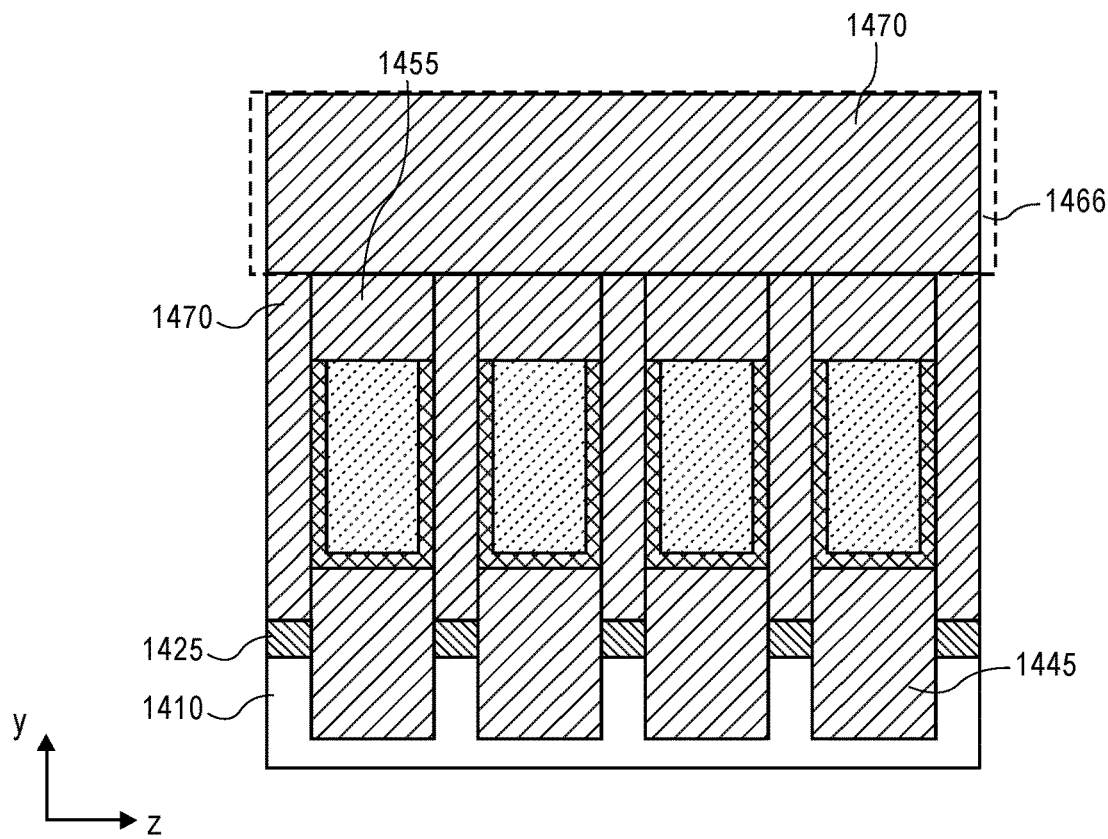
FIG. 73 shows the structure of FIG. 72 following a deposition of a dielectric material in the trenches.

FIG. 73 shows the structure of FIG. 72 following a deposition of a dielectric material in the trenches (block 1555, FIG. 78). In one embodiment, dielectric material 1470 is silicon dioxide or a low-k material similar to dielectric material 1455. In one embodiment, dielectric material 1470 is deposited to a thickness of mask 1466.

Figure 74:
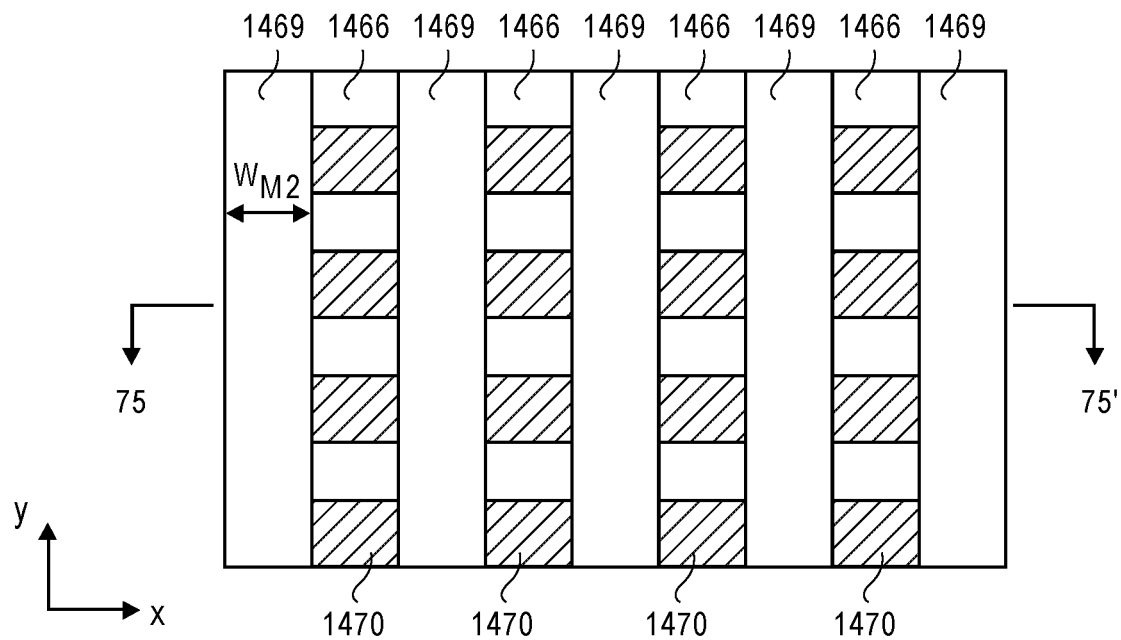
FIG. 74 is a top view of the structure of FIG. 73 following the patterning of a masking material on the substrate.

FIG. 74 is a top view of the structure of FIG. 73 following the patterning of a masking material on the substrate (block 1560, FIG. 78). In this embodiment, mask 1469 is a series of projections across an area of the substrate for the array and generally perpendicular to the projections of mask 1466. In one embodiment, the projections in mask 1469 have a width, wm, such that a distance between the projections is selected for a width of a capacitor that will be introduced following a removal of mask 1466. In one embodiment, mask 1469 is a material different from mask 1466. Where mask 1466 is a silicon nitride, one suitable material for mask 1469 is a photoresist material.

Figure 75:
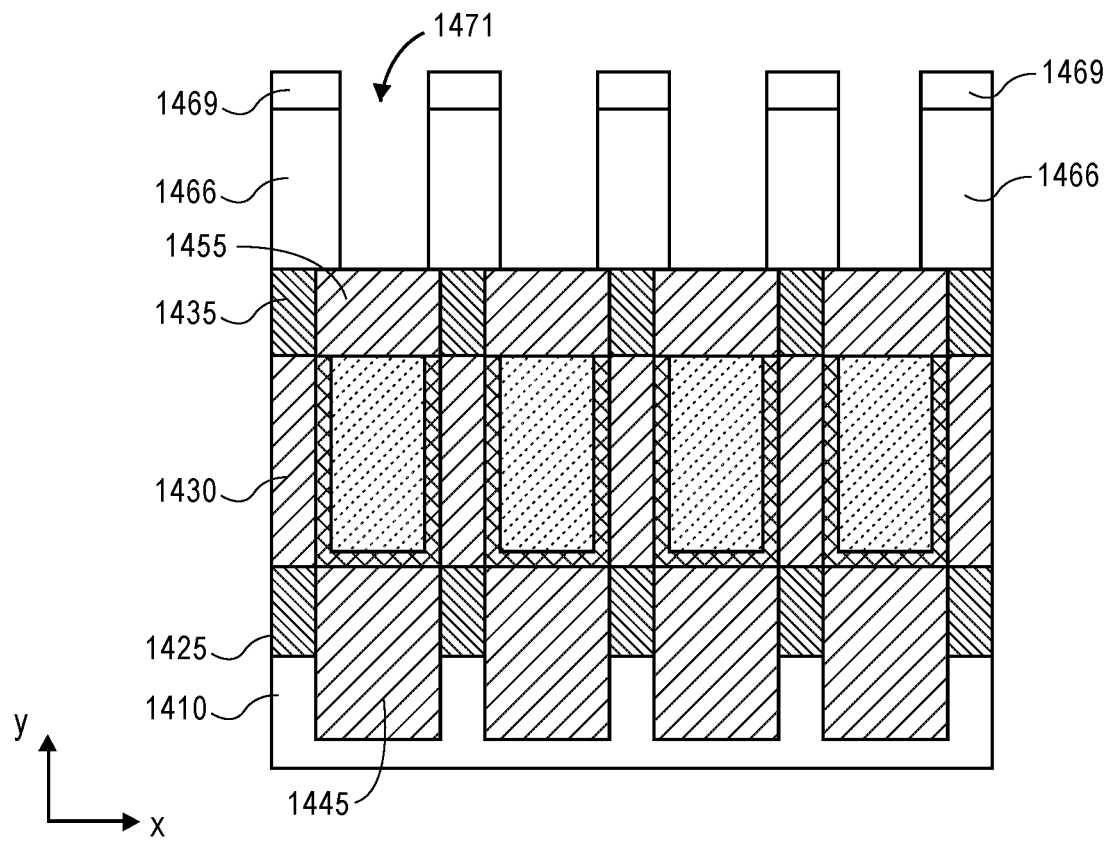
FIG. 75 shows the structure of FIG. 74 through line 75-75' to show an xy-dimension and following the removal of a mask in areas that are not protected by a mask.

FIG. 75 shows the structure of FIG. 74 through line 75-75' to show an xy-dimension and following the removal of mask 1466 in areas that are not protected by mask 1469. The etch proceeds through masking material 1466 and stops at dielectric material 1455 defining trenches 1471 (block 1565, FIG. 78). The etch retains mask 1466 on a surface of the substrate as individual units each having dimensions of a desired capacitor.

Figure 76:
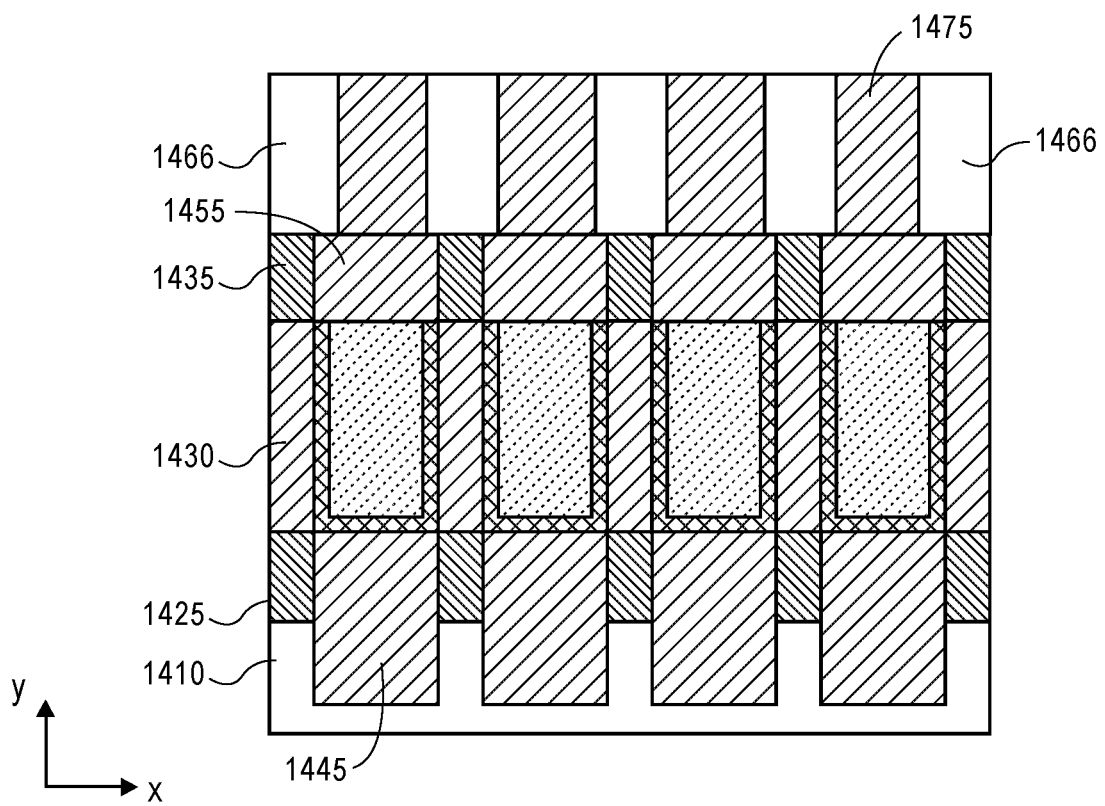
FIG. 76 shows the structure of FIG. 75 following the deposition of dielectric material in the trenches to isolate the units of a mask.

FIG. 76 shows the structure of FIG. 75 following the deposition of dielectric material in trenches 1471 to isolate the units of mask 1466. In one embodiment, dielectric material 1475 is an SiO2 or a low-k dielectric material (block 1570, FIG. 78). In one embodiment, dielectric material 1475 is deposited to a thickness of the units of mask 1466.

Figure 77:
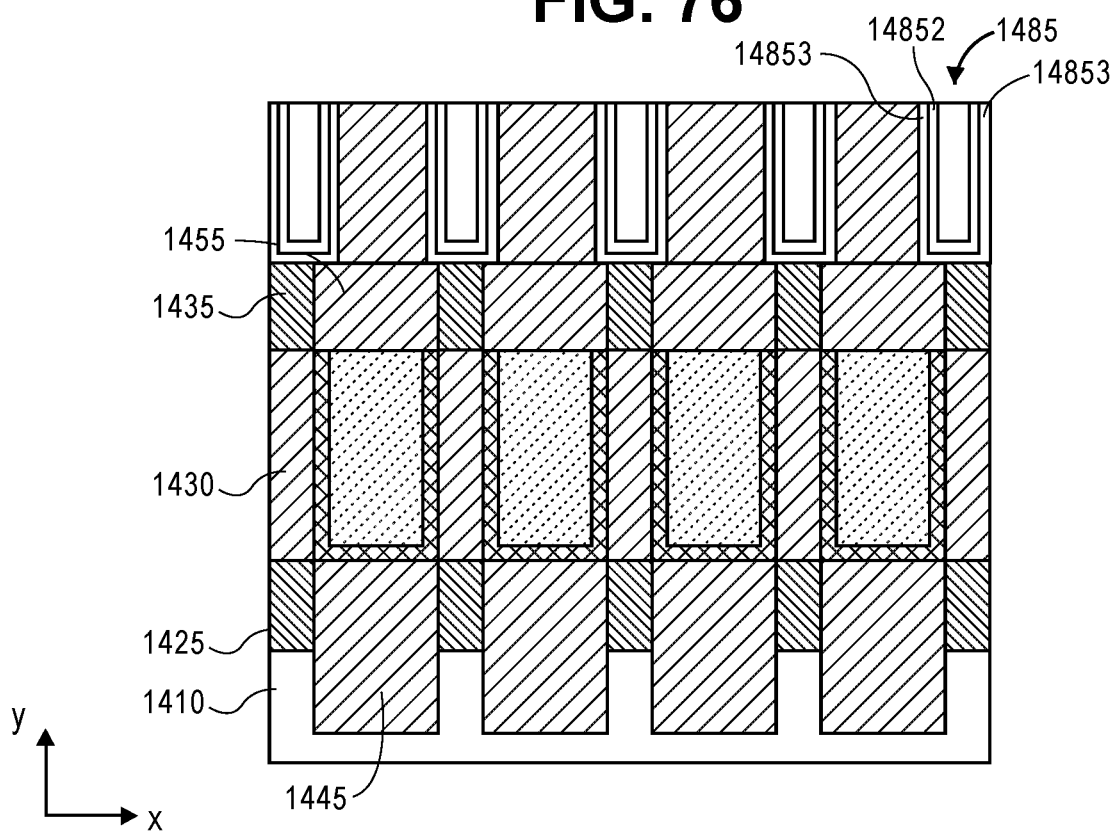
FIG. 77 shows the structure of FIG. 76 following the removal of the units of mask and the replacement of those units with a metal-insulator-metal (MIM) capacitor.
Figure 78:
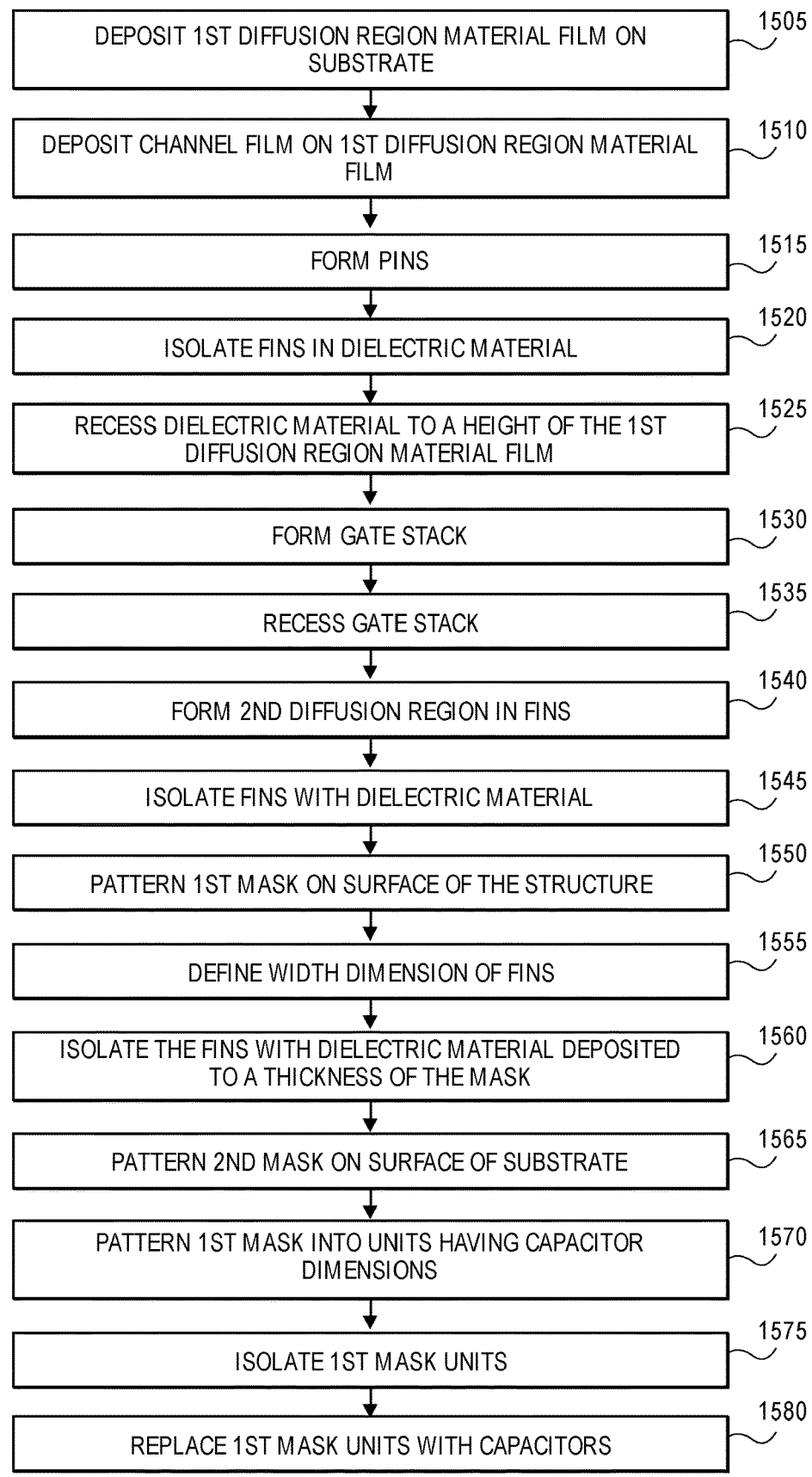
FIG. 78 presents a flow chart of the process of FIGS. 64-77.

FIG. 77 shows the structure of FIG. 76 following the removal of the units of mask 1466 and the replacement of those units with a metal-insulator-metal (MIM) capacitor. Each capacitor 1485 includes base electrode or plate 14851 of an electrically conductive material such as titanium, titanium nitride, doped polycrystalline silicon or a silicide. Based-electrode or plate 14851, in one embodiment, surrounds the walls of the opening defined by the removal of the units of mask 1466. Deposited on base electrode or plate 14851 is dielectric layer 14852 of, for example, silicon nitride or an oxide-nitride-oxide (ONO). Deposited on dielectric layer 14852 is top electrode or plate 14853 of a suitable metal such as the ones selected for base electrode or plate 14851.

Figure 79:
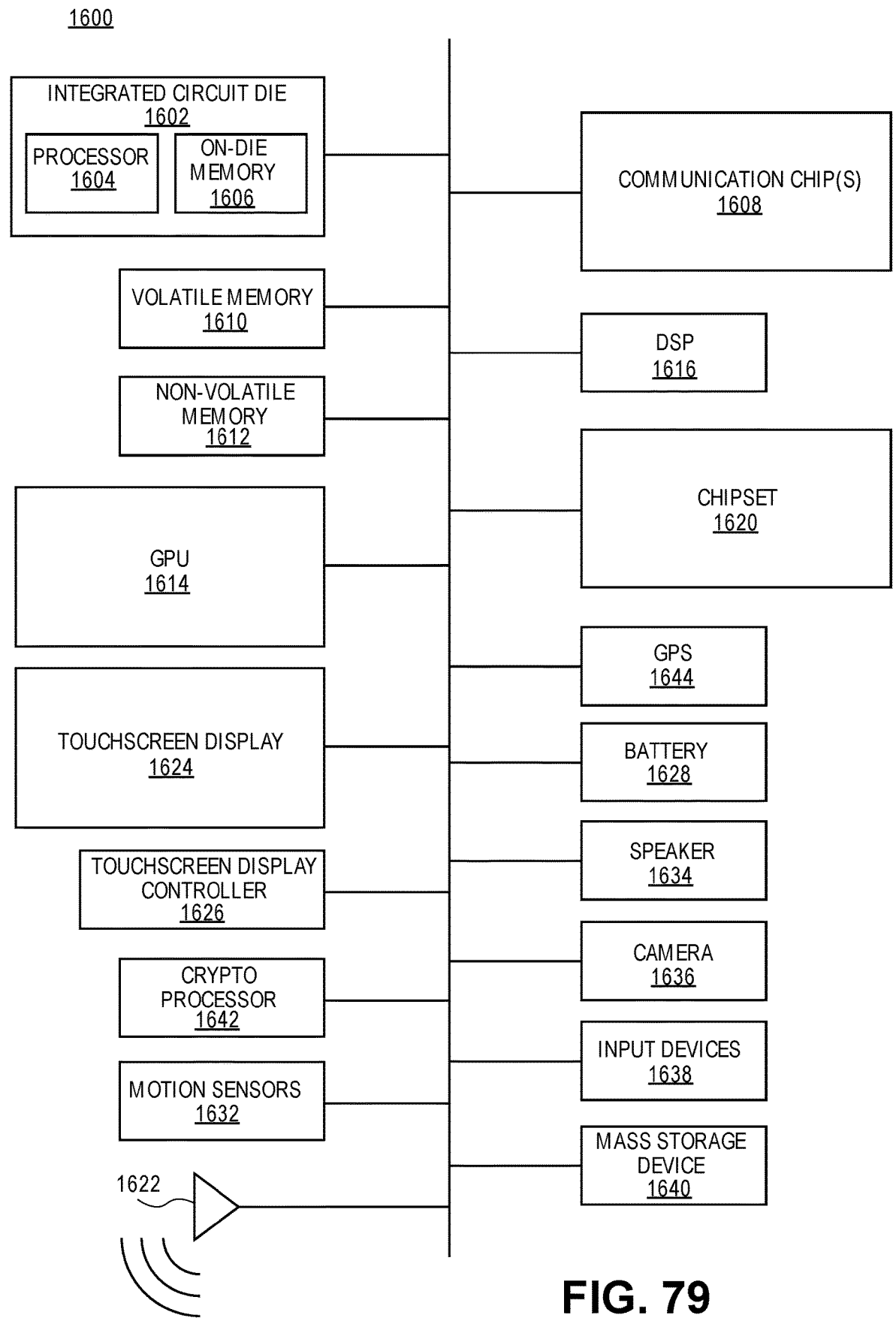
FIG. 79 is an interposer implementing one or more embodiments.

FIG. 79 illustrates interposer 1600 that includes one or more embodiments. Interposer 1600 is an intervening substrate used to bridge a first substrate 1602 to second substrate 1604. First substrate 1602 may be, for instance, an integrated circuit die. Second substrate 1604 may be, for instance, a memory module, a computer motherboard, or another integrated circuit die. Generally, the purpose of interposer 1600 is to spread a connection to a wider pitch or to reroute a connection to a different connection. For example, interposer 1600 may connect an integrated circuit die to ball grid array (BGA) 1606 that can subsequently be connected to second substrate 1604. In some embodiments, first and second substrates 1602/1604 are attached to opposing sides of interposer 1600. In other embodiments, first and second substrates 1602/1604 are attached to the same side of interposer 1600. In further embodiments, three or more substrates are interconnected by way of interposer 1600.

Interposer 1600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1608 and vias 1610, including but not limited to through-silicon vias (TSVs) 1612. Interposer 1600 may further include embedded devices 1614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 1600.

In accordance with embodiments, apparatuses or processes disclosed herein may be used in the fabrication of interposer 1600.

Figure 80:
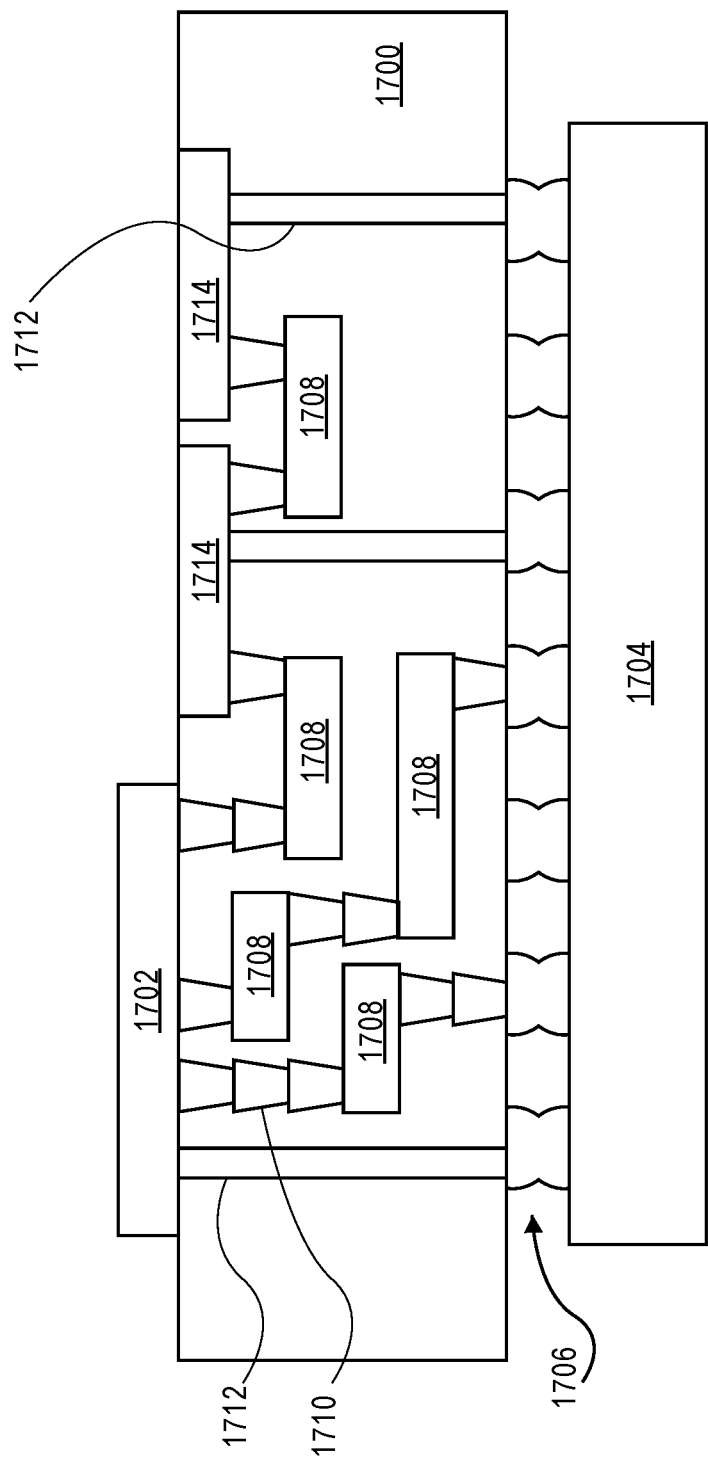
FIG. 80 illustrates an embodiment of a computing device.

FIG. 80 illustrates computing device 1700 in accordance with one embodiment. Computing device 1700 may include a number of components. In one embodiment, these components are attached to one or more motherboards. In an alternate embodiment, these components are fabricated onto a single system-on-a-chip (SoC) die rather than a motherboard. The components in computing device 1700 include, but are not limited to, integrated circuit die 1702 and at least one communication chip 1708. In some implementations communication chip 1708 is fabricated as part of integrated circuit die 1702. Integrated circuit die 1702 may include CPU 1704 as well as on-die memory 1706, often used as cache memory, that can be provided by technologies such as embedded DRAM (eDRAM) or spin-transfer torque memory (STTM or STTM-RAM).

Computing device 1700 may include other components that may or may not be physically and electrically coupled to the motherboard or fabricated within an SoC die. These other components include, but are not limited to, volatile memory 1710 (e.g., DRAM), non-volatile memory 1712 (e.g., ROM or flash memory), graphics processing unit 1714 (GPU), digital signal processor 1716, crypto processor 1742 (a specialized processor that executes cryptographic algorithms within hardware), chipset 1720, antenna 1722, display or a touchscreen display 1724, touchscreen controller 1726, battery 1728 or other power source, a power amplifier (not shown), global positioning system (GPS) device 1744, compass 1730, motion coprocessor or sensors 1732 (that may include an accelerometer, a gyroscope, and a compass), speaker 1734, camera 1736, user input devices 1738 (such as a keyboard, mouse, stylus, and touchpad), and mass storage device 1740 (such as hard disk drive, compact disk (CD), digital versatile disk (DVD), and so forth).

Communications chip 1708 enables wireless communications for the transfer of data to and from computing device 1700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1700 may include a plurality of communication chips 1708. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 1704 of computing device 1700 includes one or more programmable arrays, such as 1T-1C programmable arrays, that are formed in accordance with embodiments presented above. The term "processor" may refer to any device or portion of a device that processes electronic data from registers and/or memory to transform that electronic data into other electronic data that may be stored in registers and/or memory.

Communication chip 1708 may also include one or more programmable arrays, such as 1T-1C programmable arrays, that are formed in accordance with embodiments presented above.

In further embodiments, another component housed within computing device 1700 may contain one or more programmable arrays, such as 1T-1C programmable arrays, that are formed in accordance with implementations presented above.

In various embodiments, computing device 1700 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 1700 may be any other electronic device that processes data.

EXAMPLES

Example 1 is a programmable array including a plurality cells aligned in a row on a substrate, wherein each of the plurality of cells includes a programmable element and a transistor, wherein the transistor includes a body, the body including a first diffusion region and a second diffusion region on the first diffusion region and separated by a channel and the programmable element is disposed on the second diffusion region.

In Example 2, the programmable element of each of the plurality of cells of the array of Example 1 includes a capacitor.

In Example 3, the capacitor of the array of Example 2 is a metal-insulator-metal capacitor.

In Example 4, each of the transistors of the array of any of Examples 1-3 further includes a gate electrode coupled to the channel and offset from the body.

In Example 5, the plurality of cells of the array of any of Examples 1~4 includes a first plurality of cells, the array further including a second plurality of cells aligned in a column on the substrate with a projection of the column intersecting a projection of the row and each of the second plurality of cells includes a programmable element and a transistor including a body including a first diffusion region and a second diffusion region on the first diffusion region and separated by a channel and a gate electrode offset from the body and coupled as an indivisible body to a channel of each of transistors of the second plurality of cells as a second address line.

In Example 6, the gate electrode coupled to a channel of each of the transistors of the plurality of second cells of the array of Example 5 is coupled to a channel of one of the transistors of the first plurality of cells.

In Example 7, the substrate of the array of any of Examples 1-6 includes a device layer on the substrate and a plurality of metallization layers on the device layer and the plurality of cells are formed in the device layer.

In Example 8, the substrate of the array of any of Examples 1-6 includes a device layer on the substrate and a plurality of metallization layers on the device layer, wherein the plurality of cells are disposed between ones of the plurality of metallization layers.

Example 9 is an integrated circuit array apparatus including a first plurality of cells on a substrate, wherein each cell includes a programmable element and a body including a first diffusion region, a second diffusion region and a channel of a transistor, wherein the second diffusion regions is on the first diffusion region and separated by the channel; and a second plurality of cells on the substrate, wherein each cell includes a programmable element and a body including a first diffusion region, a second diffusion region and a channel of a transistor, wherein the second diffusion regions is on the first diffusion region and separated by the channel, the second plurality of cells further including a gate stack coupled to one side of the channel, wherein the stack includes a gate electrode including an indivisible body extending between each body of the second plurality of cells and coupled to one channel of the first plurality of cells as a second address line.

In Example 10, the programmable element of each of the first plurality of cells and the second plurality of cells of the apparatus of Example 9 includes a capacitor.

In Example 11, the capacitor of the apparatus of Example 10 is a metal-insulator-metal capacitor.

In Example 12, the body each of the first plurality of cells and the second plurality of cells of the apparatus of Example 9 projects in a direction perpendicular to a base surface of the substrate In Example 13, the substrate of the apparatus of Example 9 includes a device layer on the substrate and a plurality of metallization layers on the device layer and the first plurality of cells and the second plurality of cells are each formed in the device layer.

In Example 14, the substrate of the apparatus of Example 9 includes a device layer on the substrate and a plurality of metallization layers on the device layer, wherein the first plurality of cells and the second plurality of cells are each disposed between ones of the plurality of metallization layers.

Example 15 is a method of forming an integrated circuit including forming transistor bodies in a plurality rows on a substrate, each of the bodies including a first diffusion region, a second diffusion region and a channel of a transistor, wherein the second diffusion regions is on the first diffusion region and separated by the channel; forming a masking material as a plurality of rows across the bodies; etching the bodies through the masking material to define a width dimension of the transistor bodies, wherein the width dimension is defined by a width dimension of the masking material; after etching the bodies, patterning each of the plurality of rows of the masking material into a plurality of individual masking units including the width dimension and a length dimension defined by the patterning; and replacing each of the plurality of individual masking units with a programmable element.

In Example 16, forming the masking material as a plurality of rows of the method of Example 15 includes forming the plurality of rows of the masking material perpendicular to the plurality of rows of the transistor bodies.

In Example 17, the programmable element of the method of any of Examples 15 or 16 includes a capacitor.

In Example 18, the capacitor of the method of Example 17 includes a metal-insulator-metal capacitor.

In Example 19, prior to replacing each of the plurality of individual masking units with a programmable element, the method of any of Examples 15-18 includes isolating the individual masking units with a dielectric material.

In Example 20, forming the bodies in a plurality of rows on a substrate of the method of Example 15 includes forming the bodies in a device layer of the substrate.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method of forming an integrated circuit comprising:
    forming transistor bodies in a plurality rows on a substrate, each of the bodies comprising a first diffusion region, a second diffusion region and a channel of a transistor, wherein the second diffusion regions is on the first diffusion region and separated by the channel;
    forming a masking material as a plurality of rows across the bodies;
    etching the bodies through the masking material to define a width dimension of the transistor bodies, wherein the width dimension is defined by a width dimension of the masking material;
    after etching the bodies, patterning each of the plurality of rows of the masking material into a plurality of individual masking units comprising the width dimension and a length dimension defined by the patterning; and
    replacing each of the plurality of individual masking units with a programmable element.

2. The method of claim 1, wherein forming the masking material as a plurality of rows comprises forming the plurality of rows of the masking material perpendicular to the plurality of rows of the transistor bodies.

3. The method of claim 1, wherein the programmable element comprises a capacitor.

4. The method of claim 3, wherein the capacitor comprises a metal-insulator- metal capacitor.

5. The method of claim 1, wherein prior to replacing each of the plurality of individual masking units with a programmable element, the method comprises isolating the individual masking units with a dielectric material.

6. The method of claim 1, wherein forming the bodies in a plurality of rows on a substrate comprises forming the bodies in a device layer of the substrate.

7. A method of fabricating a programmable array, the method comprising:
    forming a plurality of cells aligned in a first row and a second row on a substrate, the second row parallel with and adjacent to the first row, wherein each of the plurality of cells comprises a programmable element and a transistor, wherein the transistor comprises a body, the body comprising a first diffusion region and a second diffusion region above the first diffusion region and separated by a channel and the programmable element is disposed on the second diffusion region; and
    forming a gate electrode coupled to the channel of each of the plurality of cells in the first row and the second row.

8. The method of claim 7, wherein the programmable element of each of the plurality of cells comprises a capacitor.

9. The method of claim 8, wherein the capacitor is a metal-insulator-metal capacitor.

10. The method of claim 7, wherein the substrate comprises a device layer on the substrate and a plurality of metallization layers on the device layer and the plurality of cells are formed in the device layer.

11. The method of claim 7, wherein the substrate comprises a device layer on the substrate and a plurality of metallization layers on the device layer.

12. The method of claim 11, wherein the plurality of cells are disposed between ones of the plurality of metallization layers.

13. A method of fabricating an integrated circuit array apparatus, the method comprising:
    forming a first plurality of cells aligned in a first row on a substrate, wherein each cell comprises a programmable element and a body comprising a first diffusion region, a second diffusion region and a channel of a transistor, wherein the second diffusion region is on the first diffusion region and separated by the channel; and
    forming a second plurality of cells aligned in a second row on the substrate, the second row parallel with and adjacent to the first row, wherein each cell comprises a programmable element and a body comprising a first diffusion region, a second diffusion region and a channel of a transistor, wherein the second diffusion region is on the first diffusion region and separated by the channel, the second plurality of cells further comprising a gate stack coupled to one side of the channel, wherein the stack comprises a gate electrode comprising an indivisible body extending between each body of the second plurality of cells and coupled to a channel of each of the first plurality of cells as a second address line.

14. The method of claim 13, wherein the programmable element of each of the first plurality of cells and the second plurality of cells comprises a capacitor.

15. The method of claim 14, wherein the capacitor is a metal-insulator-metal capacitor.

16. The method of claim 13, wherein the body of each of the first plurality of cells and the second plurality of cells projects in a direction perpendicular to a base surface of the substrate.

17. The method of claim 13, wherein the substrate comprises a device layer on the substrate and a plurality of metallization layers on the device layer.

18. The method of claim 17, wherein the first plurality of cells and the second plurality of cells are each formed in the device layer.

19. The method of claim 13, wherein the substrate comprises a device layer on the substrate and a plurality of metallization layers on the device layer.

20. The method of claim 19, wherein the first plurality of cells and the second plurality of cells are each disposed between ones of the plurality of metallization layers.

\* \* \* \* \*